US012610736B2

(12) United States Patent
Kwak et al.

(10) Patent No.: US 12,610,736 B2
(45) Date of Patent: Apr. 21, 2026

(54) ORGANIC LIGHT EMITTING DEVICE

(71) Applicant: LG Chem, Ltd., Seoul (KR)

(72) Inventors: Jiwon Kwak, Daejeon (KR); Sung Kil Hong, Daejeon (KR); Yongbum Cha, Daejeon (KR)

(73) Assignee: LG Chem, Ltd., Seoul (KR)

( * ) Notice: Subject to any disclaimer, the term of this patent is extended or adjusted under 35 U.S.C. 154(b) by 532 days.

(21) Appl. No.: 16/304,426

(22) PCT Filed: May 26, 2017

(86) PCT No.: PCT/KR2017/005520
§ 371 (c)(1),
(2) Date: Nov. 26, 2018

(87) PCT Pub. No.: WO2017/204594
PCT Pub. Date: Nov. 30, 2017

(65) Prior Publication Data

US 2019/0148650 A1 May 16, 2019

(30) Foreign Application Priority Data

May 27, 2016 (KR) ........................ 10-2016-0065970

(51) Int. Cl.
*H01L 51/00* (2006.01)
*H10K 85/60* (2023.01)
(Continued)

(52) U.S. Cl.
CPC ......... *H10K 85/631* (2023.02); *H10K 85/633* (2023.02); *H10K 85/636* (2023.02);
(Continued)

(58) Field of Classification Search
CPC ............... H01L 51/0072; H01L 51/006; H01L 51/0061; H01L 51/5056; H01L 51/5064; H01L 51/5096
See application file for complete search history.

(56) References Cited

U.S. PATENT DOCUMENTS

| | | | | |
|---|---|---|---|---|
| 9,947,874 | B2 | 4/2018 | Pflumm et al. | |
| 2004/0110031 | A1 * | 6/2004 | Fukuda .................. | C09K 11/06<br>313/506 |

(Continued)

FOREIGN PATENT DOCUMENTS

| | | | | |
|---|---|---|---|---|
| CN | 105175405 A | * 12/2015 | ........... | C07D 413/14 |
| EP | 2484665 A1 | 8/2012 | | |

(Continued)

OTHER PUBLICATIONS

Machine Translation of Gao et al. CN-105175405-A. (Year: 2015).*
(Continued)

*Primary Examiner* — Jay Yang
(74) *Attorney, Agent, or Firm* — Lerner David LLP

(57) ABSTRACT

The present specification relates to an organic light emitting device including an anode, a first organic material layer
(Continued)

including a compound of Chemical Formula 1, a second organic material layer including a compound of Chemical Formula 2, a light emitting layer and a cathode:

[Chemical Formula 1]

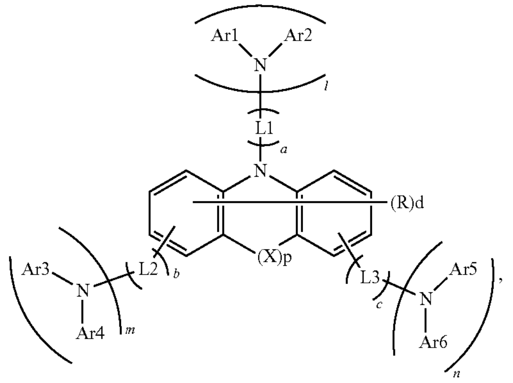

,

[Chemical Formula 2]

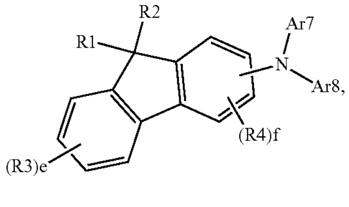

, wherein all the variables are described herein.

10 Claims, 1 Drawing Sheet

(51) Int. Cl.
*H10K 50/15* (2023.01)
*H10K 50/18* (2023.01)

(52) U.S. Cl.
CPC ....... *H10K 85/657* (2023.02); *H10K 85/6572* (2023.02); *H10K 50/15* (2023.02); *H10K 50/156* (2023.02); *H10K 50/18* (2023.02)

(56) References Cited

U.S. PATENT DOCUMENTS

2004/0251816 A1 12/2004 Leo et al.
2005/0222429 A1* 10/2005 Hosokawa ............ H01L 51/006 548/440
2007/0075635 A1 4/2007 Yabunouchi et al.
2008/0014464 A1 1/2008 Kawamura et al.
2008/0242871 A1* 10/2008 Kawakami ........... C07D 403/14 548/440
2010/0295444 A1 11/2010 Kuma et al.
2011/0024735 A1* 2/2011 Sawada ................ C07D 401/10 257/40
2011/0073852 A1 3/2011 Yokoyama et al.
2013/0292659 A1 11/2013 Kim et al.
2014/0167003 A1 6/2014 Kato et al.
2015/0065730 A1 3/2015 Montenegro et al.
2015/0115239 A1 4/2015 Pflumm et al.
2015/0280136 A1 10/2015 Ryu et al.
2016/0028014 A1 1/2016 Kim et al.
2016/0118592 A1 4/2016 Park et al.
2017/0317285 A1 11/2017 Mujica-Fernaud et al.
2018/0019405 A1 1/2018 Montenegro et al.
2018/0258082 A1 9/2018 Heil et al.

FOREIGN PATENT DOCUMENTS

JP H09310066 A 12/1997
JP 10226785 A * 8/1998
JP 3649302 B2 5/2005
JP 2007126439 A * 5/2007 ........... C07D 209/88
JP 2014049539 A 3/2014
JP 2015516674 A 6/2015
JP 2016509368 A 3/2016
JP 5917521 B2 5/2016
KR 20090028943 A 3/2009
KR 20120013173 A 2/2012
KR 20130007461 A 1/2013
KR 20130099098 A 9/2013
KR 20140001568 A 1/2014
KR 20150038193 A 4/2015
KR 20150102735 A 9/2015
KR 101605987 B1 3/2016
KR 20160035610 A 3/2016
KR 20160047671 A 5/2016
KR 20180035917 A 4/2018
WO 2007039952 A1 4/2007
WO 2007148660 A1 12/2007
WO 2009139475 A1 11/2009
WO 2010134350 A1 11/2010
WO 2017028940 A1 2/2017
WO 2017028941 A1 2/2017

OTHER PUBLICATIONS

Machine Translation of Choi et al. KR-2009-0028943-A. (Year: 2009).*
Machine Translation of Yagi et al. (JP 2007126439 A) from Espacenet.com. (Year: 2007).*
Machine English translation of JP-10226785-A. Sep. 20, 2023.*
Search report from International Application No. PCT/KR2017/005520, mailed Aug. 24, 2017.
Extended European Search Report including Written Opinion for Application No. EP17803112.6 dated Mar. 14, 2019.

* cited by examiner

【FIG. 1】
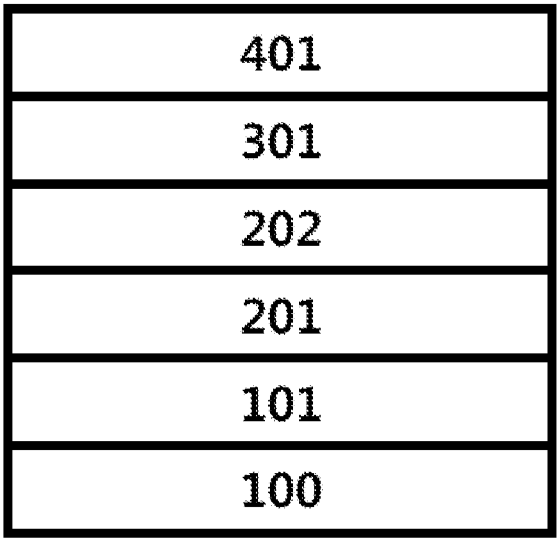
【FIG. 2】
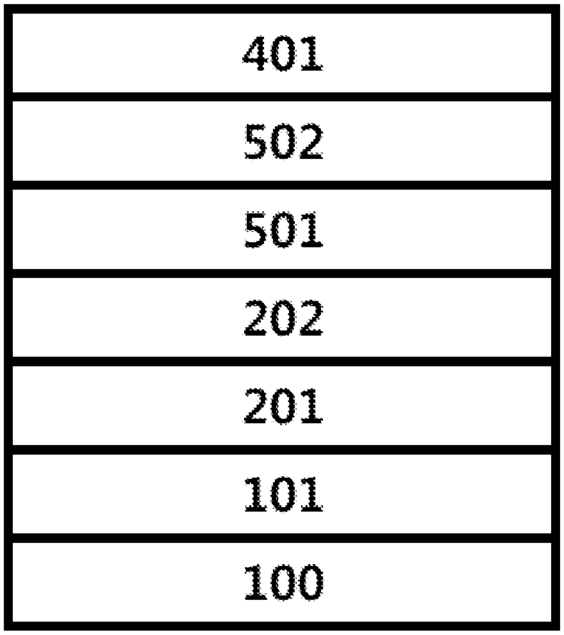

ORGANIC LIGHT EMITTING DEVICE

CROSS-REFERENCE TO RELATED APPLICATIONS

The present application is a national phase entry under 35 U.S.C. § 371 of International Application No. PCT/KR2017/005520 filed May 26, 2017, which claims priority from Korean Patent Application No. 10-2016-0065970 filed May 27, 2016, all of which are incorporated herein by reference.

TECHNICAL FIELD

The present specification relates to an organic light emitting device.

BACKGROUND ART

An organic light emission phenomenon generally refers to a phenomenon converting electrical energy to light energy using an organic material. An organic light emitting device using an organic light emission phenomenon normally has a structure including an anode, a cathode, and an organic material layer therebetween. Herein, the organic material layer is often formed in a multilayer structure formed with different materials in order to increase efficiency and stability of the organic light emitting device, and for example, may be formed with a hole injection layer, a hole transfer layer, a light emitting layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state.

Development of new materials for such an organic light emitting device has been continuously required.

PRIOR ART DOCUMENTS

Patent Documents

US Patent Application Laid-Open Publication No. 2004-0251816

DISCLOSURE

Technical Problem

The present specification is directed to providing an organic light emitting device using specific materials.

Technical Solution

One embodiment of the present specification provides an organic light emitting device including a cathode; an anode; a light emitting layer provided between the cathode and the anode; a first organic material layer provided between the anode and the light emitting layer and including a compound of the following Chemical Formula 1; and a second organic material layer provided between the first organic material layer and the light emitting layer and including a compound of the following

[Chemical Formula 1]

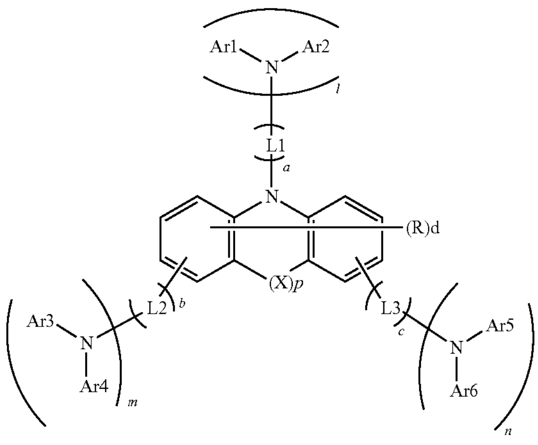

In Chemical Formula 1,

L1 to L3 are the same as or different from each other, and each independently a direct bond; a substituted or unsubstituted arylene group; or a substituted or unsubstituted heteroarylene group, a to c are each an integer of 0 to 3, and when a to c are each 2 or greater, structures in the parentheses are the same as or different from each other, Ar1 to Ar6 are the same as or different from each other, and each independently a substituted or unsubstituted aryl group; or a substituted or unsubstituted heteroaryl group, or Ar1 and Ar2; Ar3 and Ar4; Ar5 and Ar6; Ar1 and L1; Ar3 and L2; or Ar5 and L3 bond to each other to form a monocyclic or multicyclic aromatic or aliphatic hydrocarbon ring or heteroring, 1 to n are each an integer of 0 to 2, and when 1 to n are each 2, structures in the parentheses are the same as or different from each other, and when 1 to n are each 0, hydrogen bonds to L1 to L3 instead of —NAr1Ar2, —NAr3Ar4 and —NAr5Ar6, respectively, X is NR'; O; or S, p is 0 or 1, and when p is 0, 2 carbons bonding to X directly bond, and R and R' are the same as or different from each other, and each independently hydrogen; deuterium; a nitrile group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted silyl group; a substituted or unsubstituted amine group; a substituted or unsubstituted aryl group; or a substituted or unsubstituted heteroaryl group.

[Chemical Formula 2]

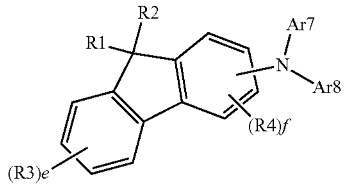

In Chemical Formula 2,

Ar7 and Ar8 are the same as or different from each other, and each independently a substituted or unsubstituted aryl group; or a substituted or unsubstituted heteroaryl group, R1 and R2 are the same as or different from each other, and each independently hydrogen; deuterium; a nitrile group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted silyl group; a substituted or unsubstituted amine group; a substituted or unsubstituted aryl group; or a substituted or unsubstituted heteroaryl group, or bond to each other to form a monocyclic or multicyclic aromatic or aliphatic hydrocarbon ring or heteroring, R3 and R4 are the same as or different from each other, and each independently hydrogen; deuterium; a nitrile group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted silyl group; a substituted or unsubstituted amine group; a substituted or unsubstituted aryl group; or a substituted or unsubstituted heteroaryl group, e is an integer of 0 to 4, and when e is 2 or greater, R3s are the same as or different from each other, f is an integer of 0 to 3, and when f is 2 or greater, R4s are the same as or different from each other.

Advantageous Effects

An organic light emitting device according to one embodiment of the present specification is capable of enhancing efficiency, obtaining a low driving voltage and/or enhancing a lifespan property in the organic light emitting device by placing a first organic material layer and a second organic material layer described above in an anode and a light emitting layer.

DESCRIPTION OF DRAWINGS

FIG. 1 illustrates a lamination structure of an organic light emitting device according to one embodiment of the present specification.

FIG. 2 illustrates a lamination structure of an organic light emitting device according to another embodiment of the present specification.

100: Substrate
101: Anode
201: First Organic Material Layer
202: Second Organic Material Layer
301: Light Emitting Layer
401: Cathode
501: Electron Transfer Layer
502: Electron Injection Layer

Mode for Disclosure

Hereinafter, the present specification will be described in more detail.

An organic light emitting device according to one embodiment of the present specification includes a cathode; an anode; a light emitting layer provided between the cathode and the anode; a first organic material layer provided between the anode and the light emitting layer and including a compound of Chemical Formula 1; and a second organic material layer provided between the first organic material layer and the light emitting layer and including a compound of Chemical Formula 2.

In the present specification, a description of a certain part "including" certain constituents means capable of further including other constituents, and does not exclude other constituents unless particularly stated on the contrary.

In the present specification, a description of one member being placed "on" another member includes not only a case of the one member adjoining the another member but a case of still another member being present between the two members.

Examples of the substituents are described below, however, the substituents are not limited thereto.

The term "substitution" means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other.

The term "substituted or unsubstituted" in the present specification means being substituted with one, two or more substituents selected from the group consisting of deuterium; a nitrile group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted silyl group; a substituted or unsubstituted boron group; a substituted or unsubstituted amine group; a substituted or unsubstituted aryl group; and a substituted or unsubstituted heterocyclic group, or being substituted with a substituent linking two or more substituents among the substituents illustrated above, or having no substituents. For example, "a substituent linking two or more substituents" may include an aryl group substituted with an aryl group, an aryl group substituted with a heteroaryl group, a heterocyclic group substituted with an aryl group, an aryl group substituted with an alkyl group and the like.

In the present specification, the alkyl group may be linear or branched, and the number of carbon atoms is not particularly limited, but is preferably from 1 to 30. Specific examples thereof may include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl and the like, but are not limited thereto.

In the present specification, the cycloalkyl group is not particularly limited, but preferably has 3 to 30 carbon atoms, and specific examples thereof may include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl and the like, but are not limited thereto.

In the present specification, the alkoxy group may be linear, branched or cyclic. The number of carbon atoms of the alkoxy group is not particularly limited, but is preferably from 1 to 30. Specific examples thereof may include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy and the like, but are not limited thereto.

In the present specification, the amine group may be selected from the group consisting of —$NH_2$; an alkylamine group; an N-alkylarylamine group; an arylamine group; an N-arylheteroarylamine group; an N-alkylheteroarylamine group and a heteroarylamine group, and the number of carbon atoms is, although not particularly limited thereto, preferably from 1 to 30. Specific examples of the amine group may include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, an N-phenylnaphthylamine group, a ditolylamine group, an N-phenyltolylamine group, a triphenylamine group, an N-phenylbiphenylamine group; an N-phenylnaphthylamine group; an N-biphenylnaphthylamine group; an N-naphthylfluorenylamine group; an N-phenylphenanthrenylamine group; an N-biphenylphenanthrenylamine group; an N-phenylfluorenylamine group; an N-phenylterphenylamine group; an N-phenanthrenylfluorenylamine group; an N-biphenylfluorenylamine group and the like, but are not limited thereto.

In the present specification, the N-alkylarylamine group means an amine group in which N of the amine group is substituted with an alkyl group and an aryl group.

In the present specification, the N-arylheteroarylamine group means an amine group in which N of the amine group is substituted with an aryl group and a heteroaryl group.

In the present specification, the N-alkylheteroarylamine group means an amine group in which N of the amine group is substituted with an alkyl group and a heteroaryl group.

In the present specification, the alkyl group in the alkylamine group, the N-arylalkylamine group, the alkylthioxy group, the alkylsulfoxy group and the N-alkylheteroarylamine group is the same as the examples of the alkyl group described above.

In the present specification, the alkenyl group may be linear or branched, and although not particularly limited thereto, the number of carbon atoms is preferably from 2 to 30. Specific examples thereof may include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group and the like, but are not limited thereto.

In the present specification, specific examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the aryl group is not particularly limited, but preferably has 6 to 30 carbon atoms, and the aryl group may be monocyclic or multicyclic.

When the aryl group is a monocyclic aryl group, the number of carbon atoms is not particularly limited, but is preferably from 6 to 30. Specific examples of the monocyclic aryl group may include a phenyl group, a biphenyl group, a terphenyl group and the like, but are not limited thereto.

When the aryl group is a multicyclic aryl group, the number of carbon atoms is not particularly limited, but is preferably from 10 to 30. Specific examples of the multicyclic aryl group may include a naphthyl group, an anthracenyl group, a phenanthryl group, a triphenyl group, a pyrenyl group, a phenalenyl group, a perylenyl group, a chrysenyl group, a fluorenyl group and the like, but are not limited thereto.

In the present specification, the fluorenyl group may be substituted, and adjacent groups may bond to each other to form a ring.

When the fluorenyl group is substituted,

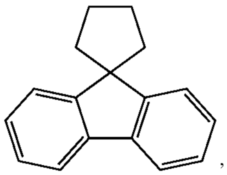 ,

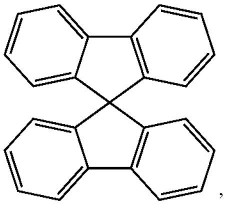 ,

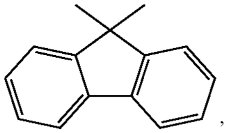 ,

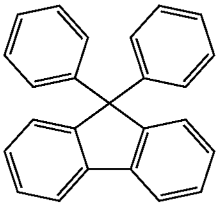 ,

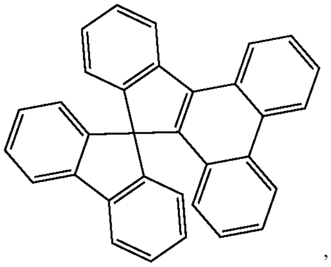 ,

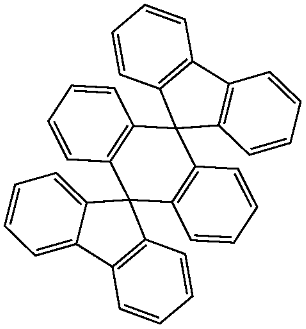

and the like may be included. However, the structure is not limited thereto.

In the present specification, examples of the arylamine group include a substituted or unsubstituted monoarylamine group, a substituted or unsubstituted diarylamine group, or a substituted or unsubstituted triarylamine group. The aryl group in the arylamine group may be a monocyclic aryl group or a multicyclic aryl group. The arylamine group including two or more aryl groups may include monocyclic aryl groups, multicyclic aryl groups, or both monocyclic aryl groups and multicyclic aryl groups. For example, the aryl group in the arylamine group may be selected from among the examples of the aryl group described above.

In the present specification, the aryl group in the aryloxy group, the N-arylalkylamine group and the N-arylheteroarylamine group is the same as the examples of the aryl group described above. Specific examples of the aryloxy group may include a phenoxy group, a p-tolyloxy group, an m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group and the like.

In the present specification, the heteroaryl group is a group including one or more atoms that are not carbon, that is, heteroatoms, and specifically, the heteroatom may include one or more atoms selected from the group consisting of O, N, Se, S and the like. The number of carbon atoms is not particularly limited, but is preferably from 2 to 30, and the heteroaryl group may be monocyclic or multicyclic. Examples of the heterocyclic group may include a thiophene group, a furanyl group, a pyrrole group, an imidazolyl group, a thiazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a qinolinyl group, a quinazolinyl group, a quinoxalinyl group, a phthalazinyl group, a pyridopyrimidyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group, an isoxazolyl group, a thiadiazolyl group, a benzothiazolyl group, a phenothiazinyl group, a dibenzofuranyl group and the like, but are not limited thereto.

In the present specification, examples of the heteroarylamine group include a substituted or unsubstituted monoheteroarylamine group, a substituted or unsubstituted diheteroarylamine group, or a substituted or unsubstituted triheteroarylamine group. The heteroarylamine group including two or more heteroaryl groups may include monocyclic heteroaryl groups, multicyclic heteroaryl groups, or both monocyclic heteroaryl groups and multicyclic heteroaryl groups. For example, the heteroaryl group in the heteroarylamine group may be selected from among the examples of the heteroaryl group described above.

In the present specification, examples of the heteroaryl group in the N-arylheteroarylamine group and the N-alkylheteroarylamine group are the same as the examples of the heteroaryl group described above.

In the present specification, descriptions on the aryl group provided above may be applied to the arylene group except for being a divalent group.

In the present specification, descriptions on the heteroaryl group provided above may be applied to the heteroarylene group except for being a divalent group.

In the present specification, the hydrocarbon ring may be aromatic, aliphatic or a fused ring of aromatic and aliphatic, and may be selected from among the examples of the cycloalkyl group or the aryl group except for those that are not monovalent.

In the present specification, the aromatic ring may be monocyclic or multicyclic, and may be selected from among the examples of the aryl group except for those that are not monovalent.

In the present specification, the heteroring is a group including one or more atoms that are not carbon, that is, heteroatoms, and specifically, the heteroatom may include one or more atoms selected from the group consisting of O, N, Se, S and the like. The heteroring may be monocyclic or multicyclic, may be aromatic, aliphatic or a fused ring of aromatic and aliphatic, and may be selected from among the examples of the heteroaryl group except for those that are not monovalent.

According to another embodiment of the present specification, l+m+n is 1 or greater in Chemical Formula 1.

According to another embodiment of the present specification, m+n is 1 or greater in Chemical Formula 1.

According to another embodiment of the present specification, p is 0 in Chemical Formula 1.

According to another embodiment of the present specification, a is an integer of 1 to 3 in Chemical Formula 1.

According to one embodiment of the present specification, Chemical Formula 1 may be represented by the following Chemical Formula 3.

[Chemical Formula 3]

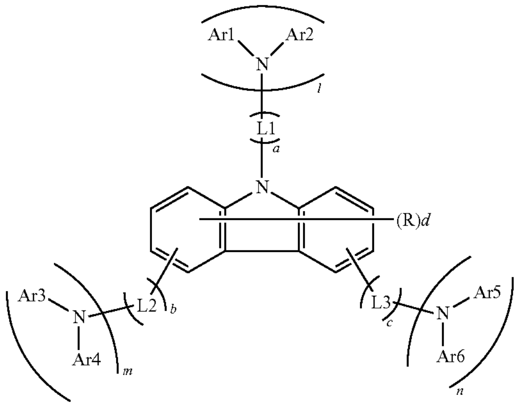

In Chemical Formula 3, substituents have the same definitions as in Chemical Formula 1.

According to one embodiment of the present specification, in Chemical Formula 1, at least one of —NAr1Ar2, —NAr3Ar4 and —NAr5Ar6 may be represented by the following structural formula.

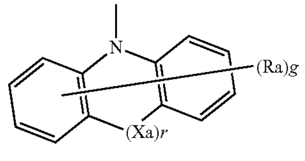

In the structural formula,

Xa is NRc; O; or S, r is 0 or 1, and when r is 0, two carbons bonding to Xa directly bond, Ra and Rc are the same as or different from each other, and each independently hydrogen; deuterium; a nitrile group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted silyl group; a substituted or unsubstituted amine group; a substituted or unsubstituted aryl group; or a substituted or unsubstituted heteroaryl group, g is an integer of 0 to 8, and when g is 2 or greater, Ras are the same as or different from each other.

According to one embodiment of the present specification, Chemical Formula 1 may be represented by the following Chemical Formula 4.

[Chemical Formula 4]

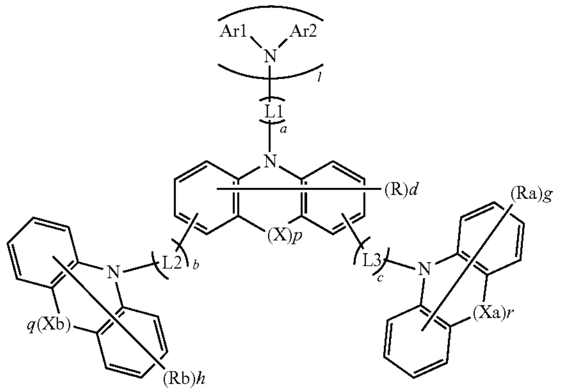

In Chemical Formula 4, Ar1, Ar2, L1 to L3, R, X, a, b, c, d, 1 and p have the same definitions as in Chemical Formula 1, Xa and Xb are the same as or different from each other, and each independently NRc; O; or S, r and q are each 0 or 1, and when r and q are each 0, two carbons bonding to each of Xa and Xb directly bond, Ra to Rc are the same as or different from each other, and each independently hydrogen; deuterium; a nitrile group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted silyl group; a substituted or unsubstituted amine group; a substituted or unsubstituted aryl group; or a substituted or unsubstituted heteroaryl group, g and h are each an integer of 0 to 8, and when g or h is 2 or greater, structures in the parentheses are the same as or different from each other.

According to one embodiment of the present specification, Chemical Formula 1 may be represented by the following Chemical Formula 5.

[Chemical Formula 5]

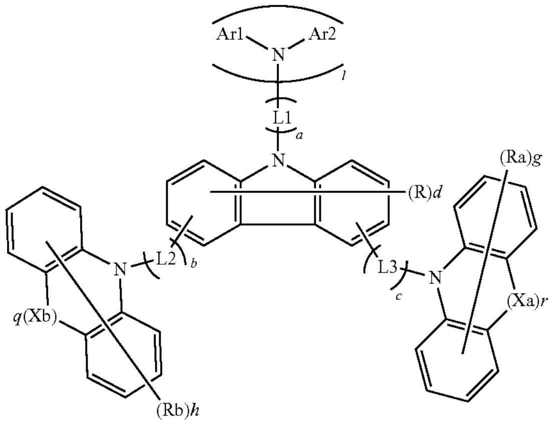

Substituents of Chemical Formula 5 have the same definitions as in Chemical Formula 4.

According to one embodiment of the present specification, in Chemical Formula 1, at least one of -(L1)a-NAr1Ar2, -(L2)b-NAr3Ar4 and -(L3)c-NAr5Ar6 may be represented by the following structural formula.

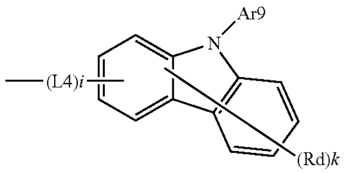

In the structural formula, L4 is a direct bond; a substituted or unsubstituted arylene group; or a substituted or unsubstituted heteroarylene group, i is an integer of 0 to 2, and when i is 2, L4s are the same as or different from each other, Ar9 is a substituted or unsubstituted aryl group; or a substituted or unsubstituted heteroaryl group, and Rd is hydrogen; deuterium; a nitrile group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted silyl group; a substituted or unsubstituted amine group; a substituted or unsubstituted aryl group; or a substituted or unsubstituted heteroaryl group, k is an integer of 0 to 7, and when k is 2 or greater, Rds are the same as or different from each other.

According to one embodiment of the present specification, Chemical Formula 1 may be represented by the following Chemical Formula 6.

[Chemical Formula 6]

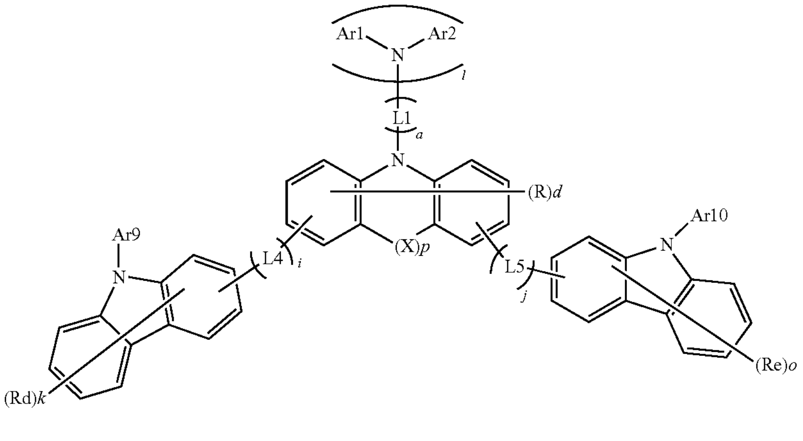

In Chemical Formula 6,

L4 and L5 are the same as or different from each other, and each independently a direct bond; a substituted or unsubstituted arylene group; or a substituted or unsubstituted heteroarylene group, i and j are each an integer of 0 to 2, and when i and j are each 2, structures in the parentheses are the same as or different from each other, Ar9 and Ar10 are the same as or different from each other and independently a substituted or unsubstituted aryl group; or a substituted or unsubstituted heteroaryl group, and Rd and Re are the same as or different from each other and each independently hydrogen; deuterium; a nitrile group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted silyl group; a substituted or unsubstituted amine group; a substituted or unsubstituted aryl group; or a substituted or unsubstituted heteroaryl group, k and o are each an integer of 0 to 7, and when k or o is 2 or greater, structures in the parentheses are the same as or different from each other.

According to one embodiment of the present specification, Chemical Formula 1 may be represented by the following Chemical Formula 7.

[Chemical Formula 7]

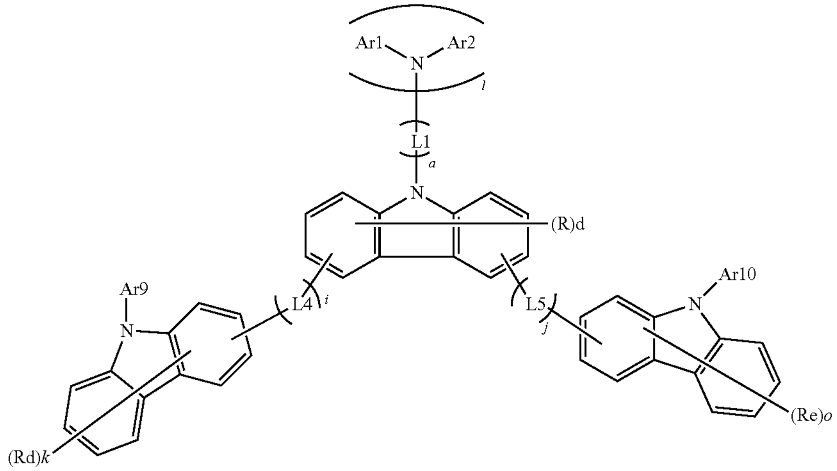

Substituents of Chemical Formula 7 have the same definitions as in Chemical Formula 6.

According to one embodiment of the present application, L1 to L3 are the same as or different from each other, and each independently a direct bond; an arylene group; or a heteroarylene group.

According to one embodiment of the present application, L1 to L3 are the same as or different from each other, and each independently a direct bond; or an arylene group.

According to one embodiment of the present application, L1 to L3 are the same as or different from each other, and each independently a direct bond; a phenylene group; or a naphthylene group.

According to one embodiment of the present application, L1 to L3 are the same as or different from each other, and each independently a direct bond; or a phenylene group.

According to one embodiment of the present application, L1 to L3 are the same as or different from each other, and each independently a direct bond; or a phenylene group, and a to c are each an integer of 0 to 2.

According to one embodiment of the present application, Ar1 to Ar6 are the same as or different from each other, and each independently a substituted or unsubstituted aryl group; or a substituted or unsubstituted heteroaryl group.

According to one embodiment of the present application, Ar1 to Ar6 are the same as or different from each other, and each independently an aryl group unsubstituted or substituted with an alkyl group; or a heteroaryl group unsubstituted or substituted with an alkyl group.

According to one embodiment of the present application, Ar1 to Ar6 are the same as or different from each other, and each independently an aryl group unsubstituted or substituted with an alkyl group.

According to one embodiment of the present application, Ar1 to Ar6 are the same as or different from each other, and each independently a phenyl group, a biphenylyl group or a terphenylyl group.

According to one embodiment of the present application, 1 is 0.

According to one embodiment of the present application, 1 is 0, and L1 is a phenyl group, a biphenylyl group, a naphthyl group, or a fluorenylenyl group unsubstituted or substituted with an alkyl group.

According to one embodiment of the present application, 1 is 0, and L1 is a phenyl group, a biphenylyl group, a naphthyl group or a dimethylfluorenylenyl group.

According to one embodiment of the present application, R', Ar9 and Ar10 are an aryl group.

According to one embodiment of the present application, R', Ar9 and Ar10 are a phenyl group.

According to one embodiment of the present application, Xa and Xb are 0 or S.

According to one embodiment of the present application, r and q are 0.

According to one embodiment of the present application, Chemical Formula 1 may be selected from among the following specific examples.

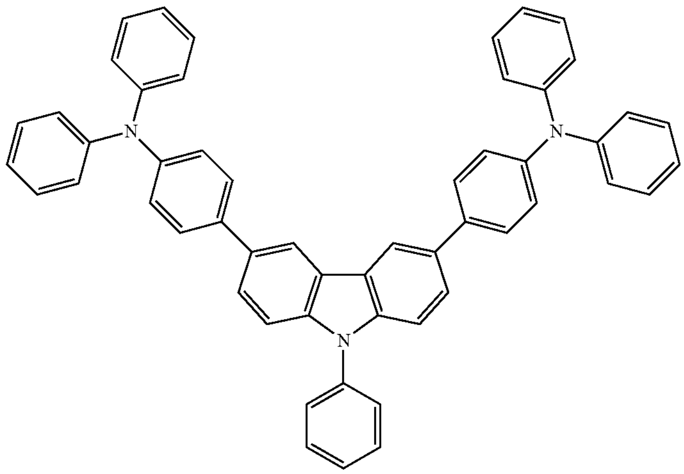

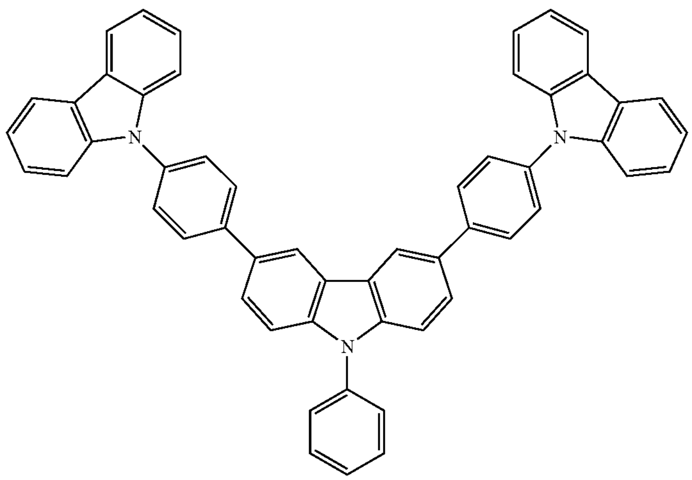

-continued
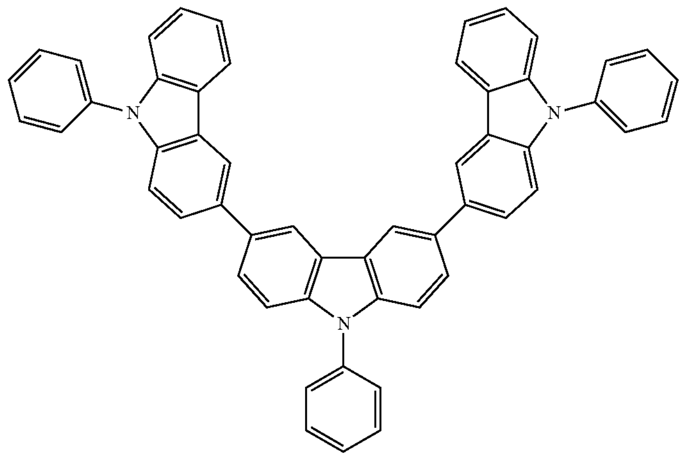
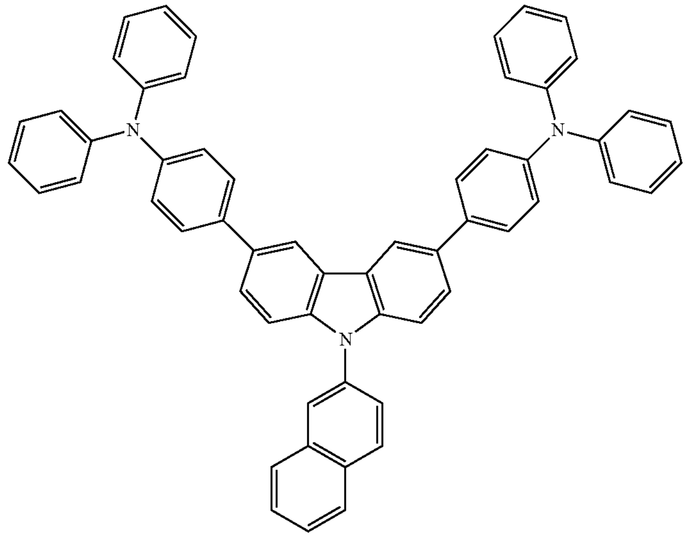
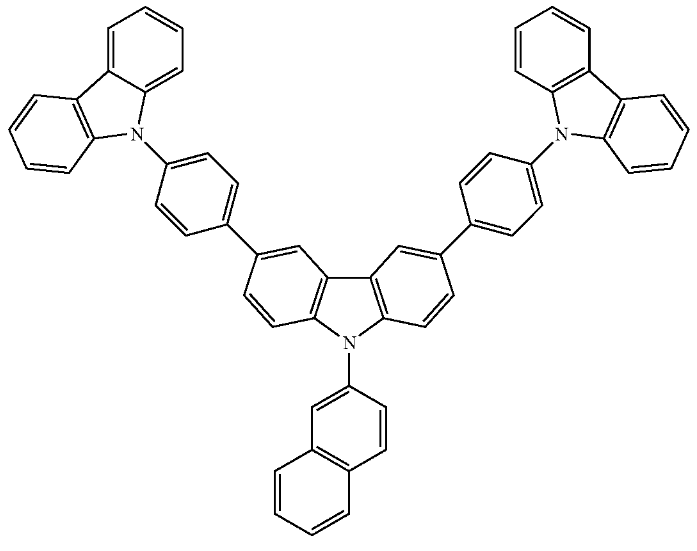

-continued
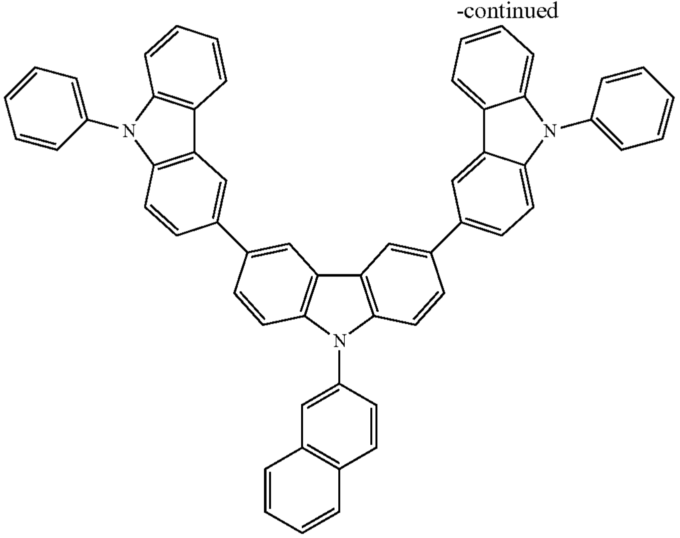
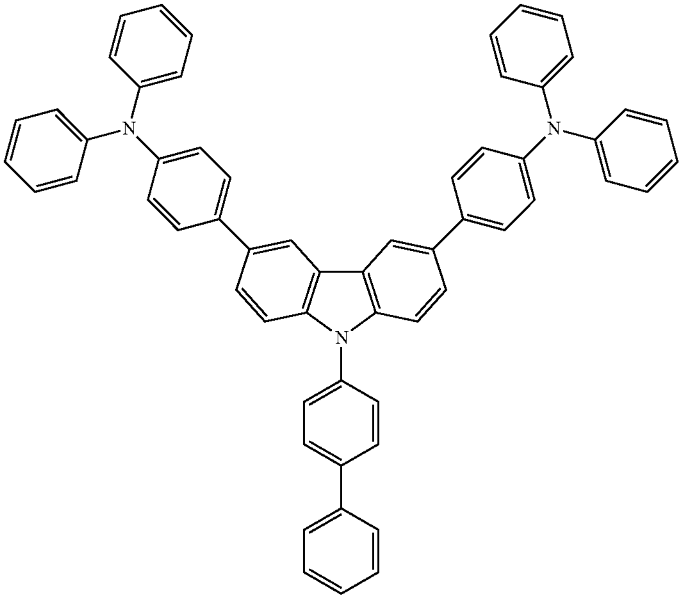
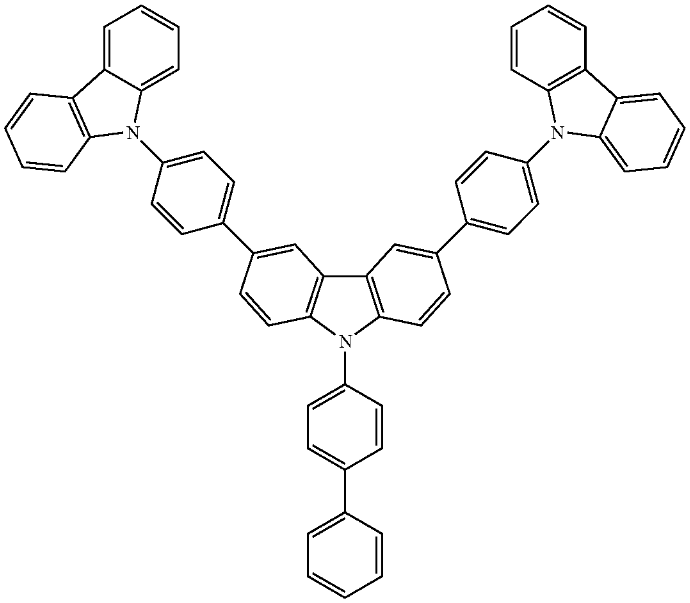

-continued
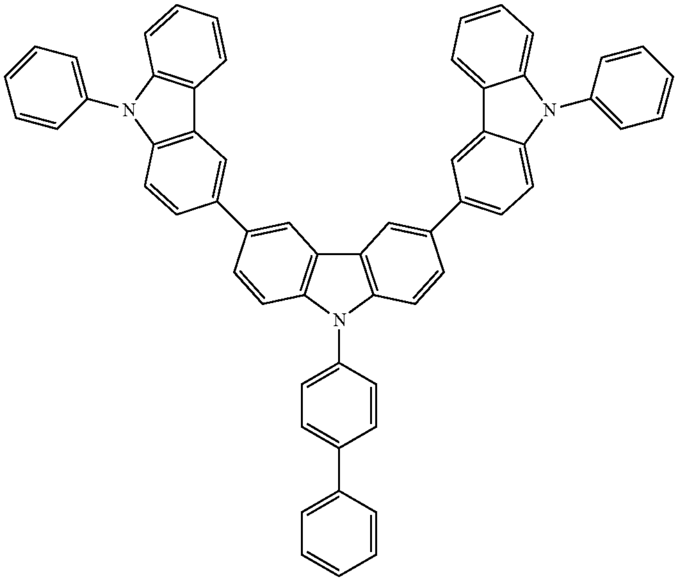
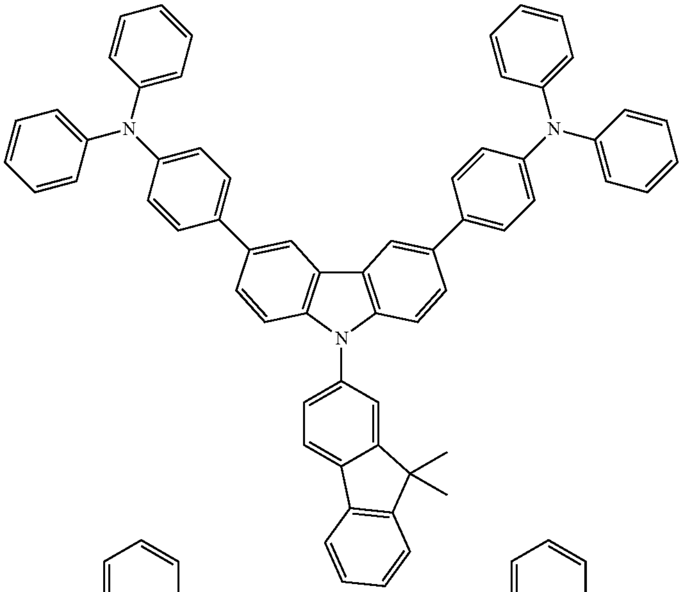
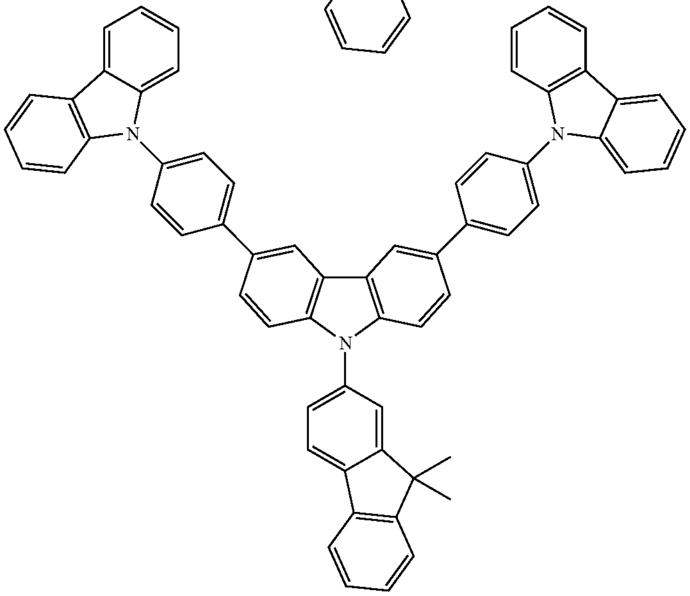

-continued
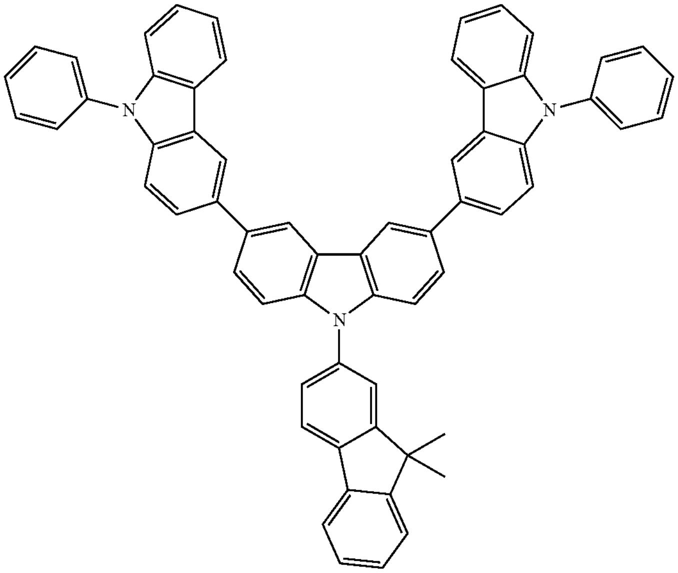
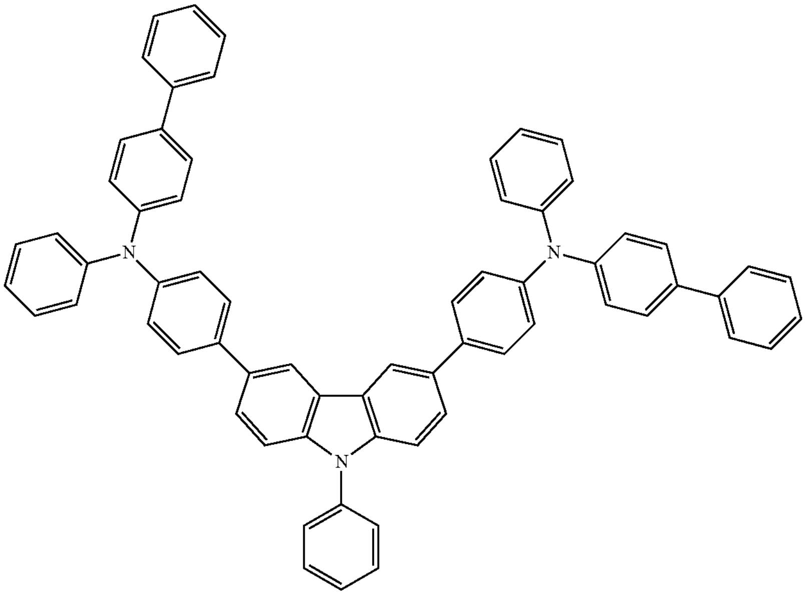
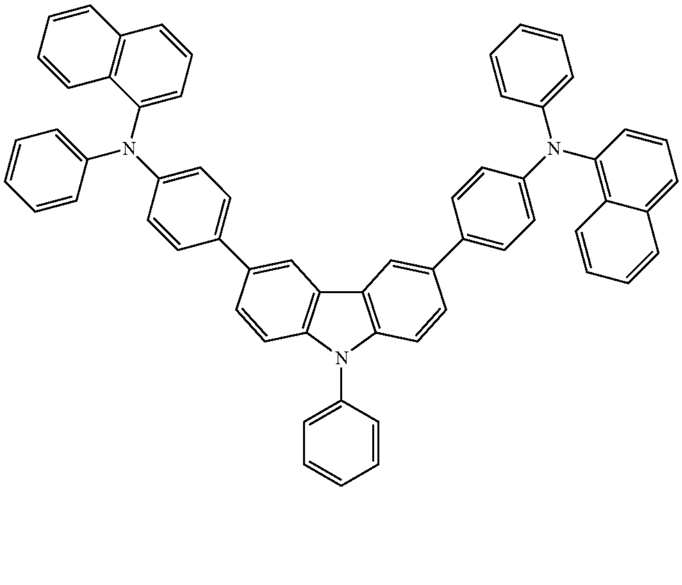

-continued
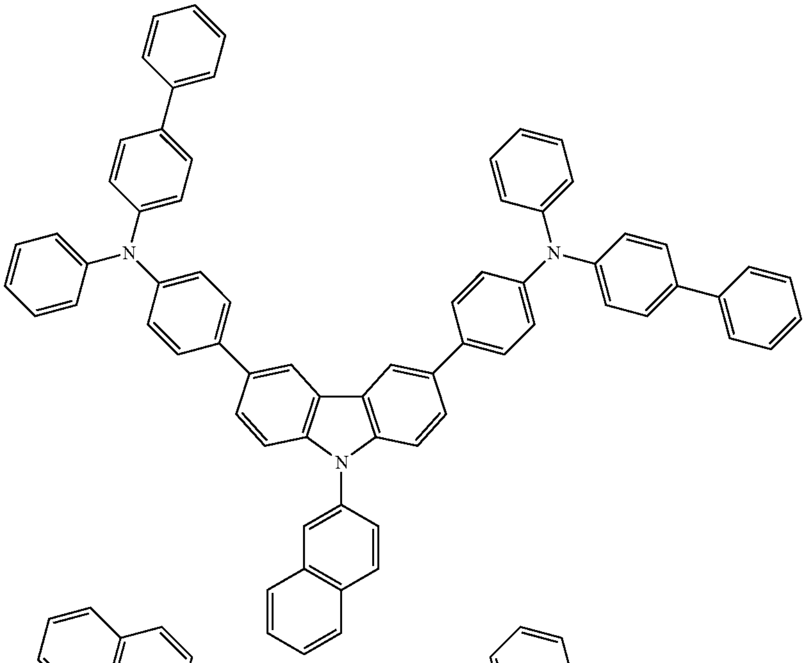
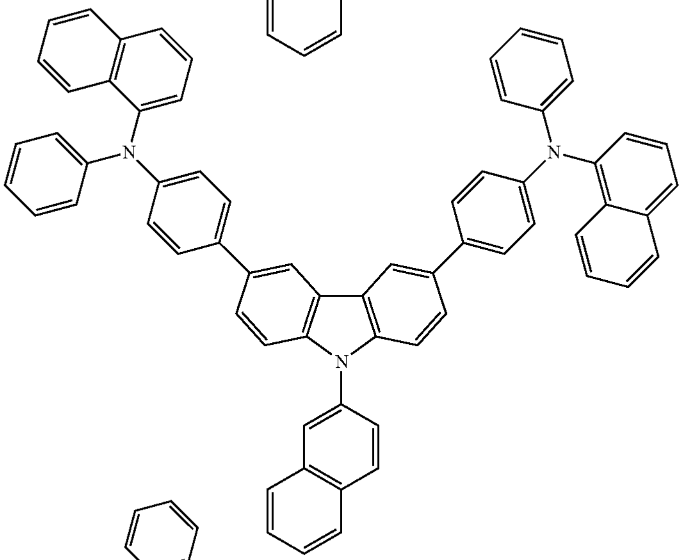
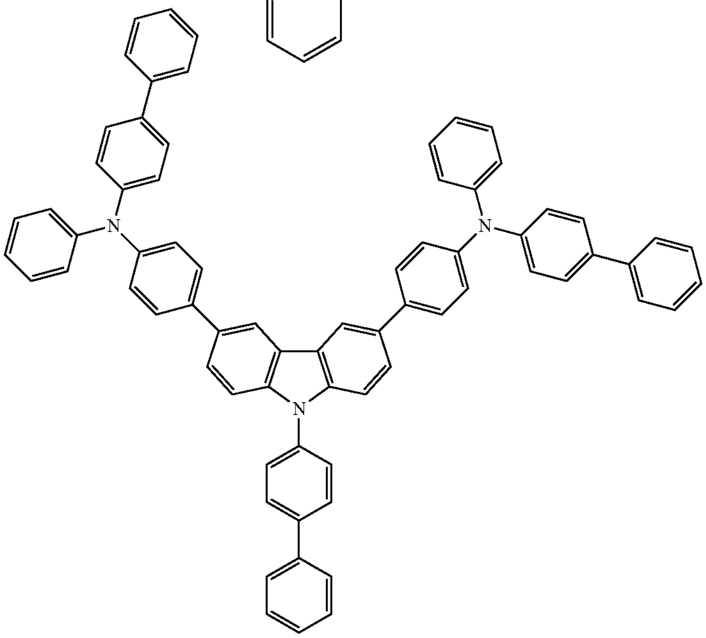

-continued
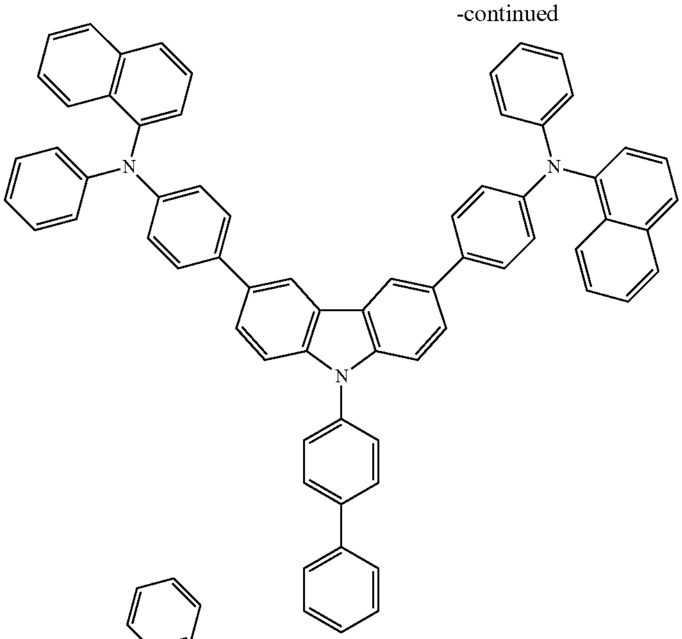
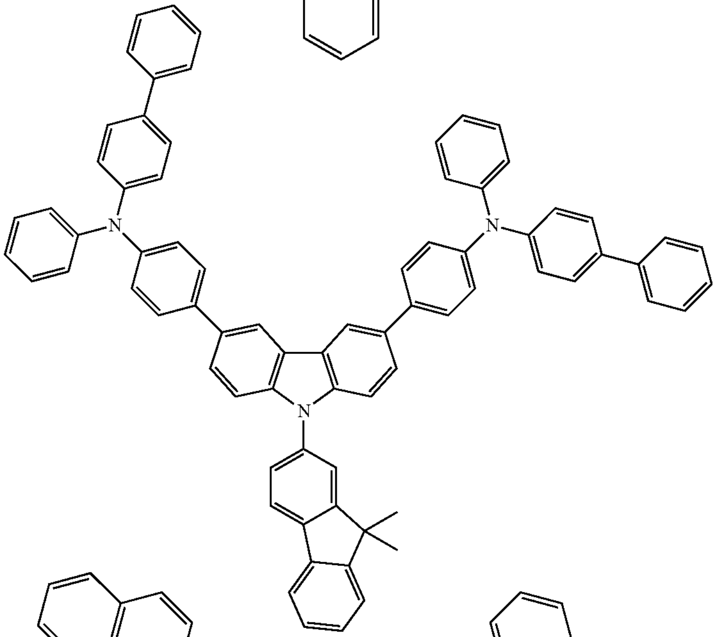
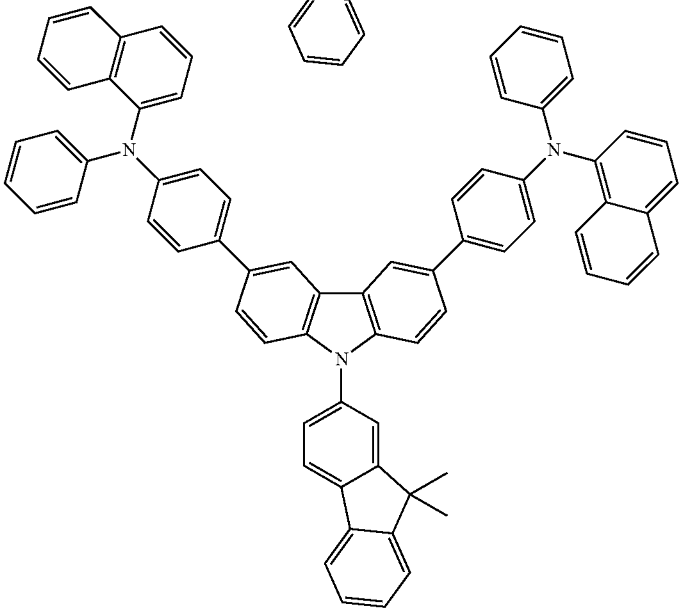

-continued
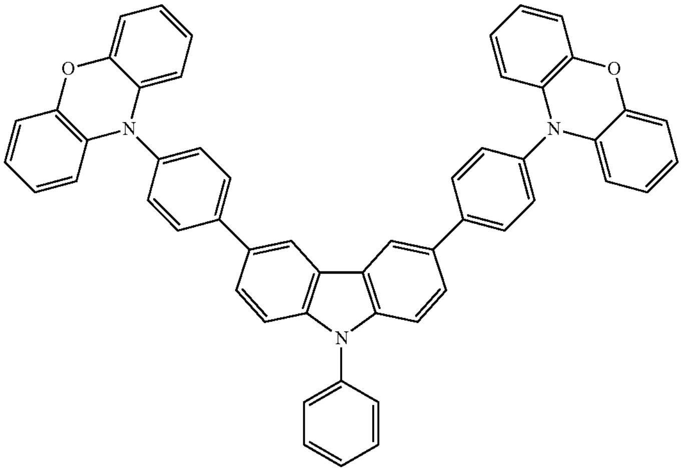
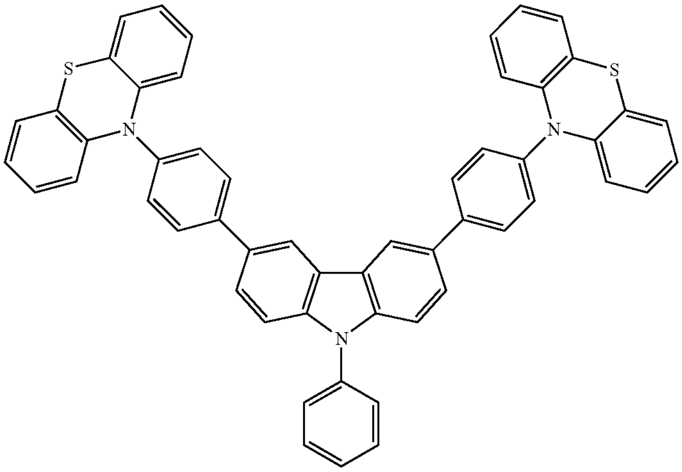
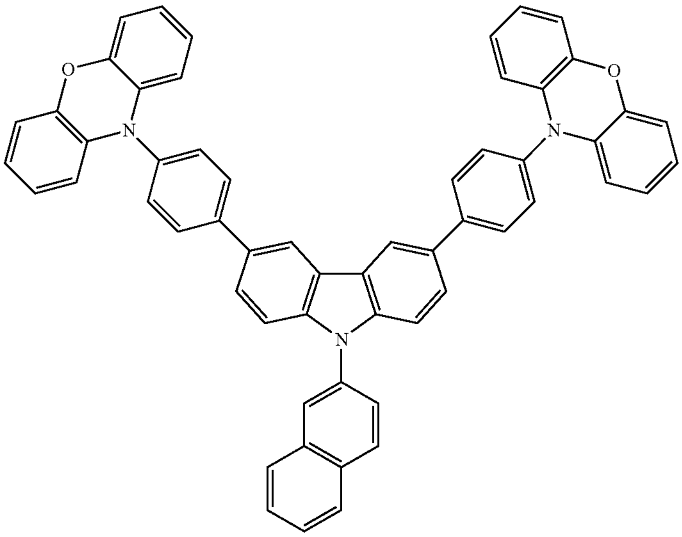

-continued
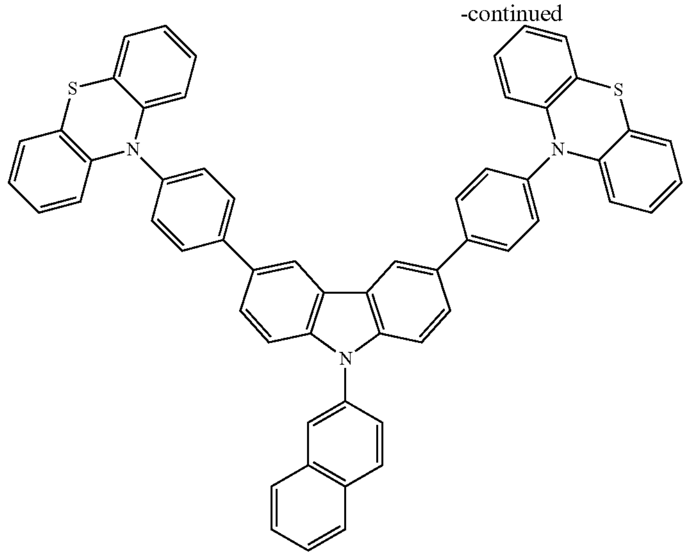
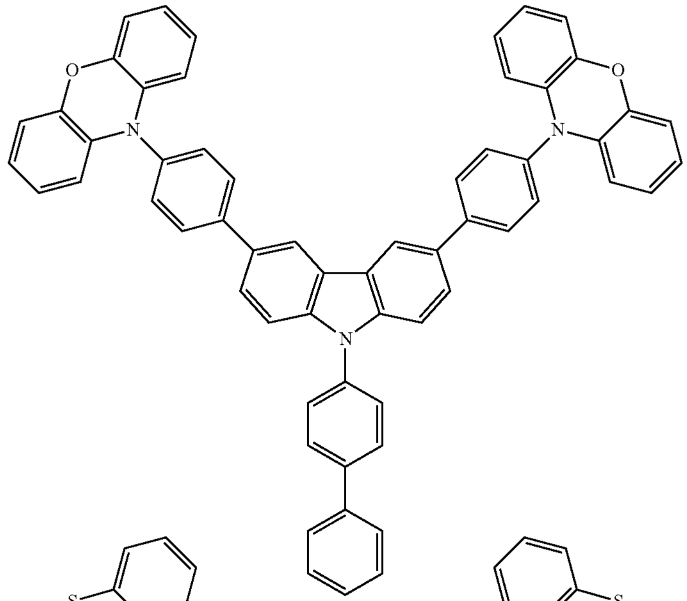
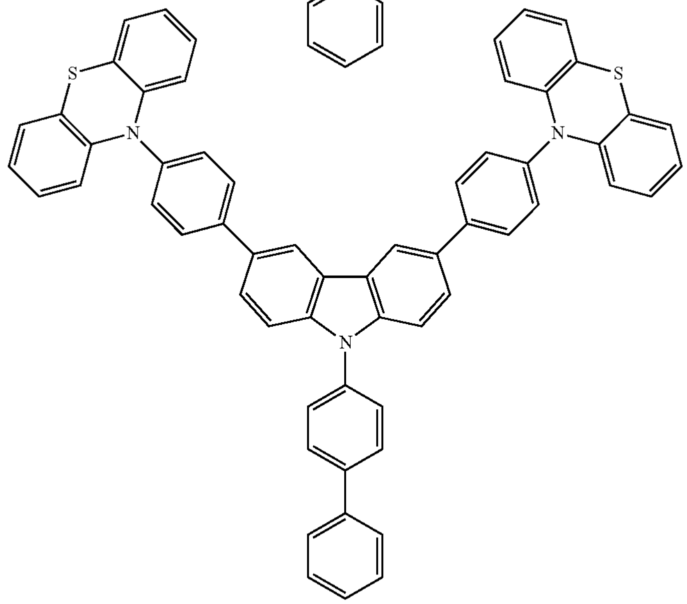

-continued
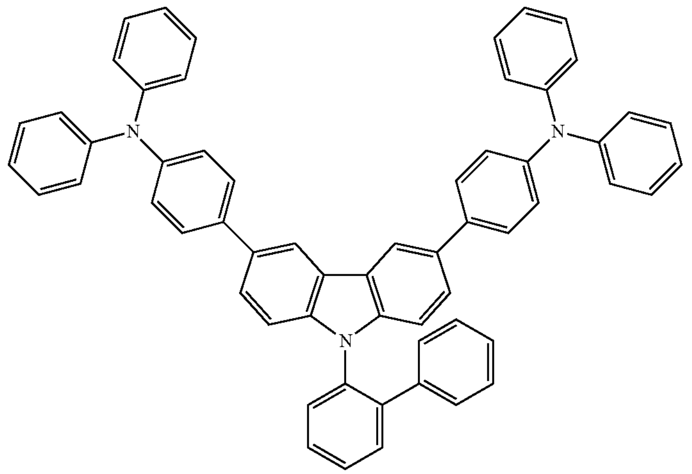
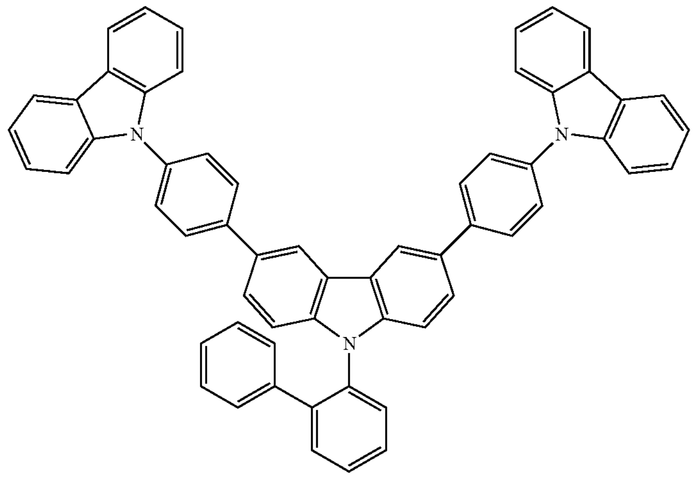
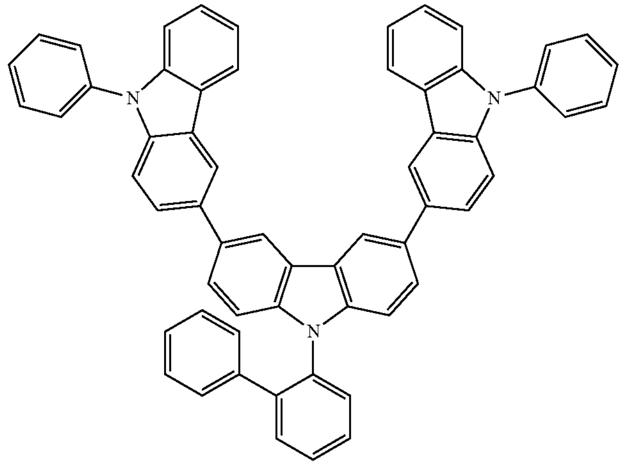

-continued
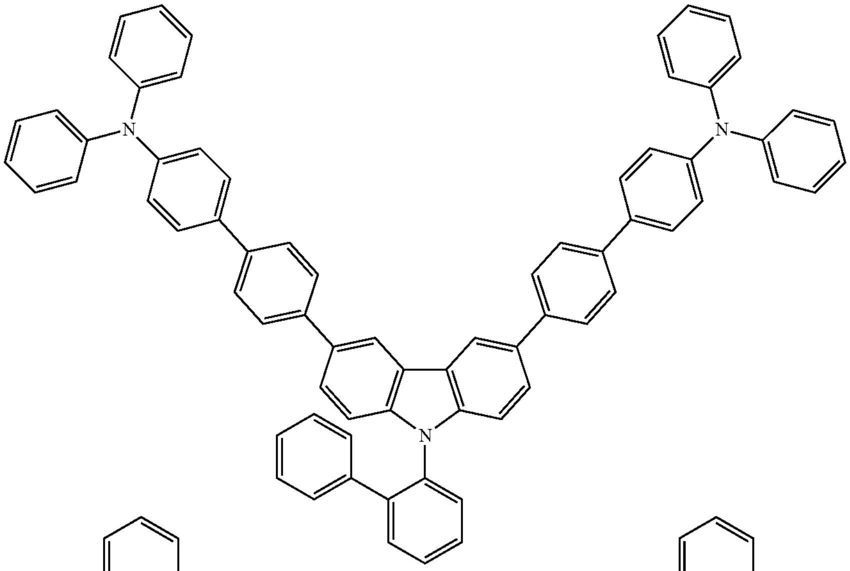
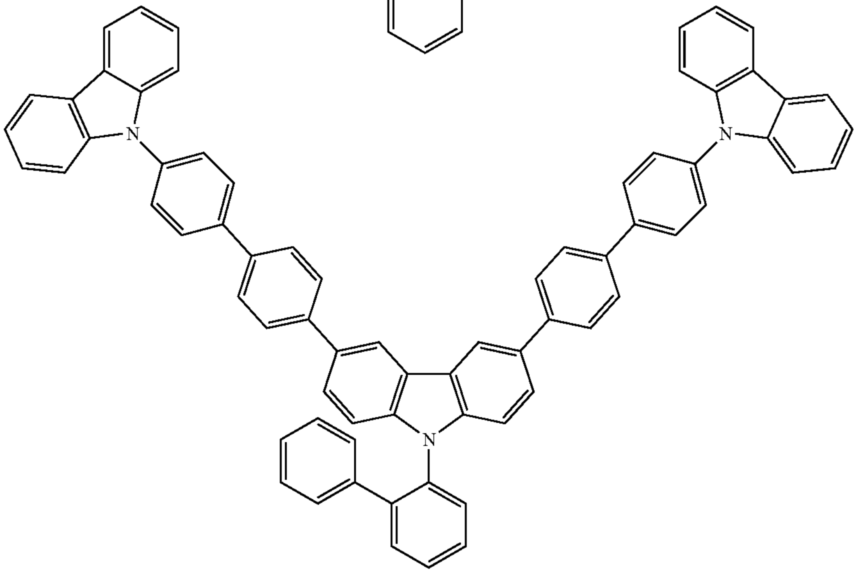
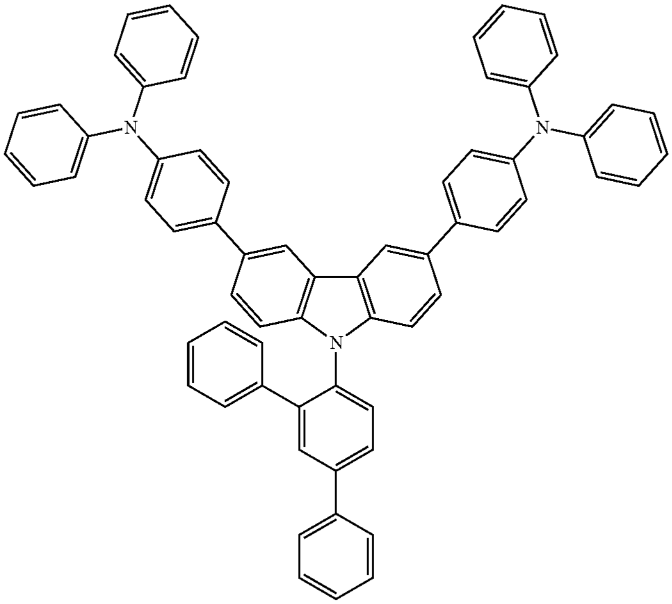

-continued
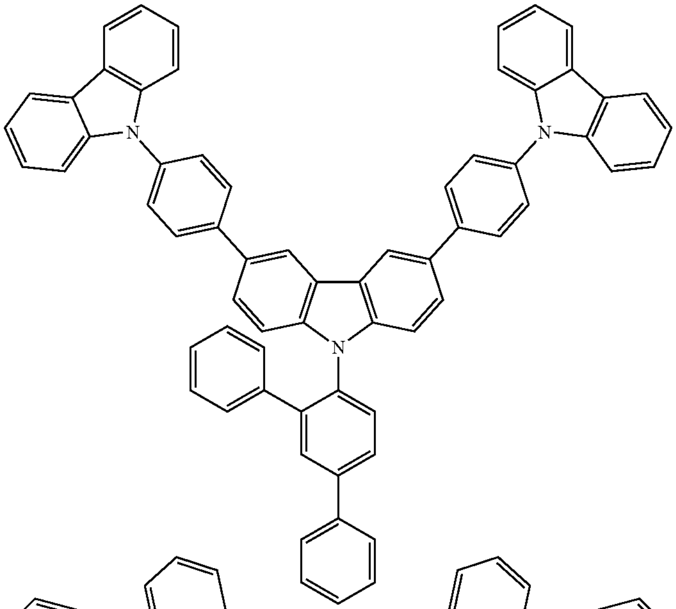
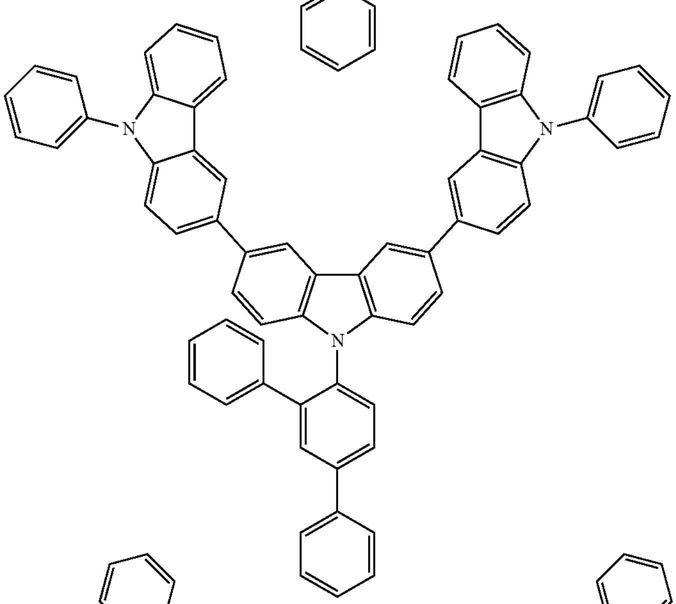
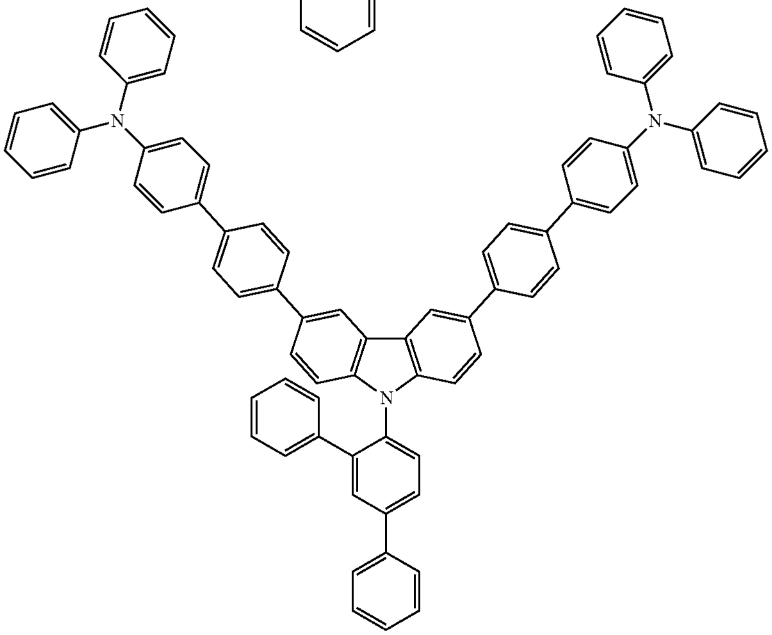

-continued
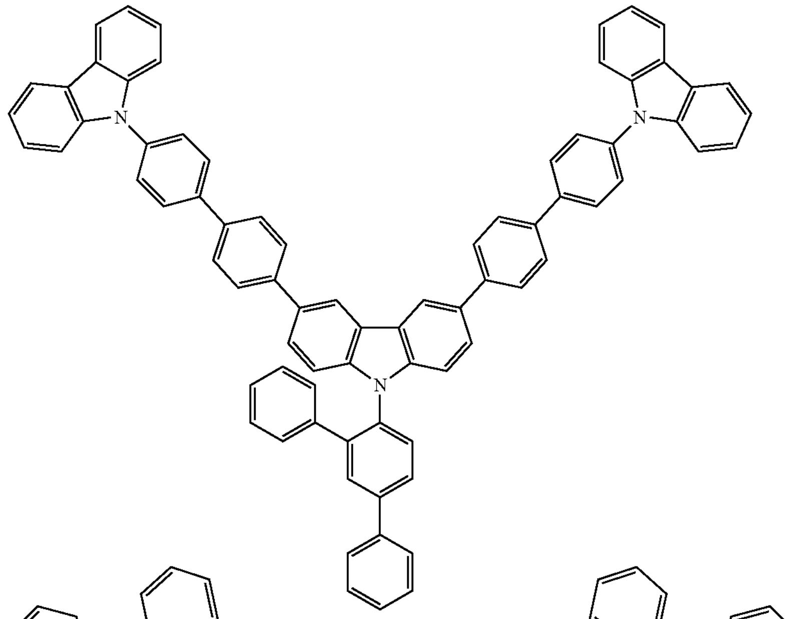
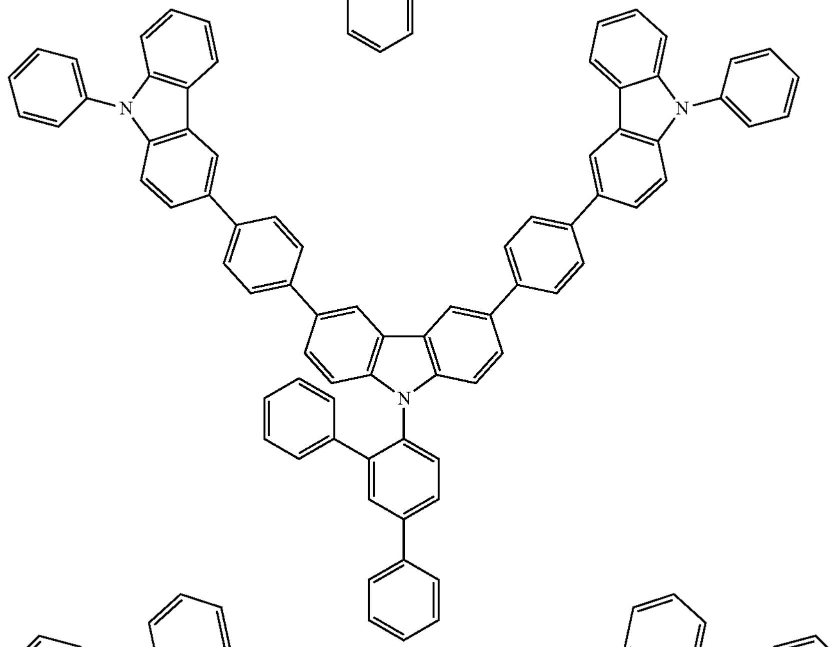
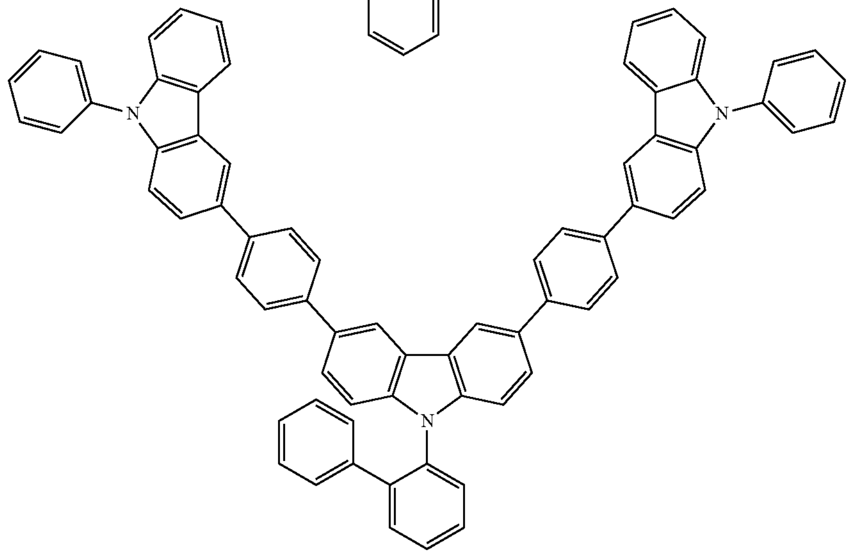

-continued
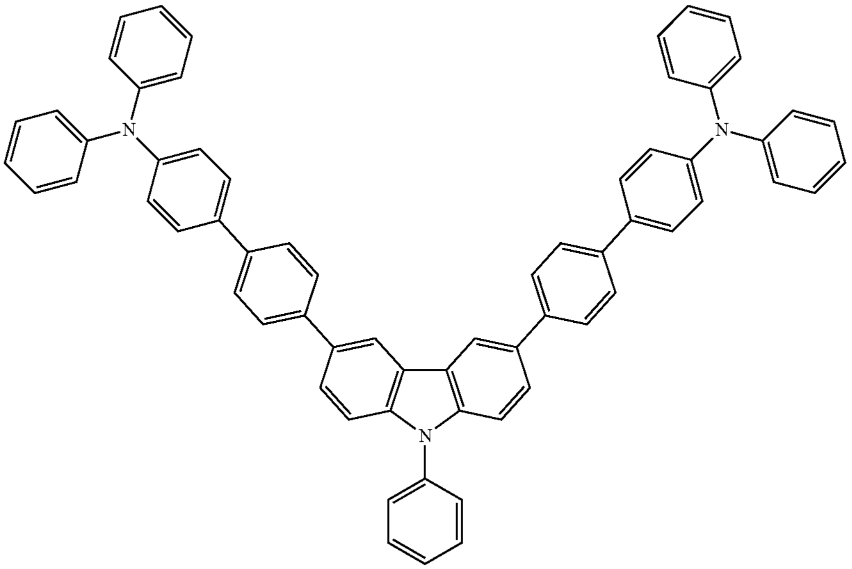
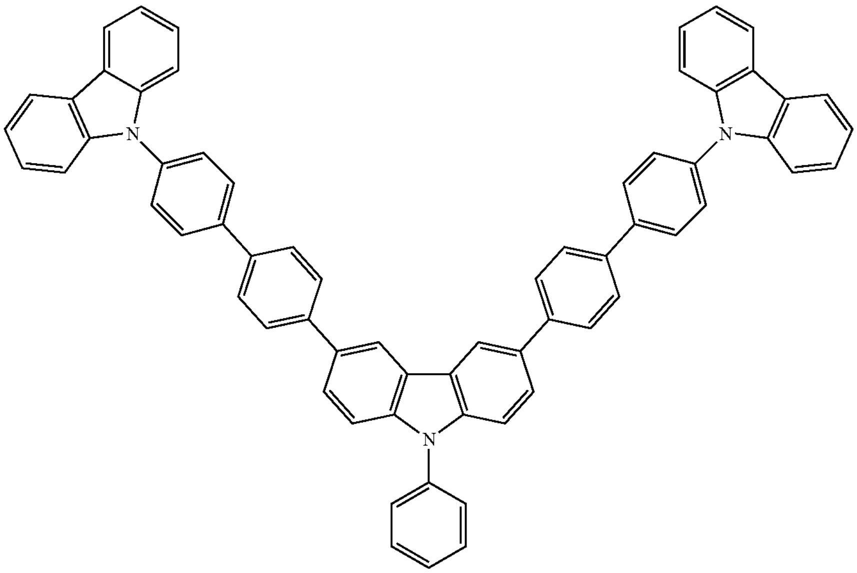
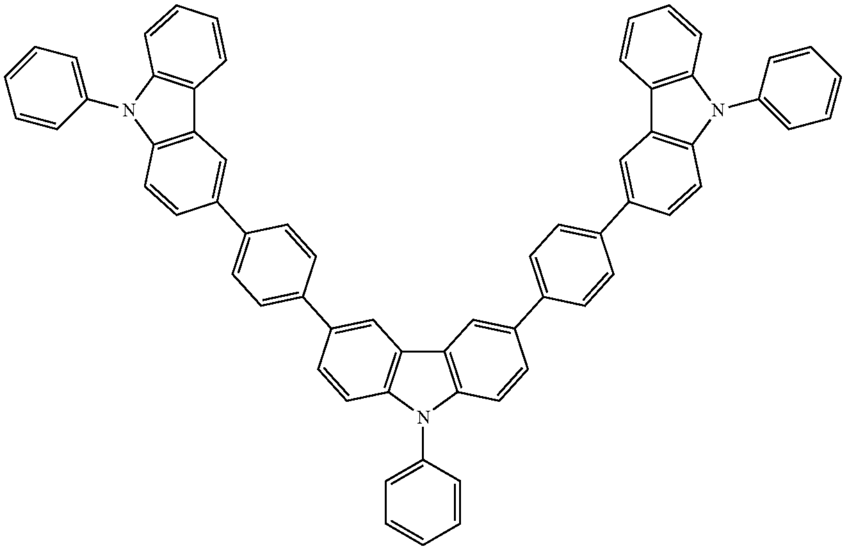

-continued
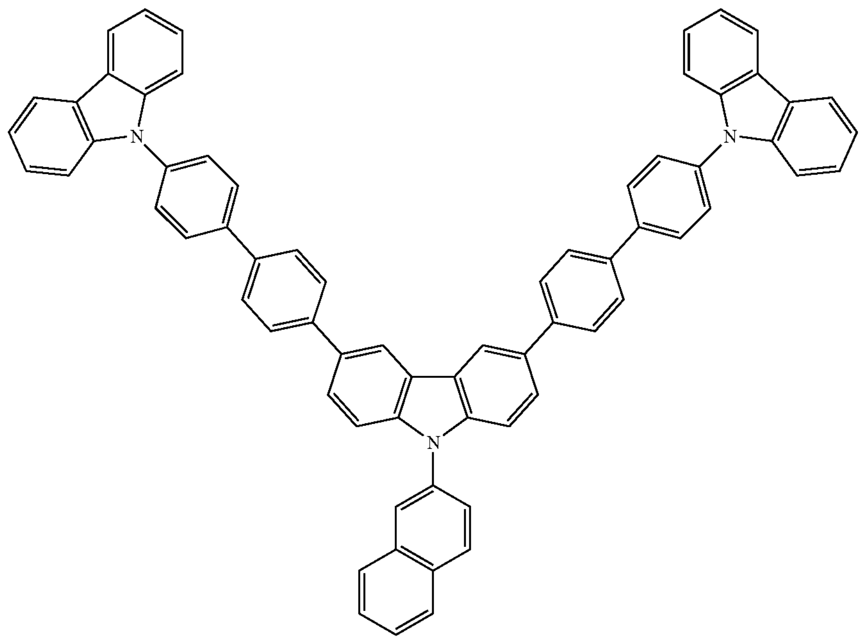
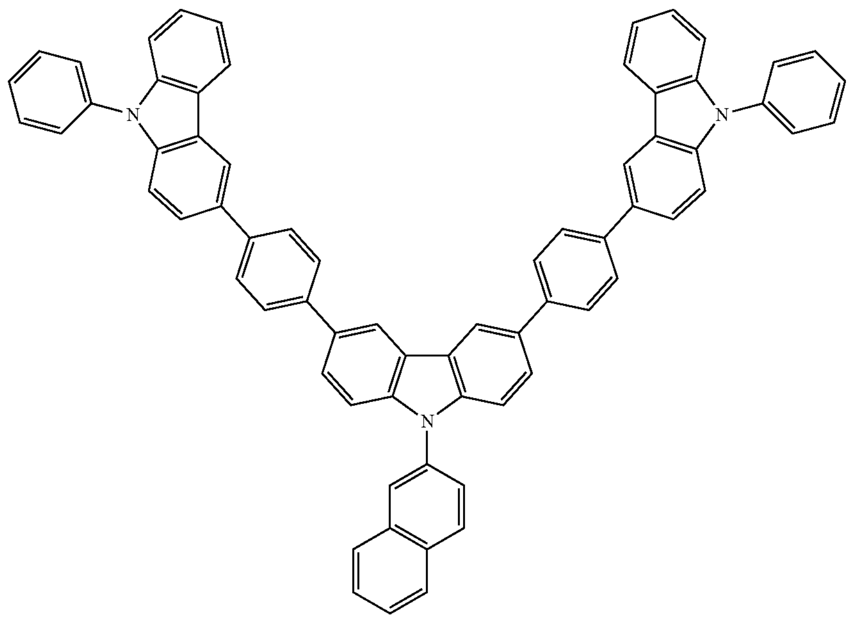

-continued
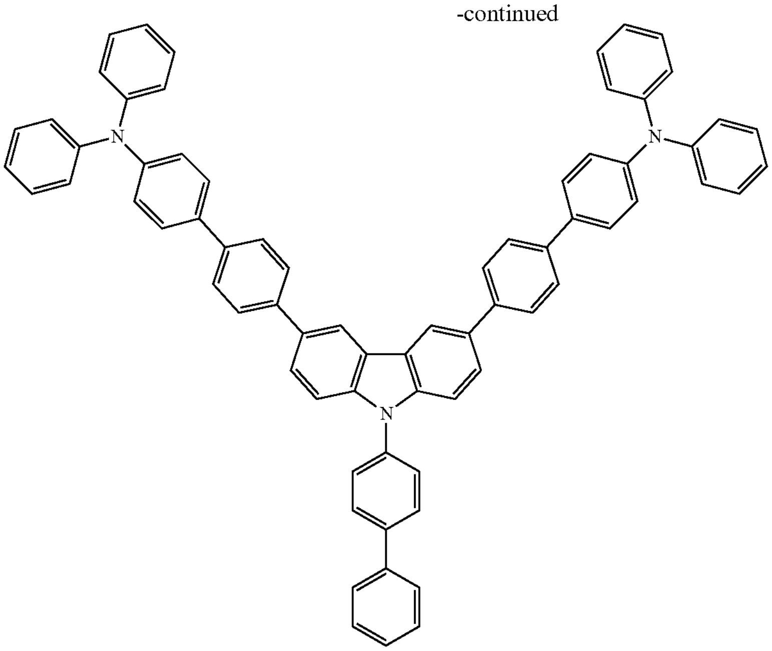
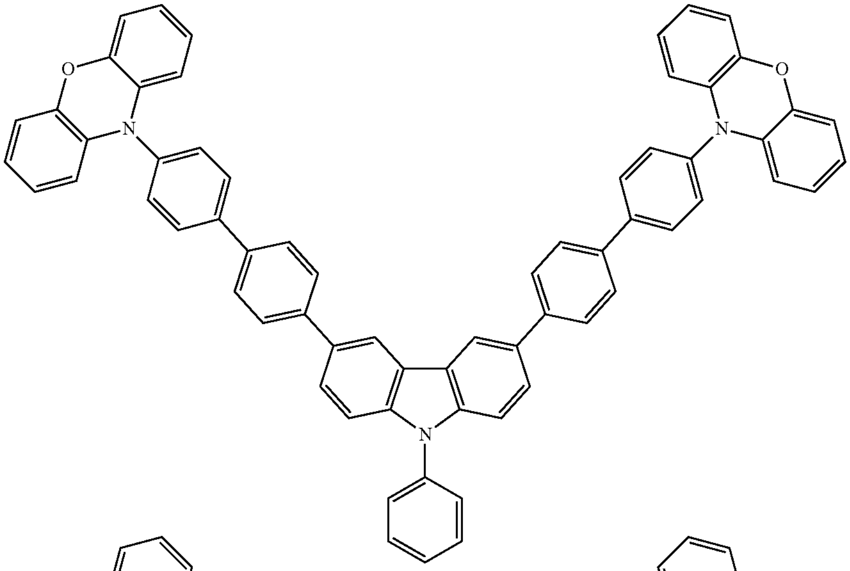
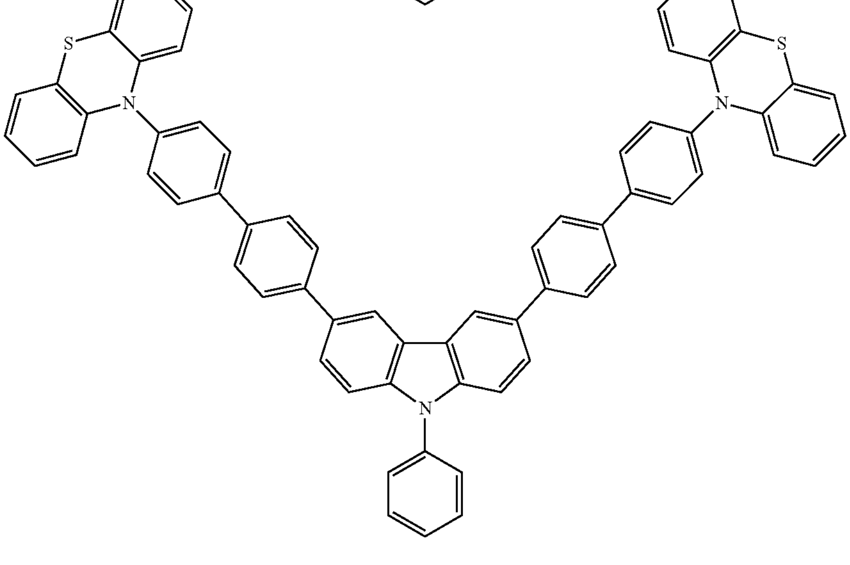

-continued
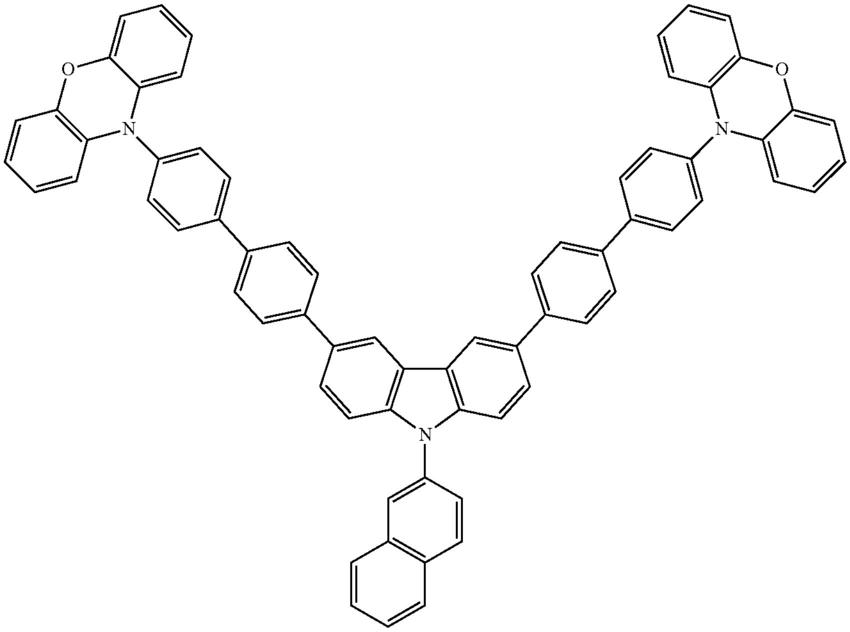
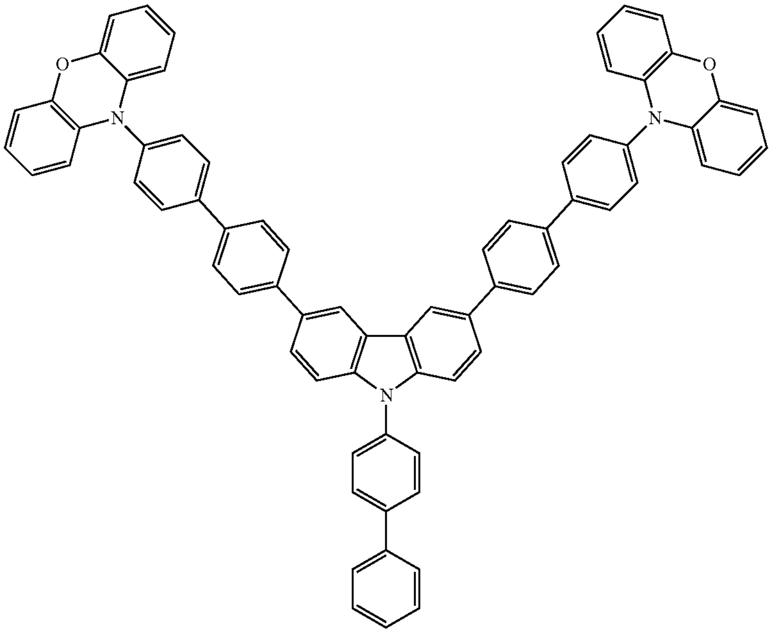

-continued
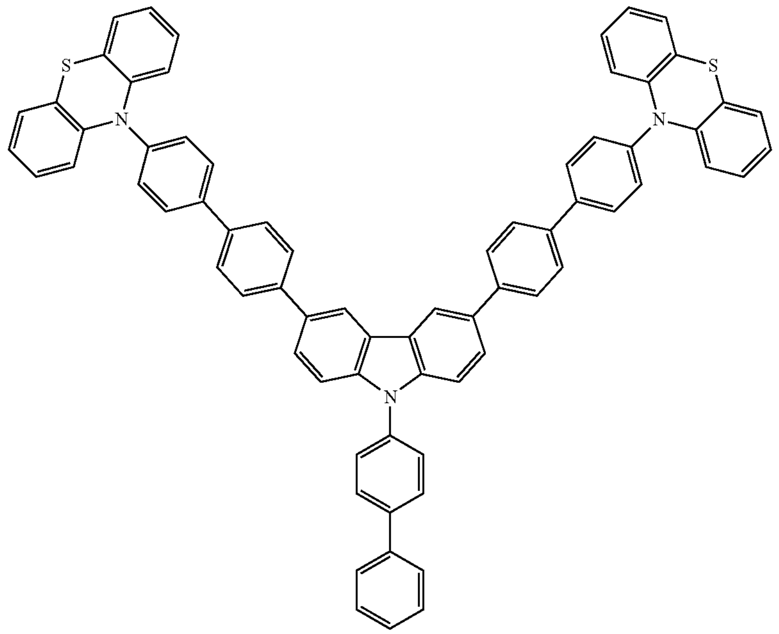
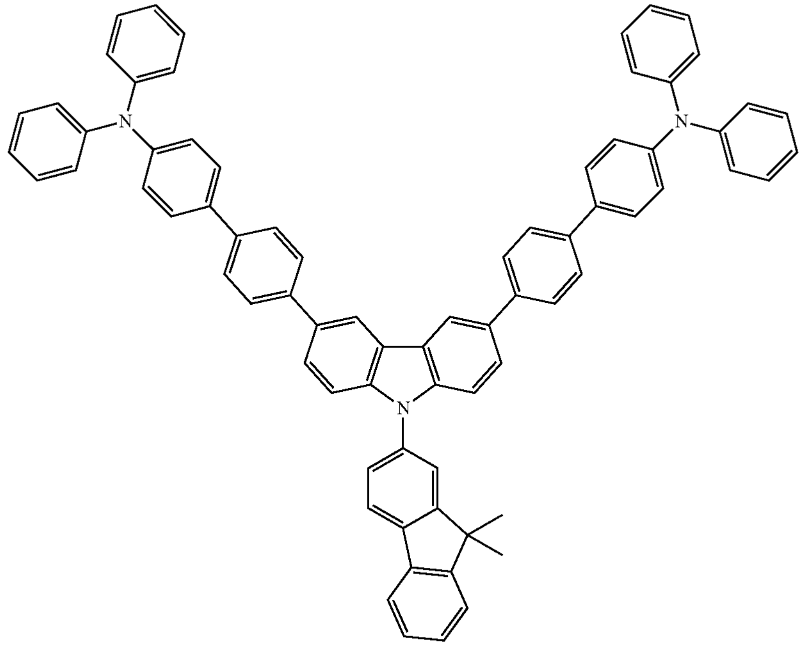
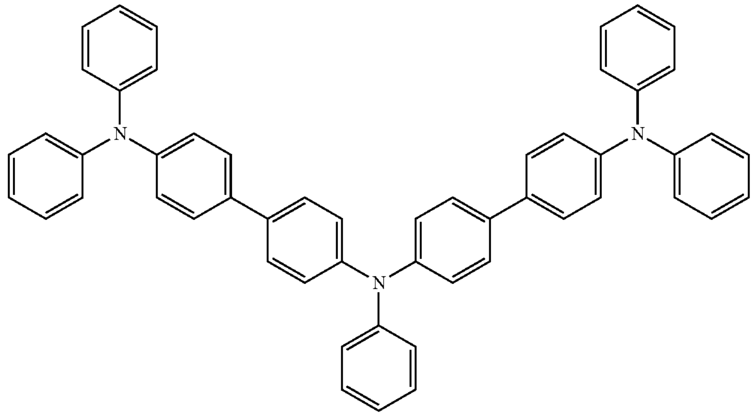

-continued
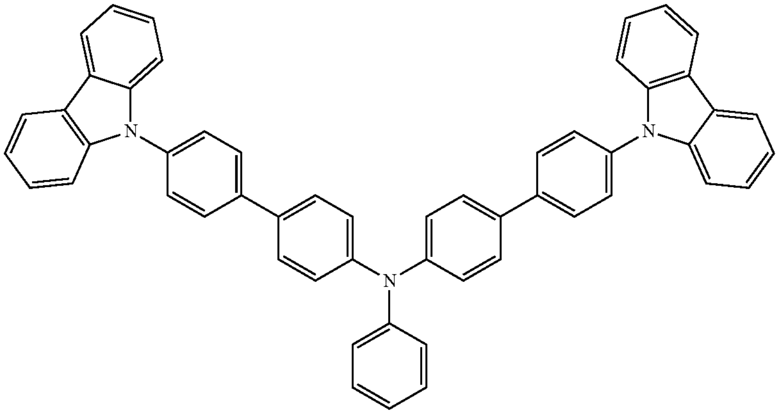
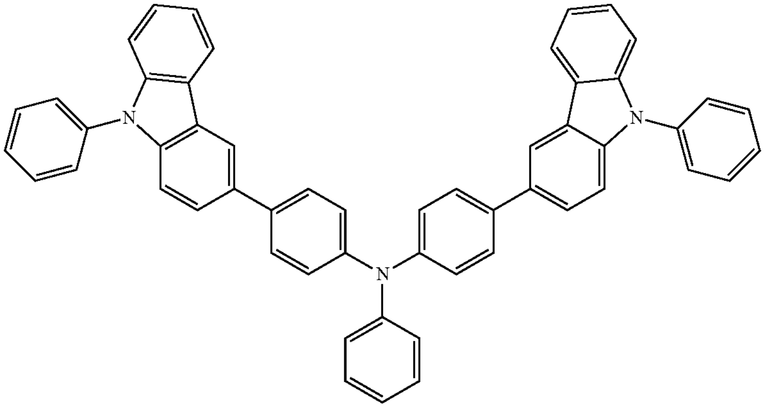
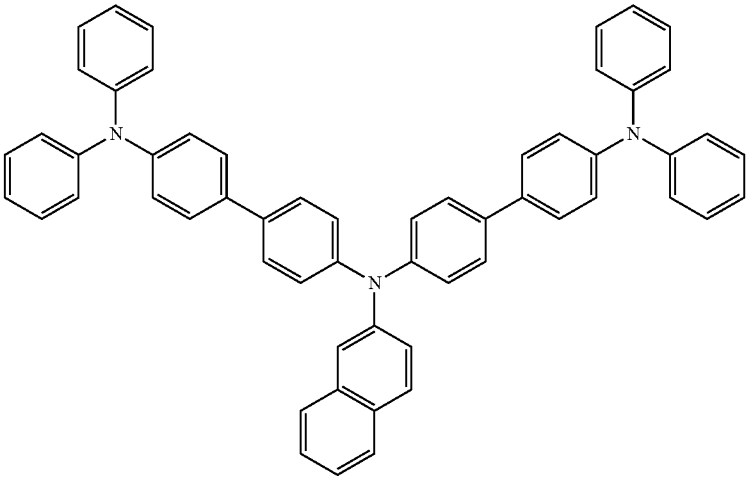

-continued
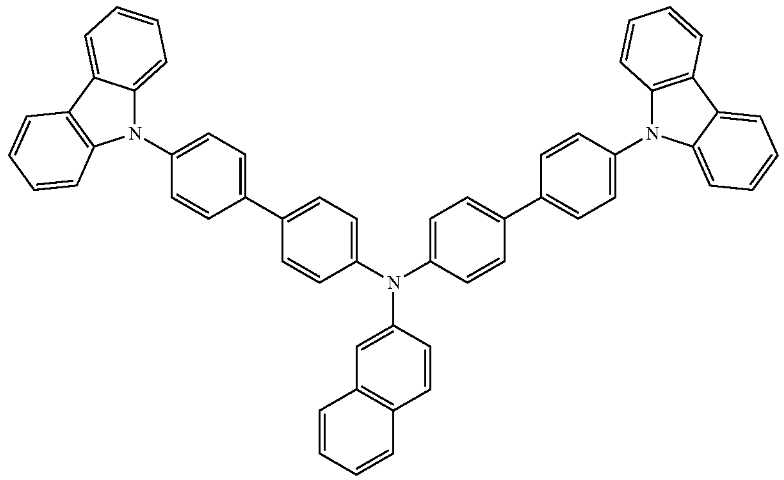
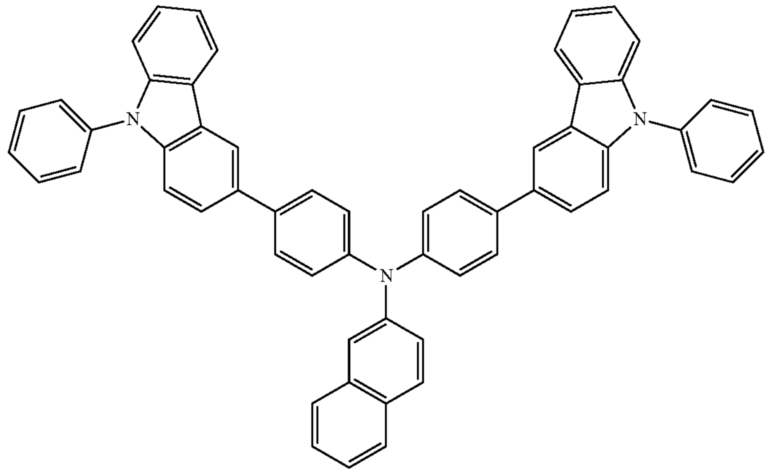
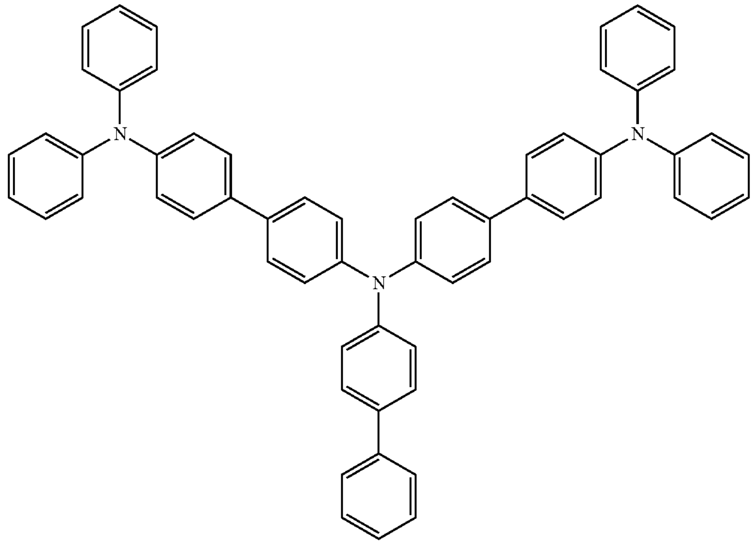

-continued
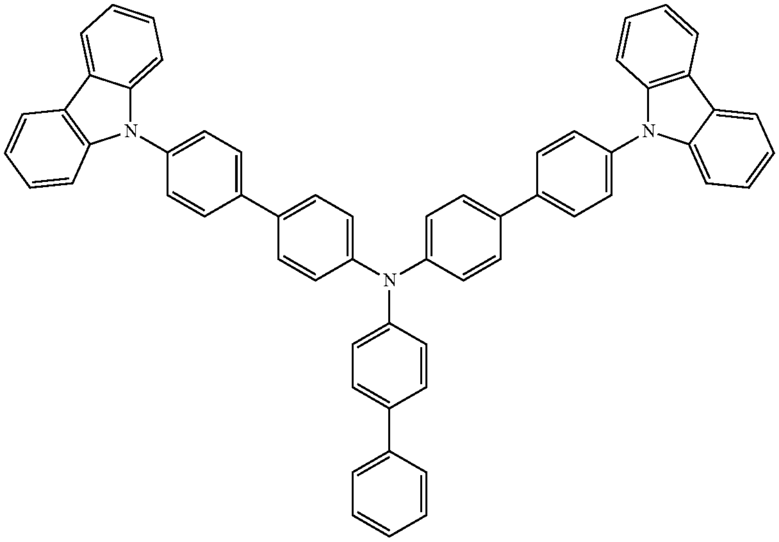
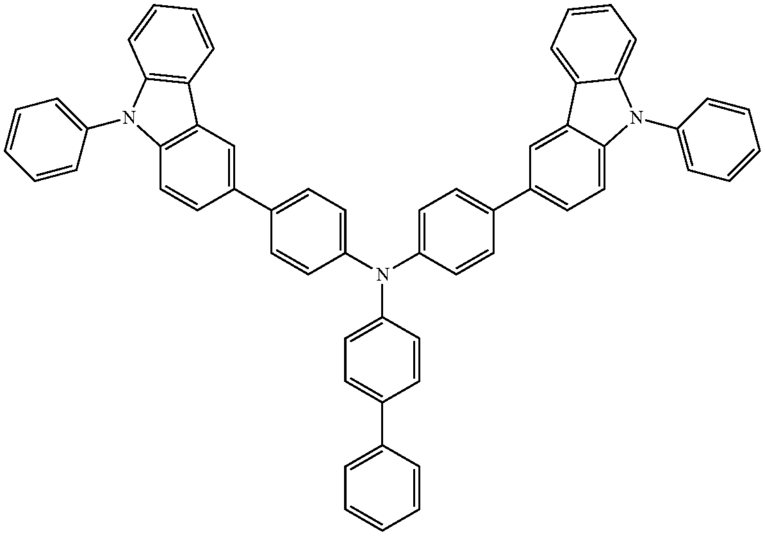
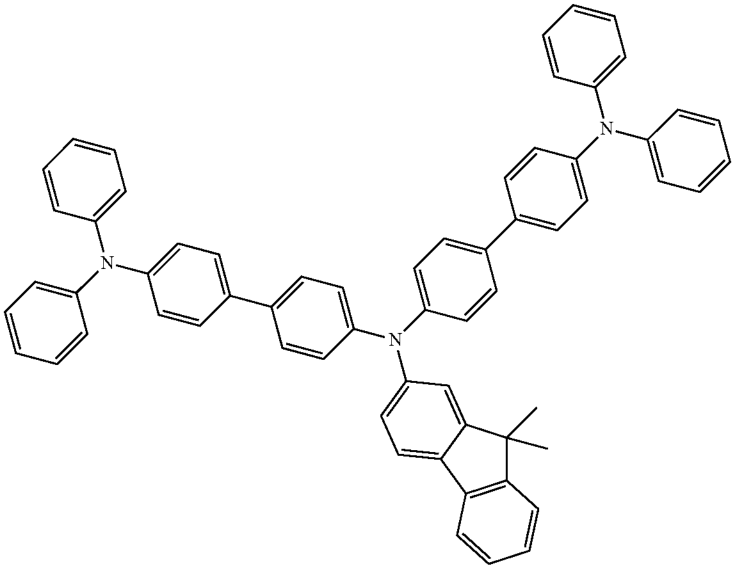

-continued
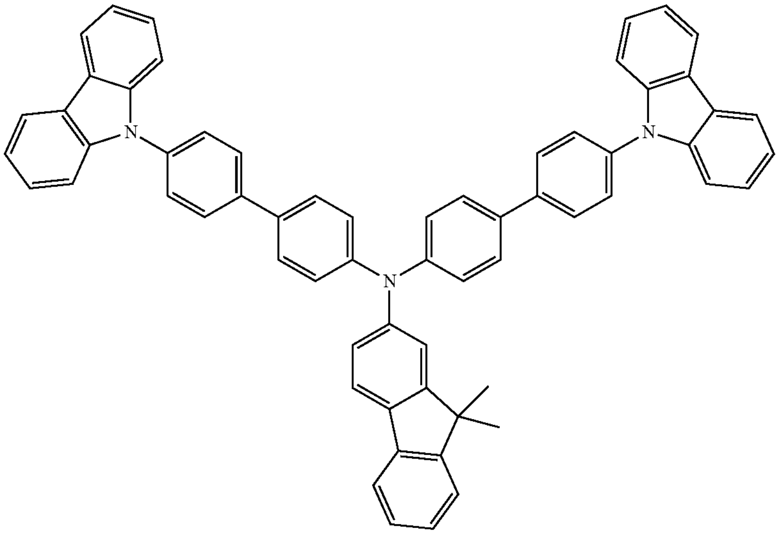
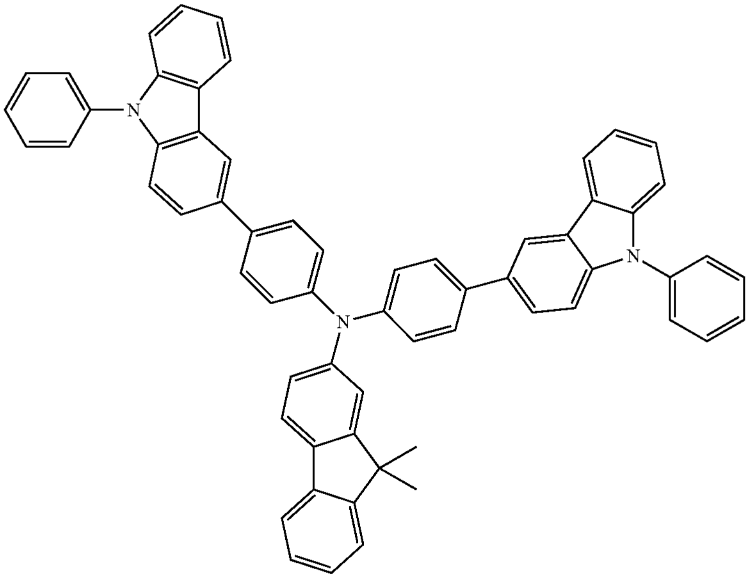
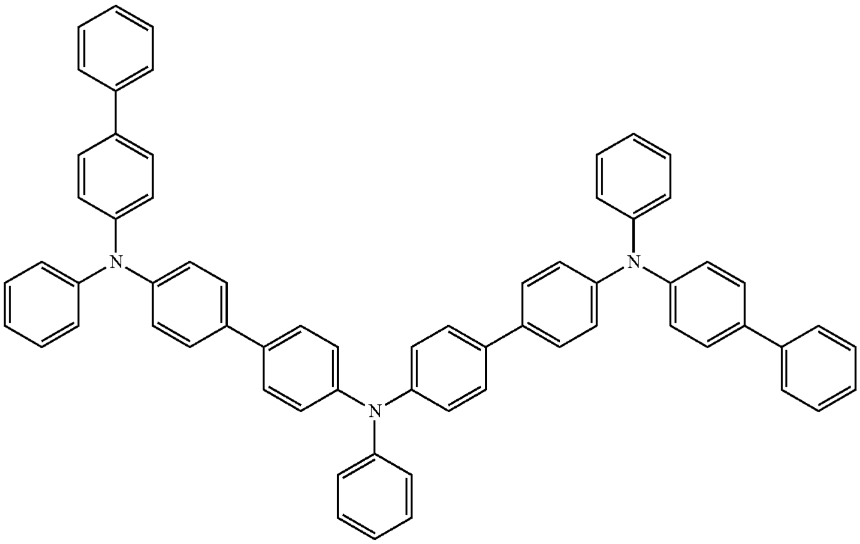

-continued
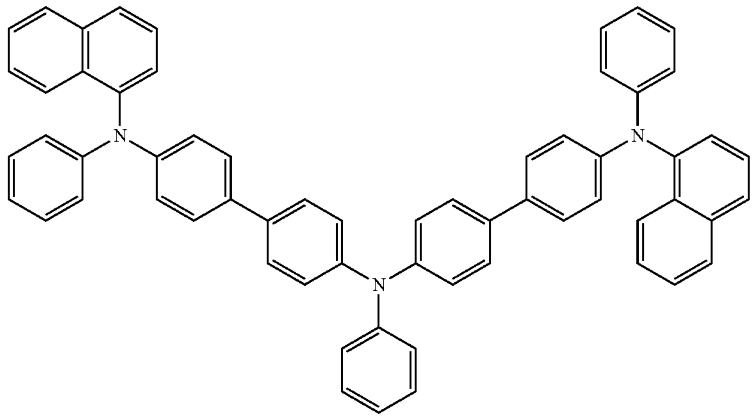
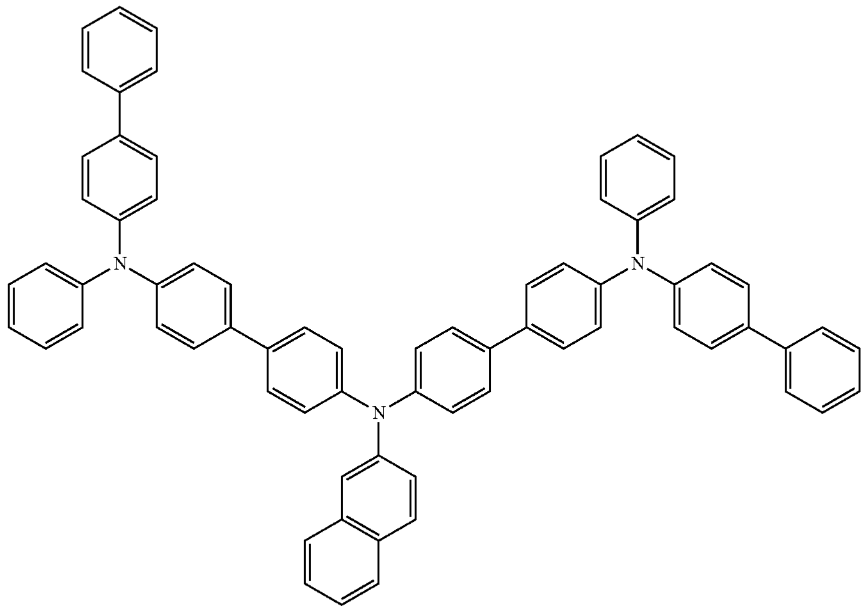
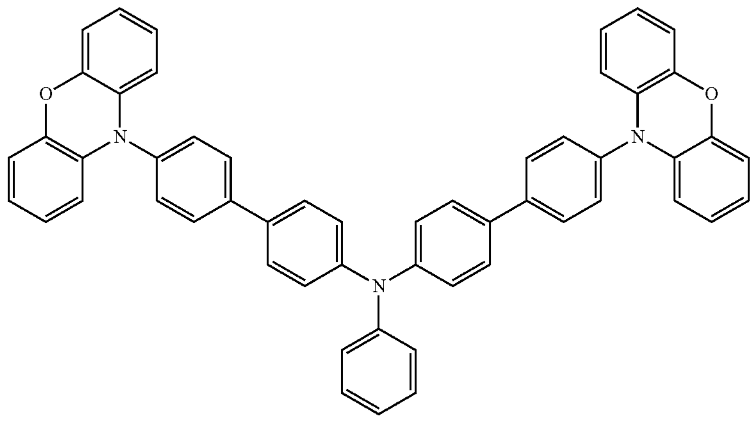

-continued
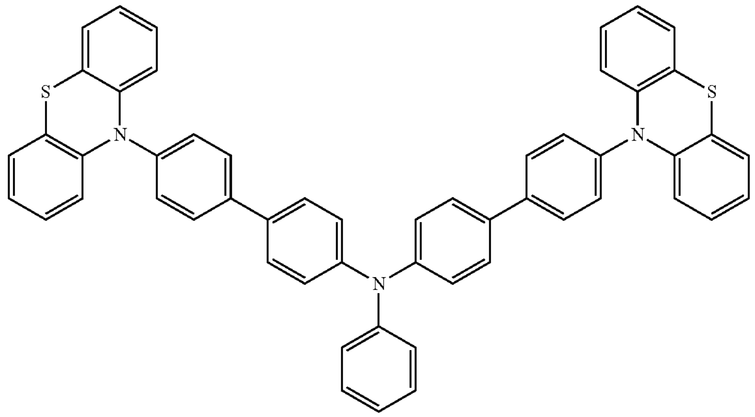
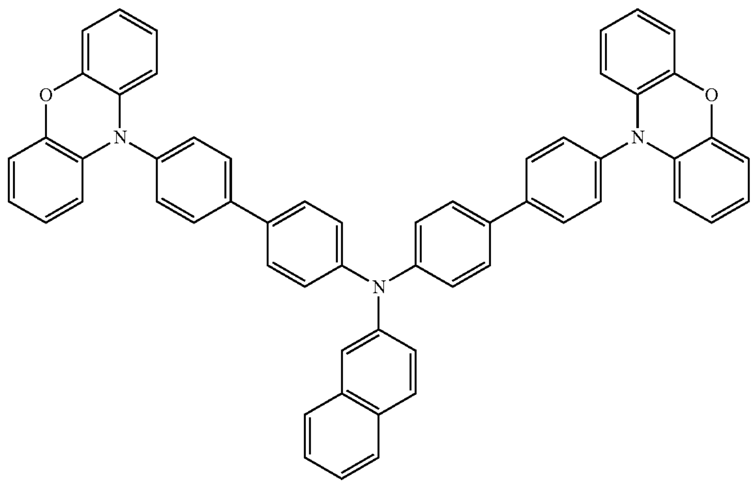
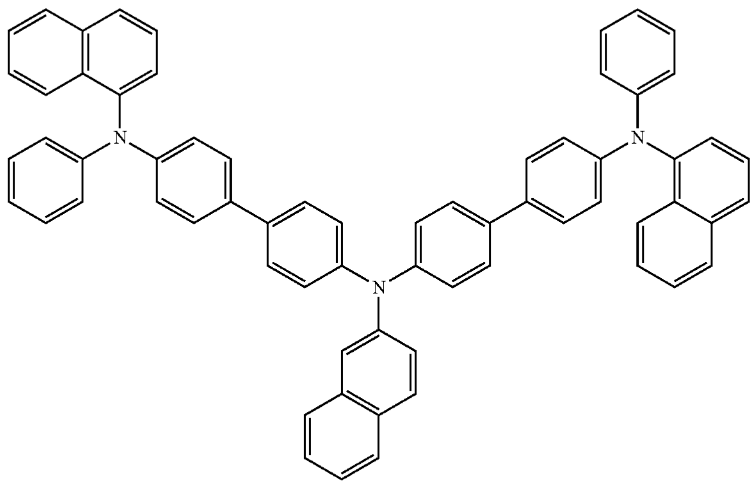

-continued
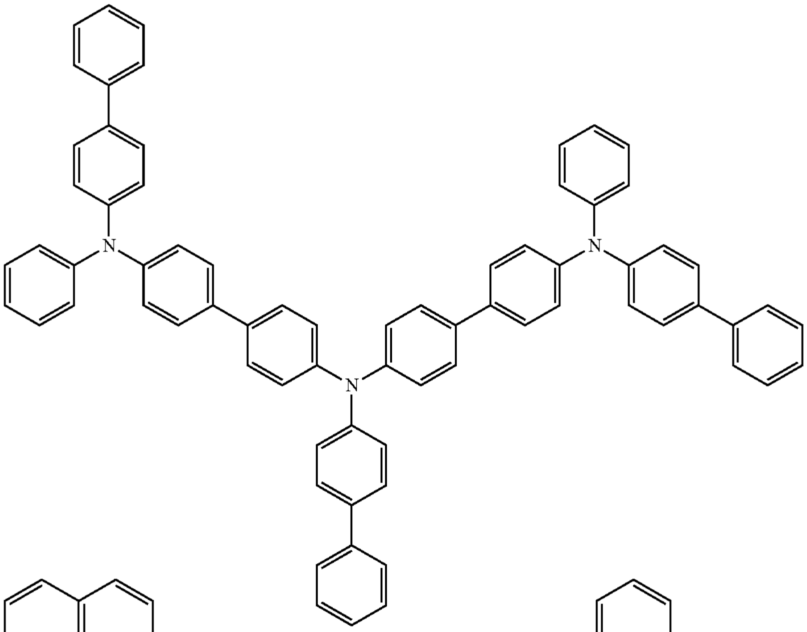
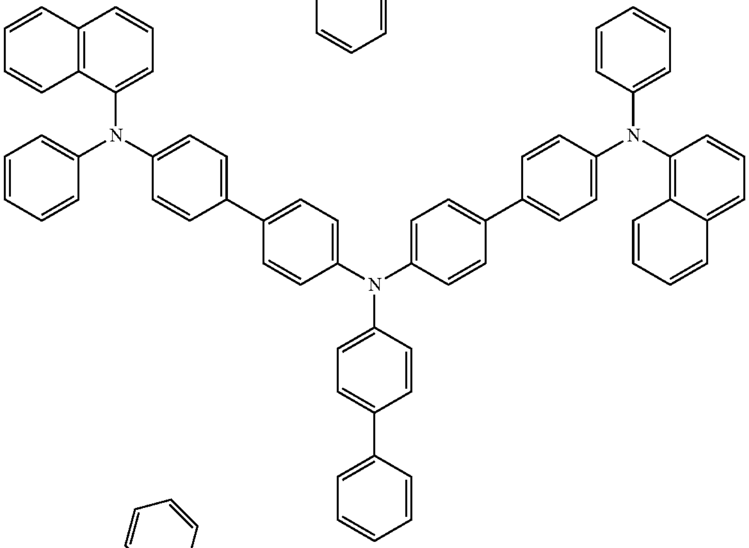
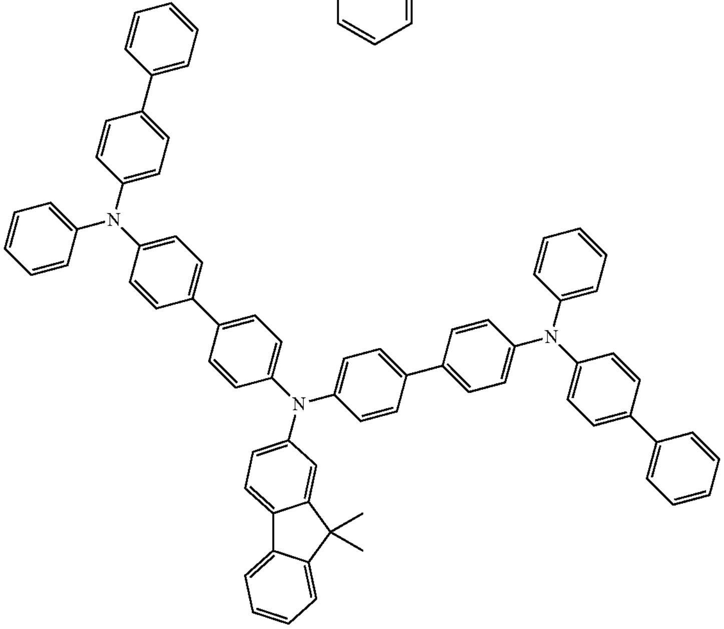

-continued
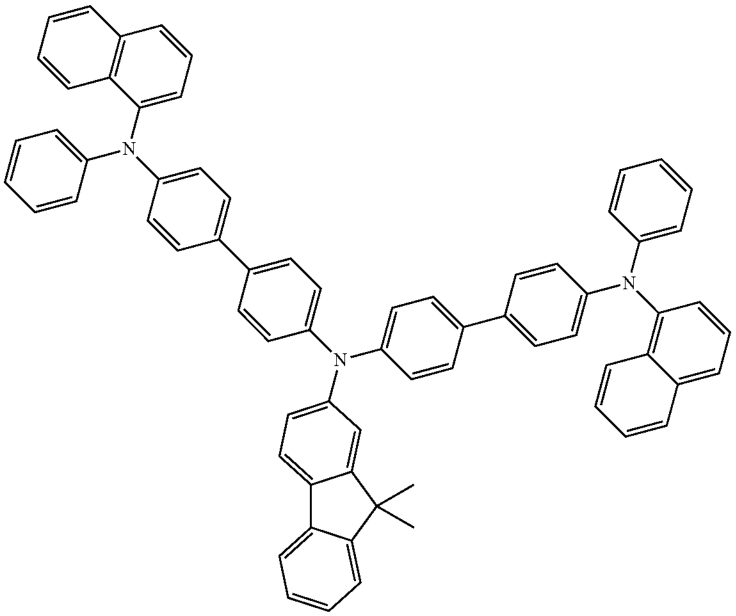
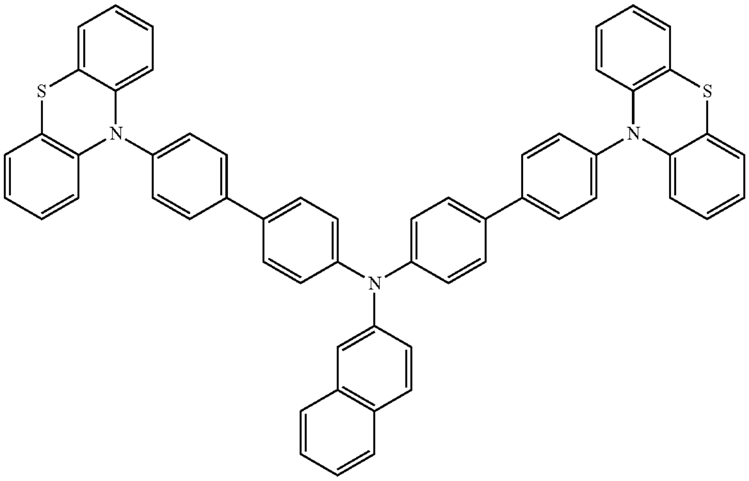
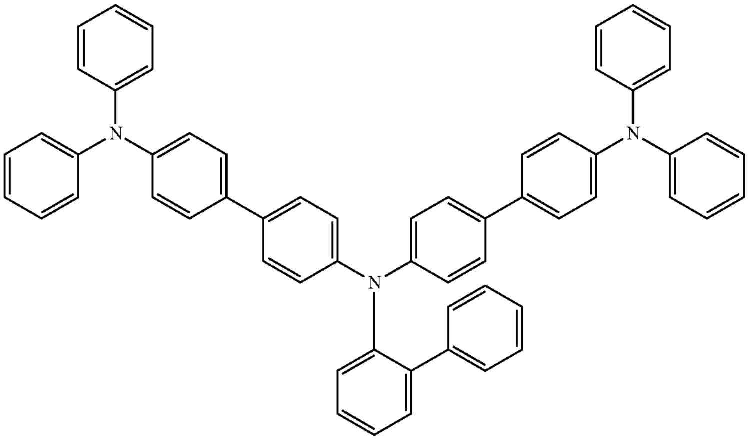

-continued
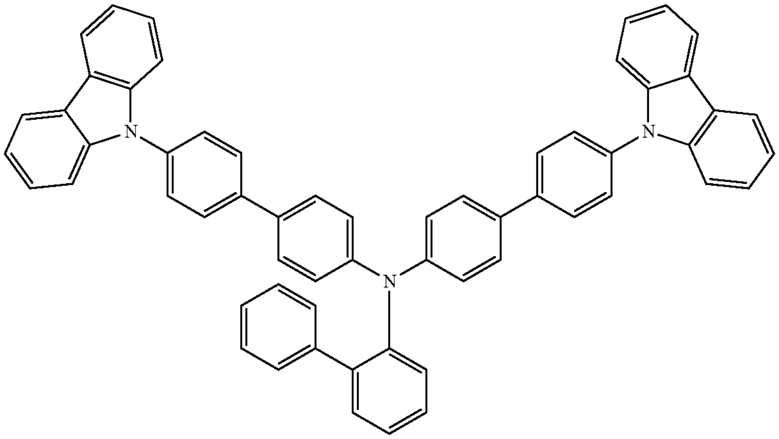
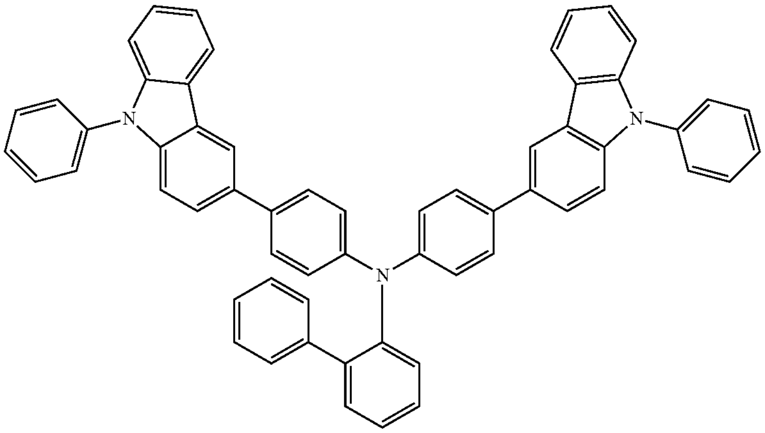
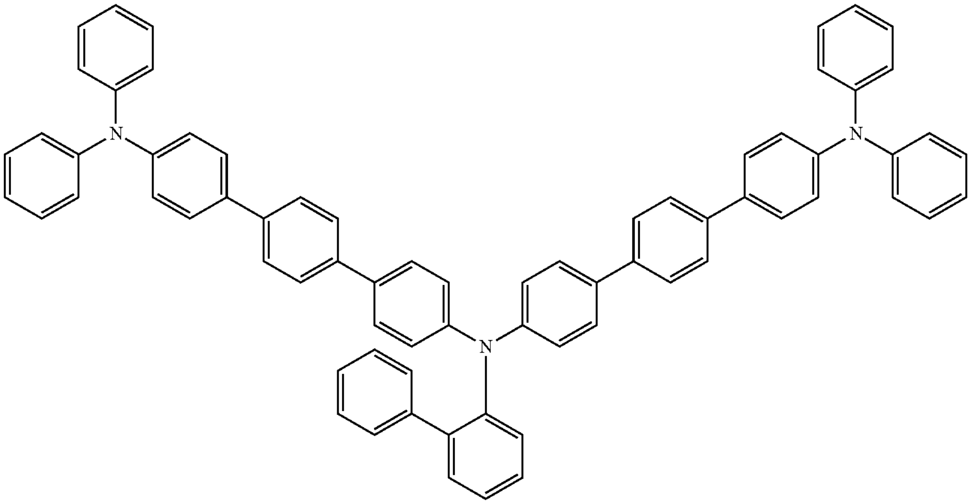

-continued
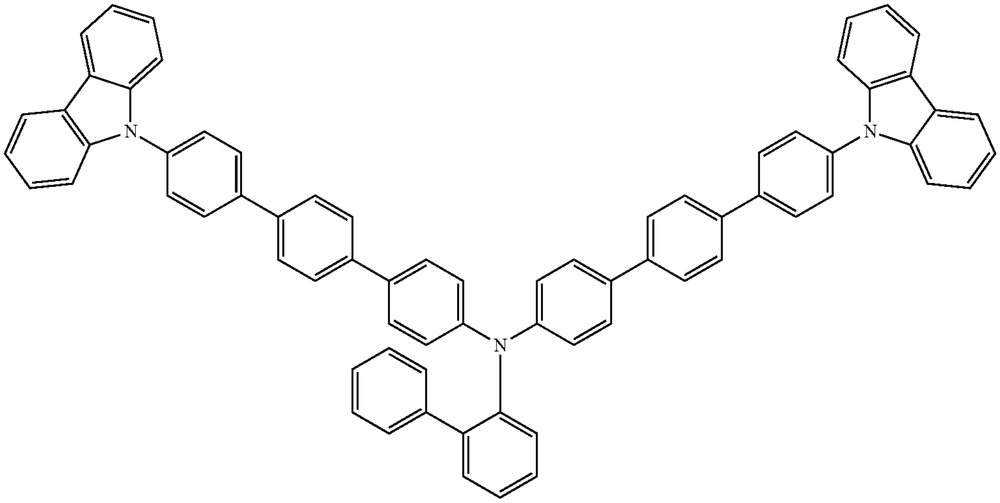
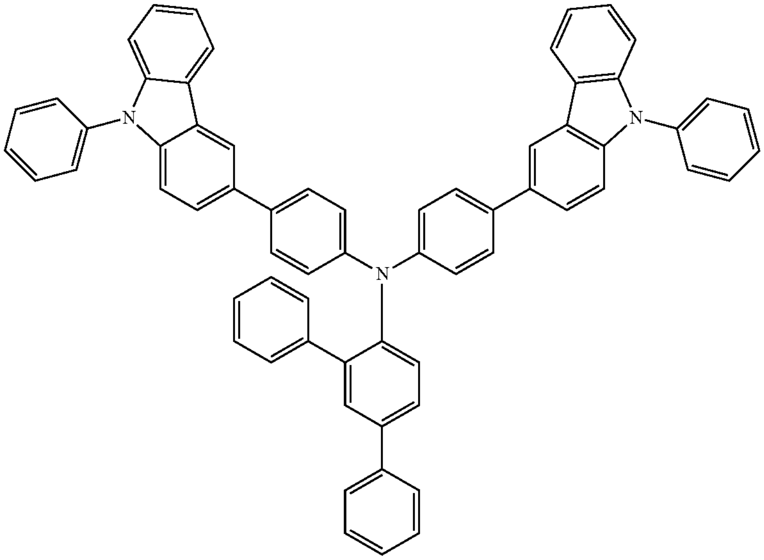
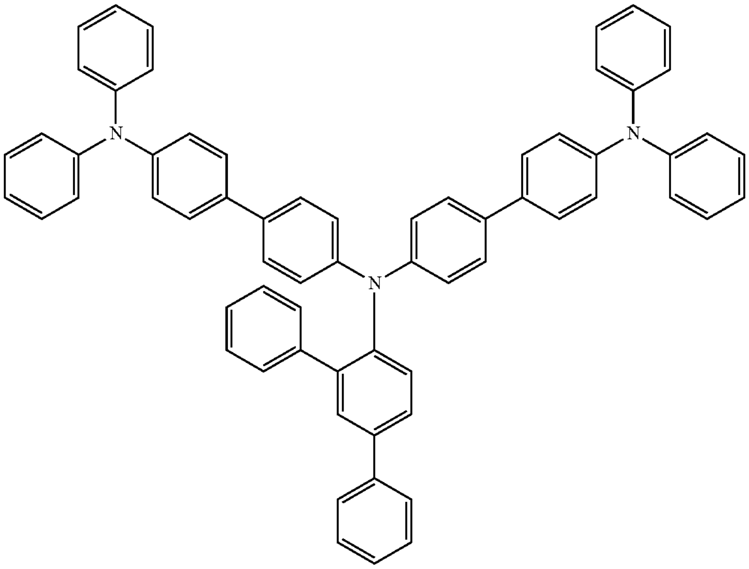

-continued
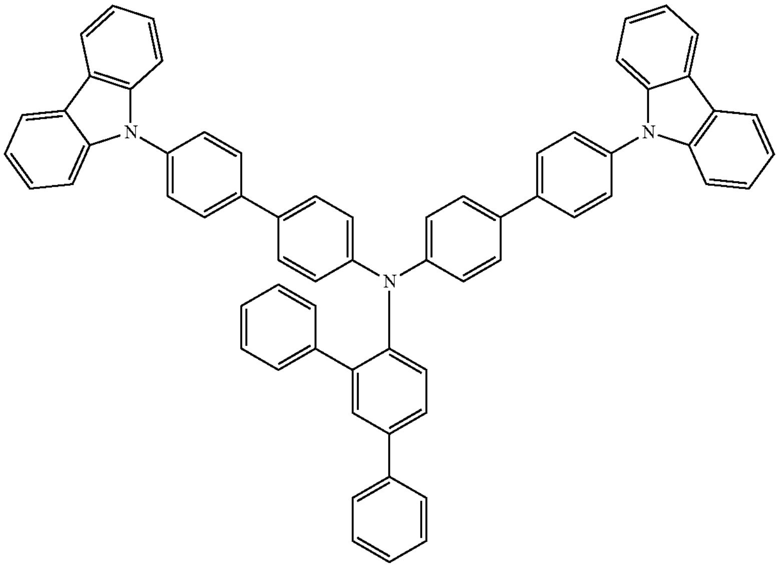
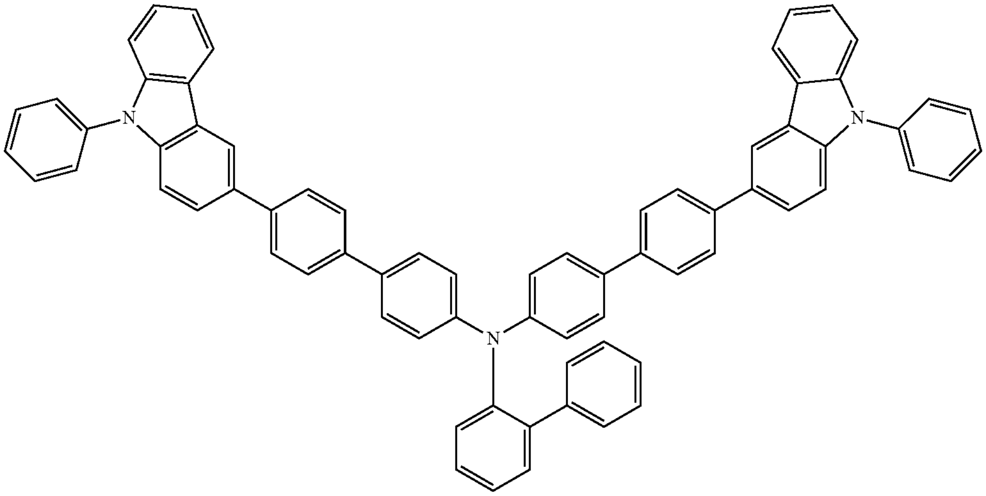
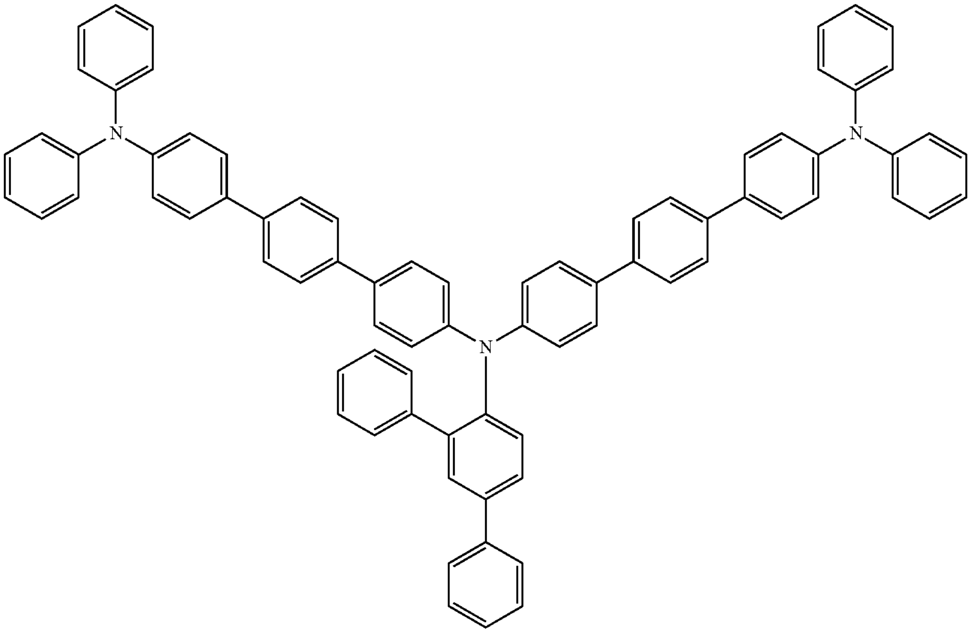

-continued
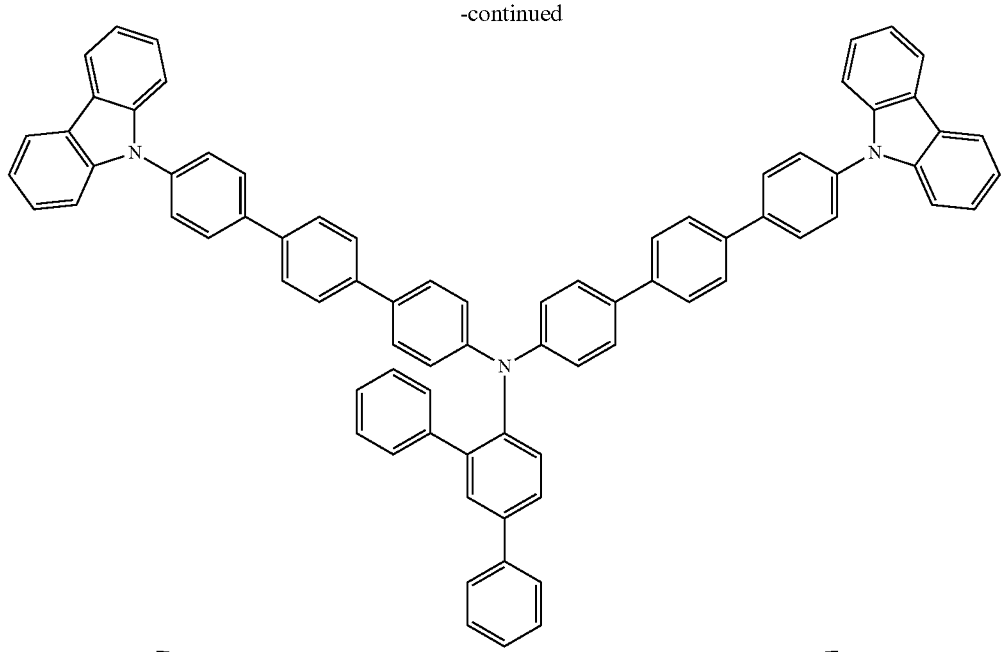
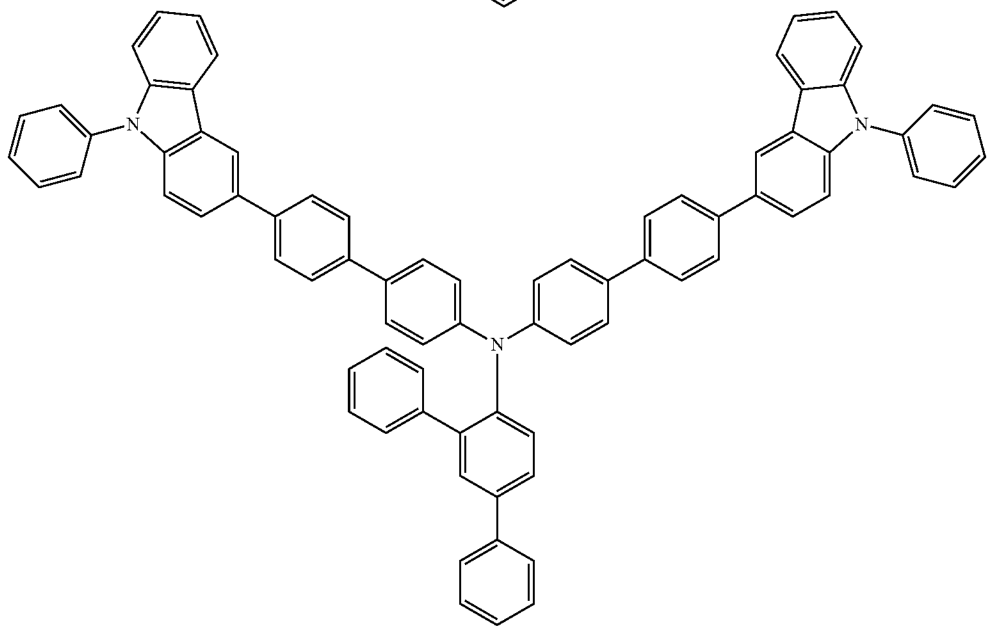
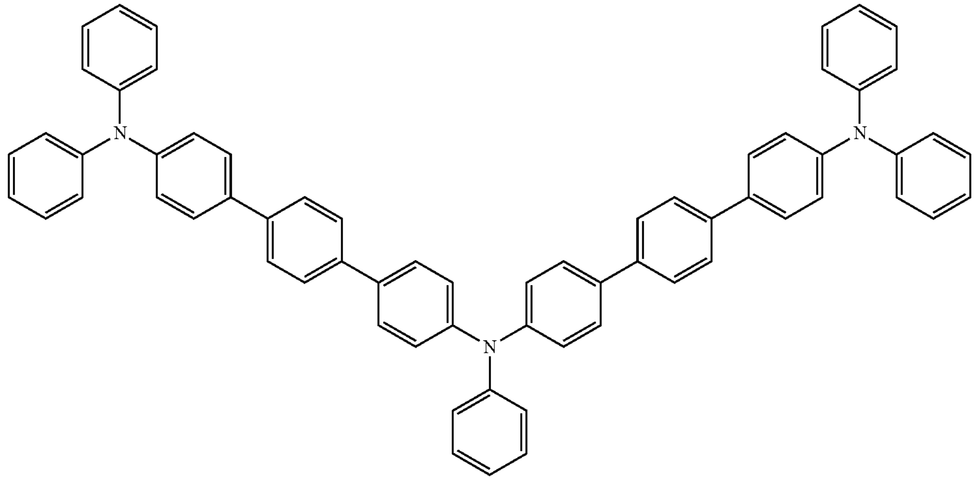

-continued
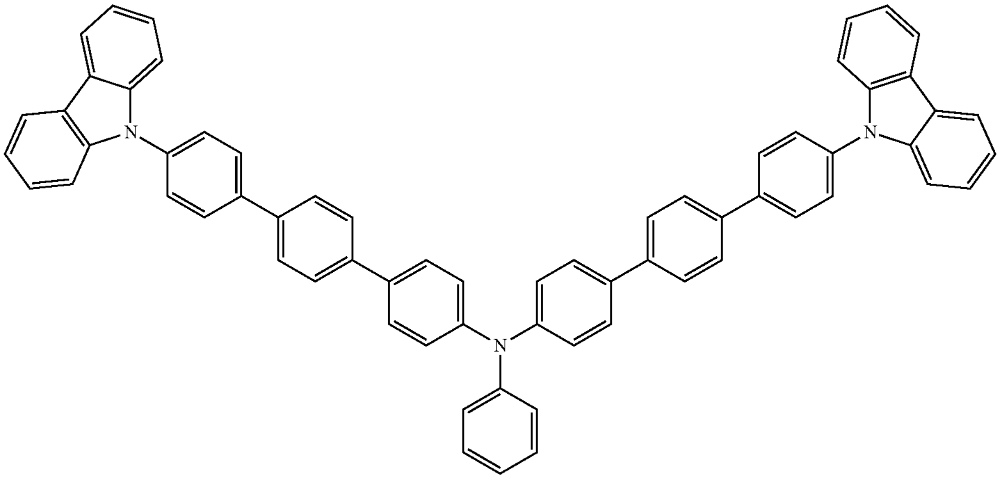
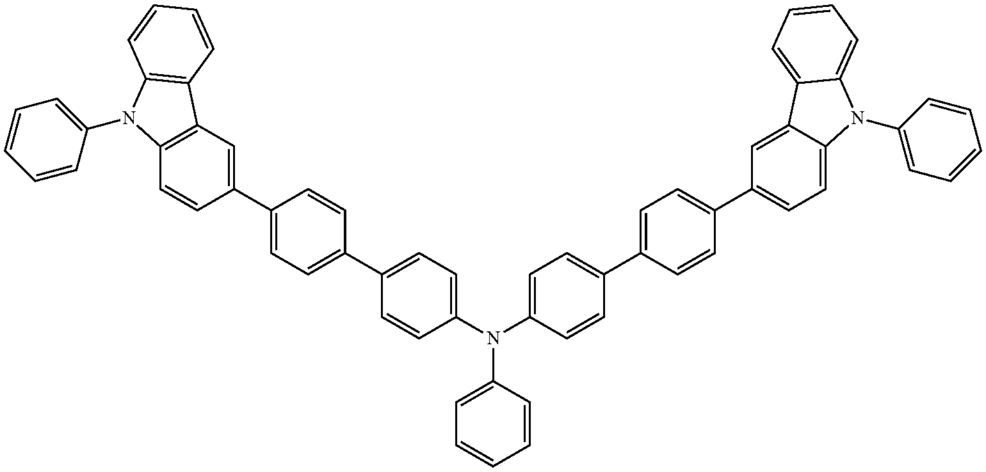
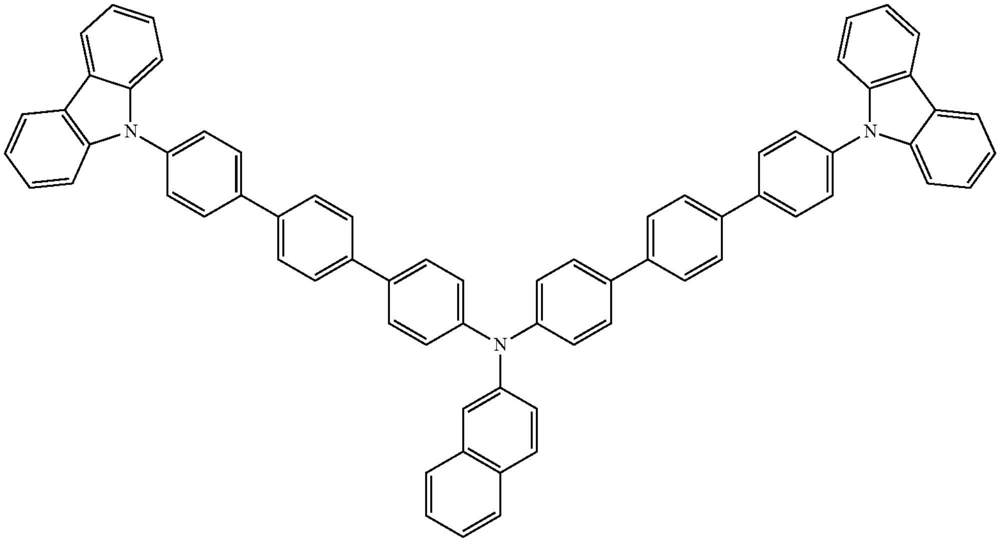

-continued
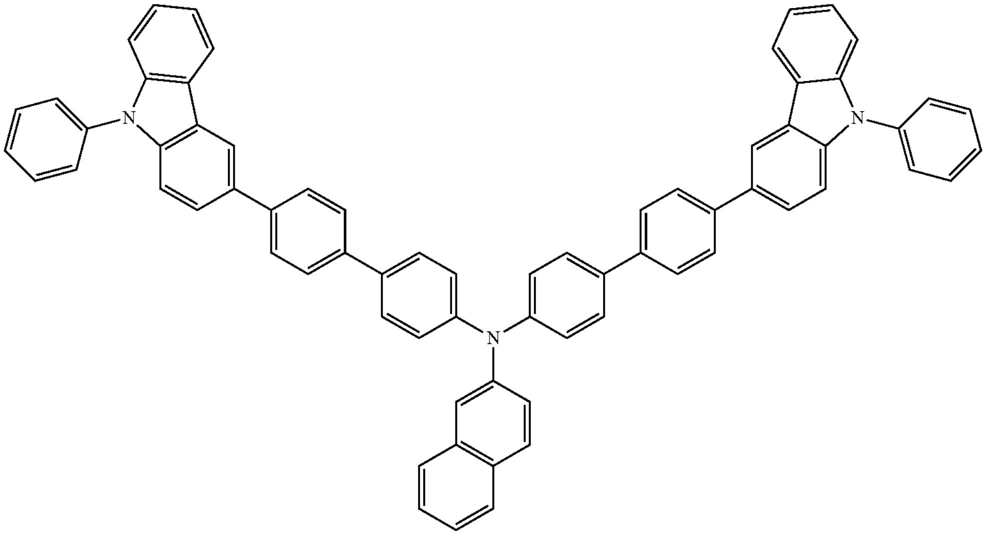
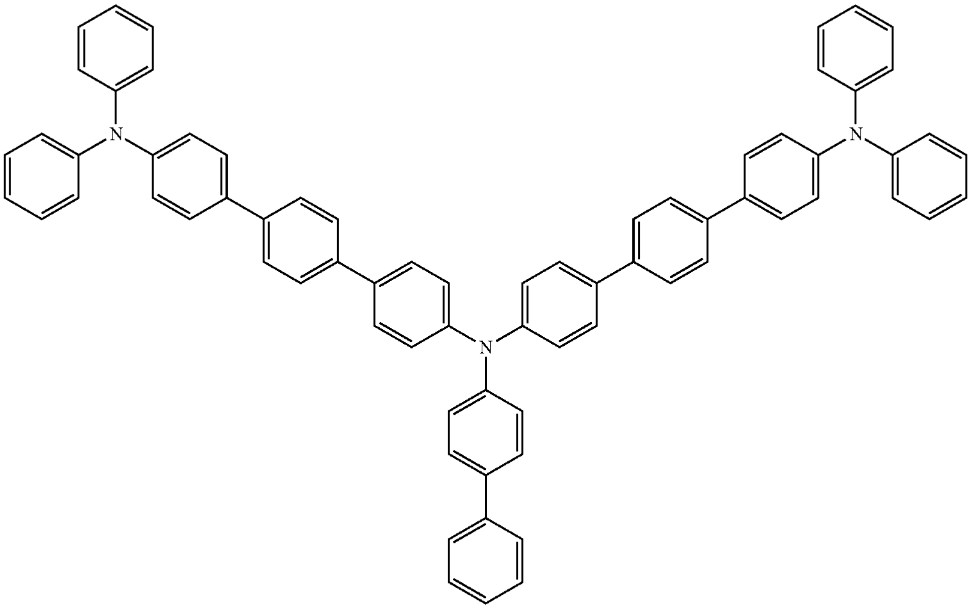
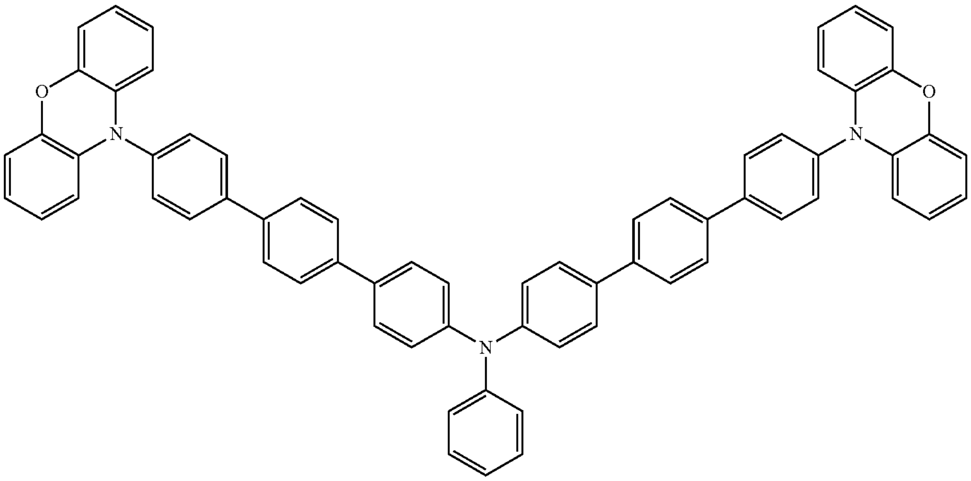

-continued
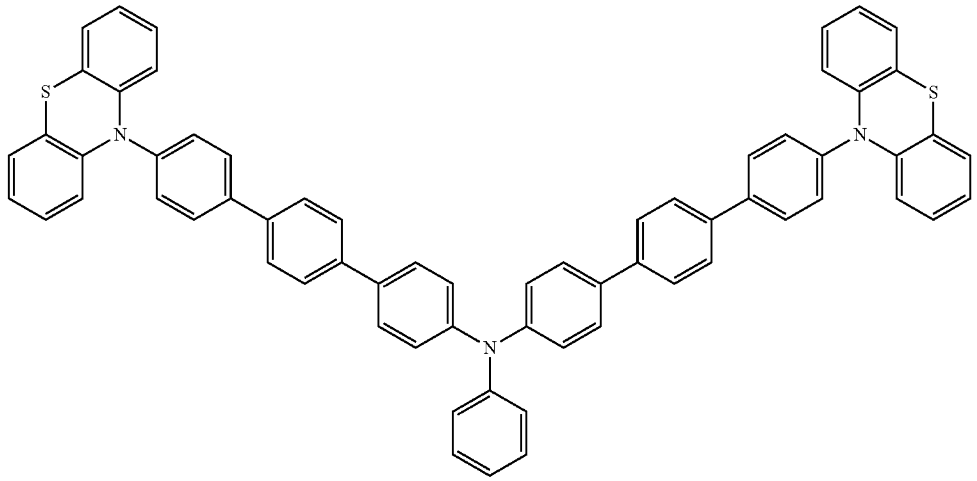
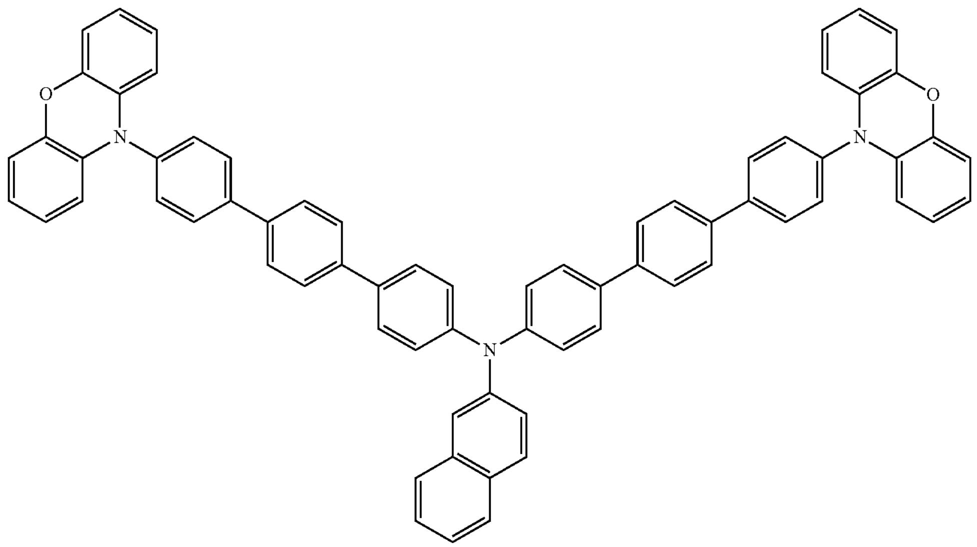
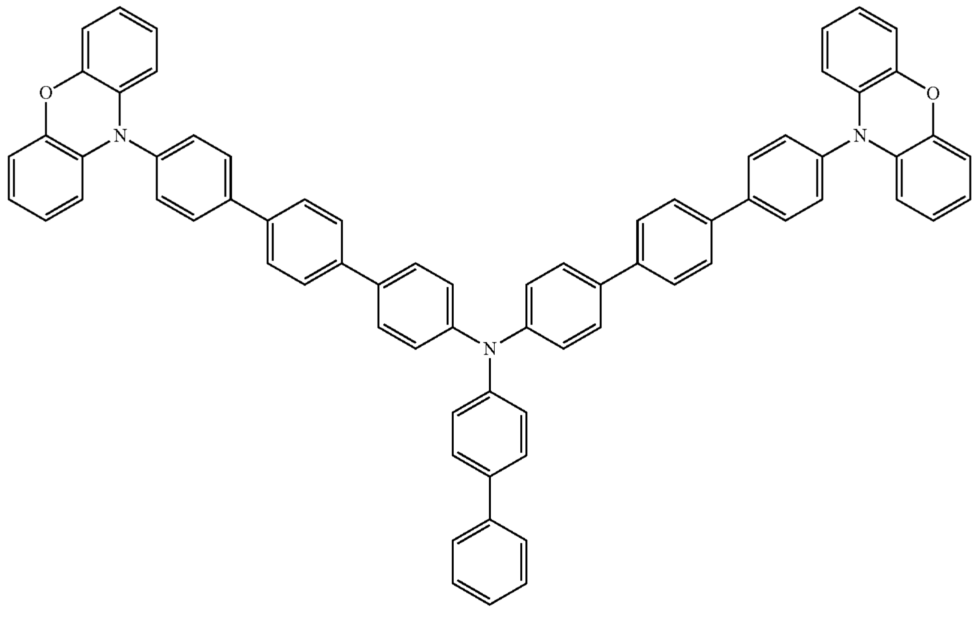

-continued
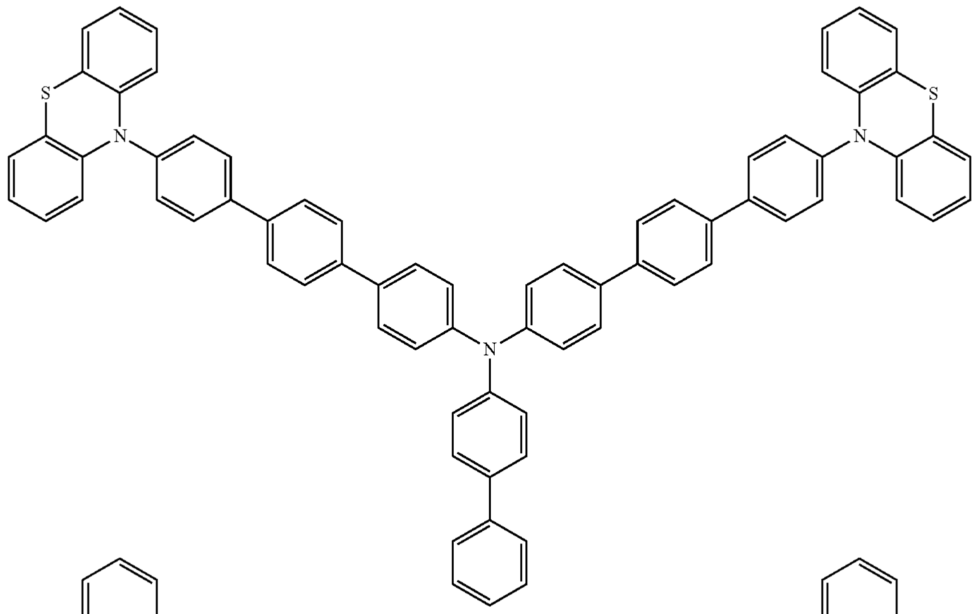
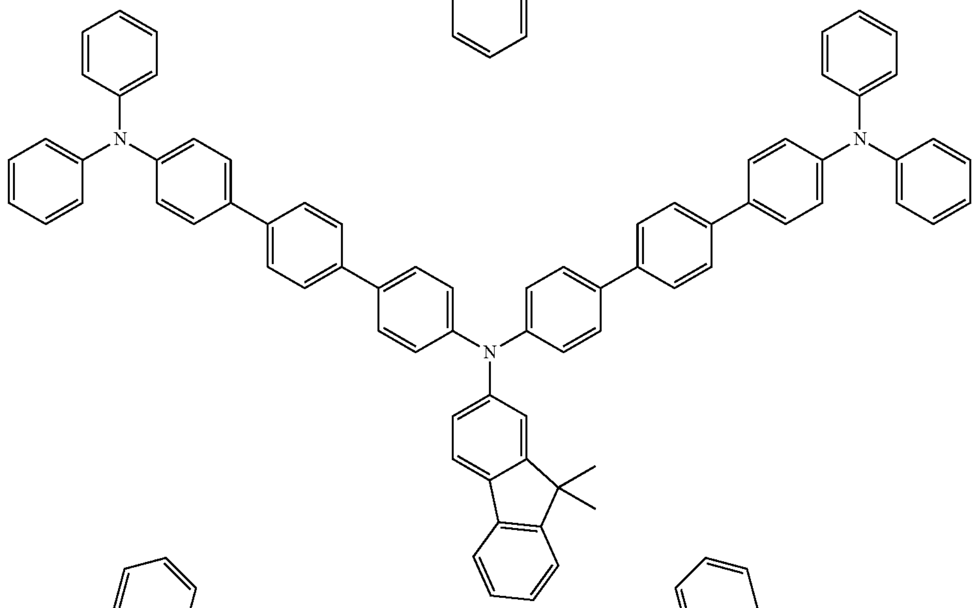
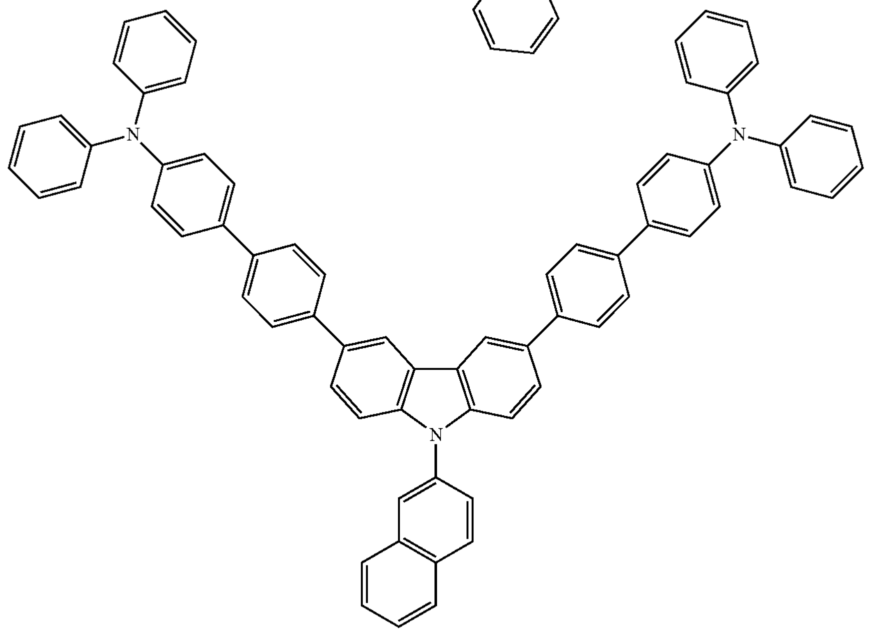

-continued
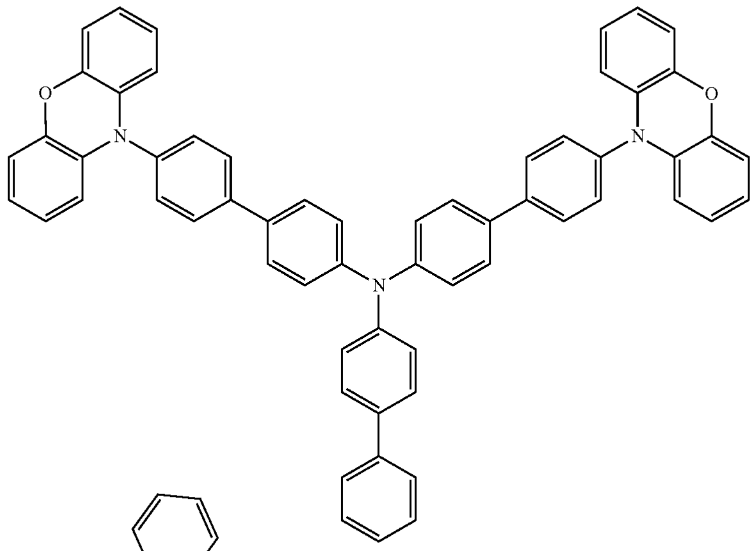
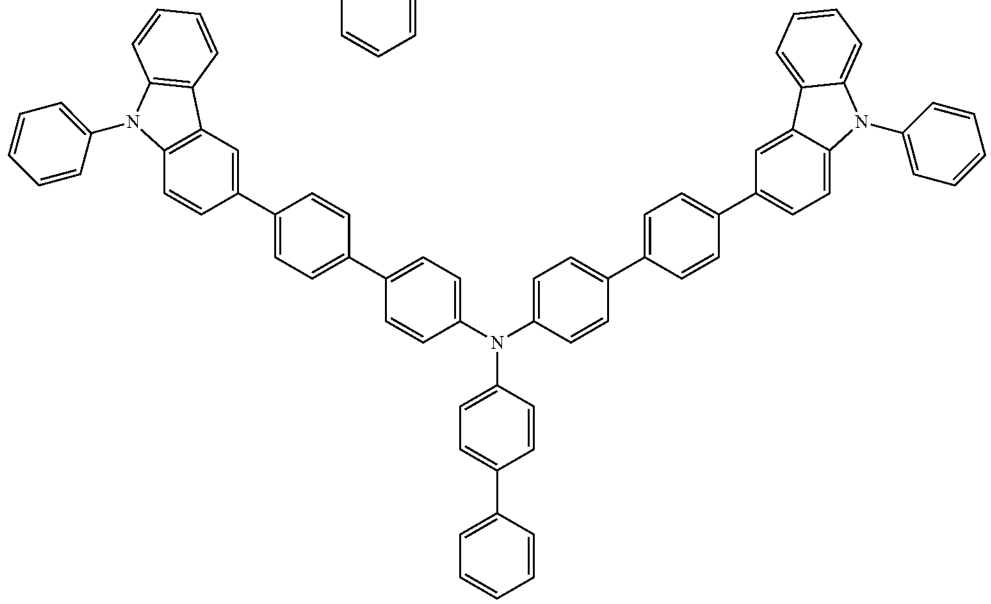
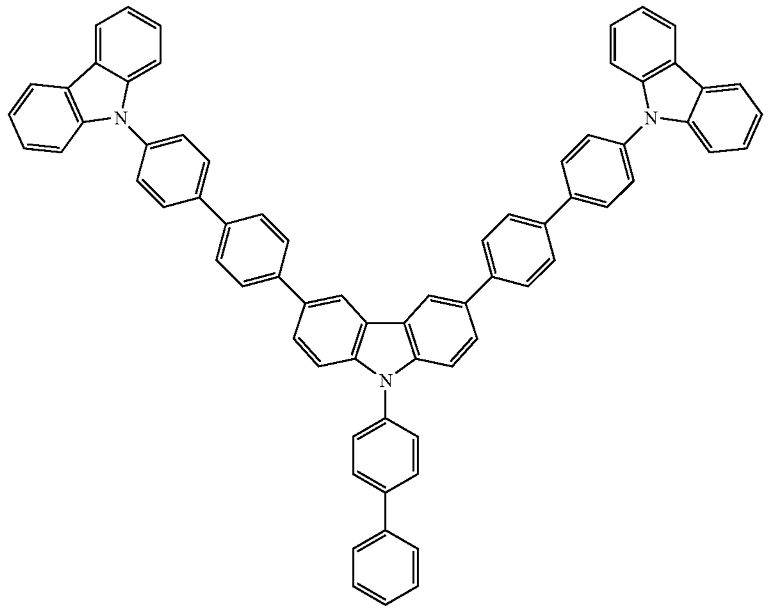

-continued
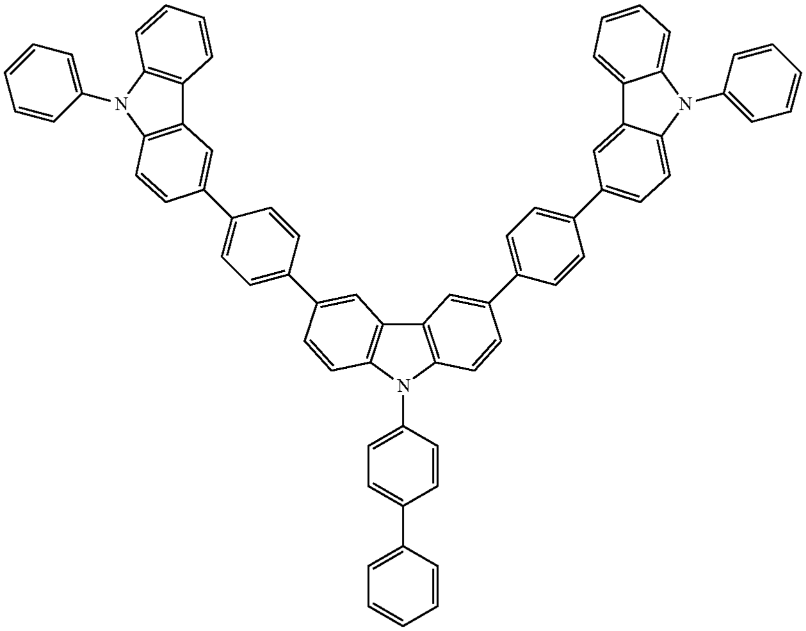
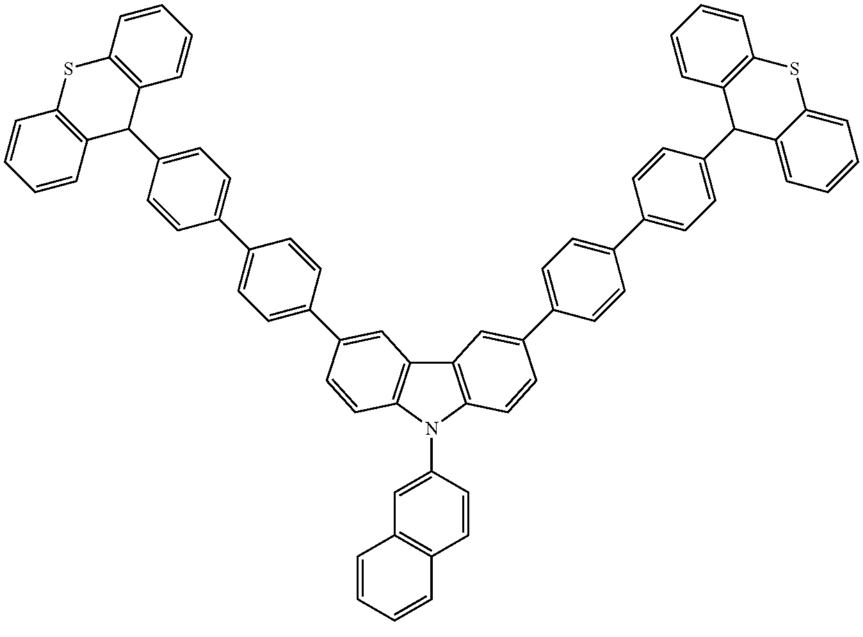

-continued
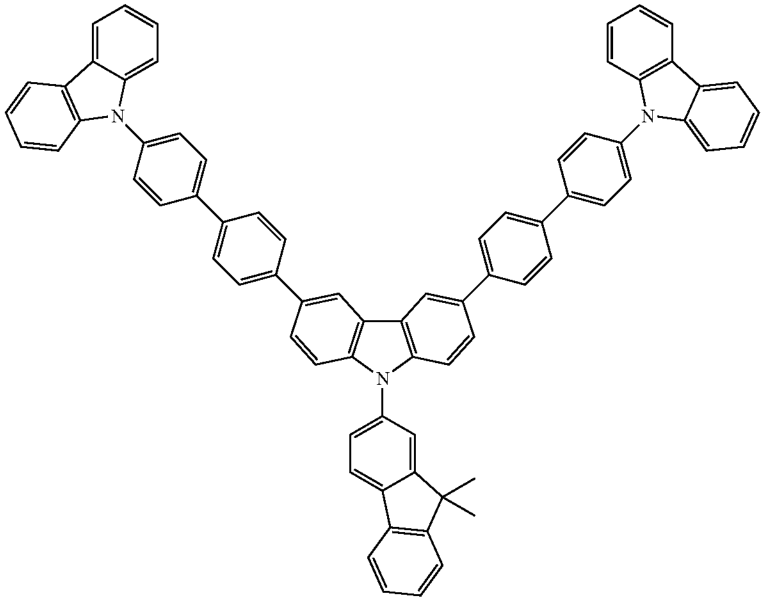
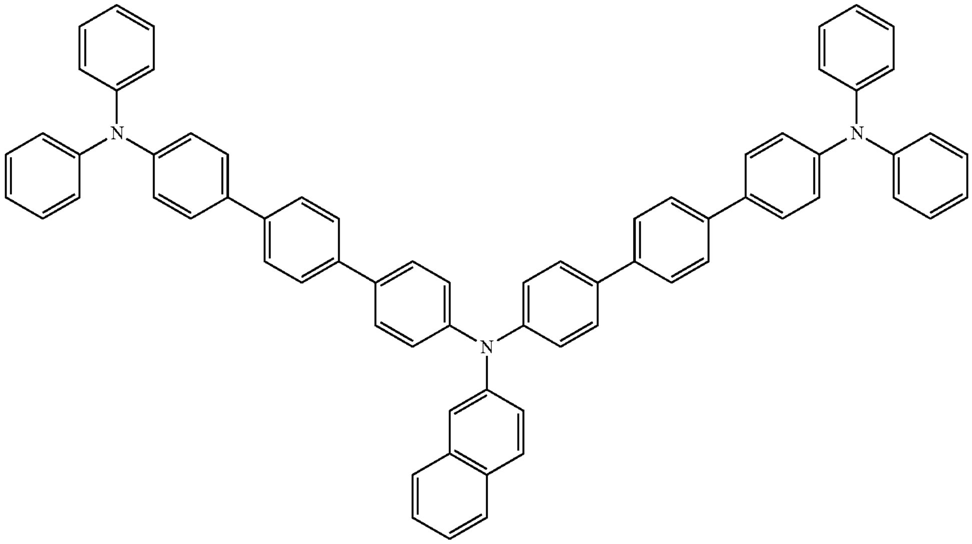

-continued
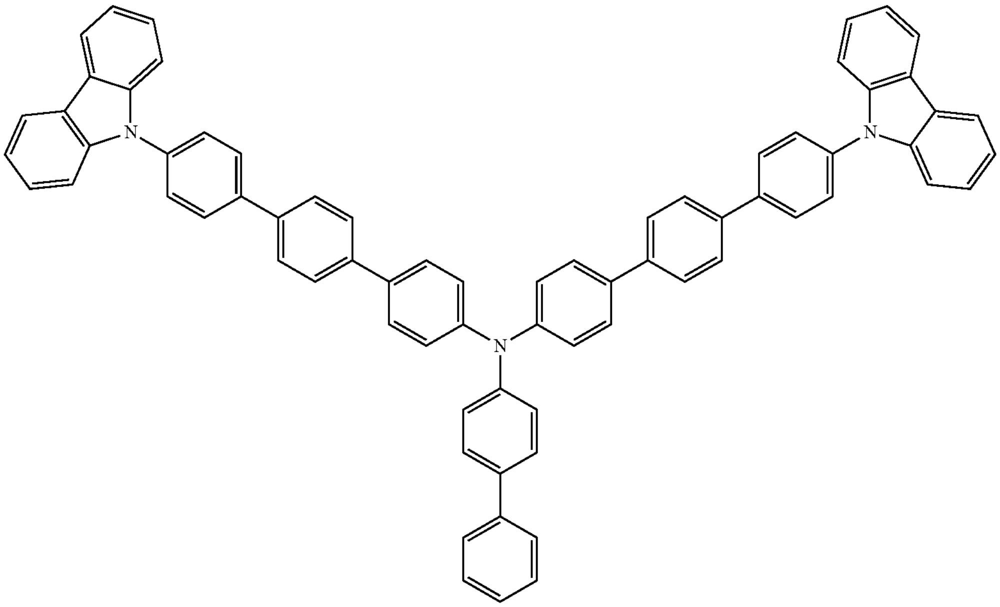
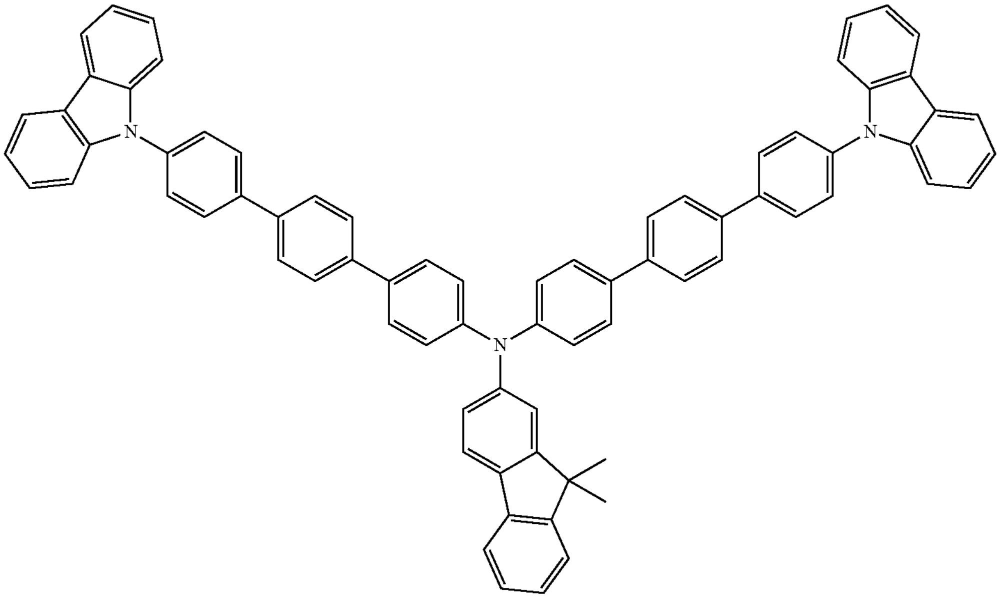

-continued

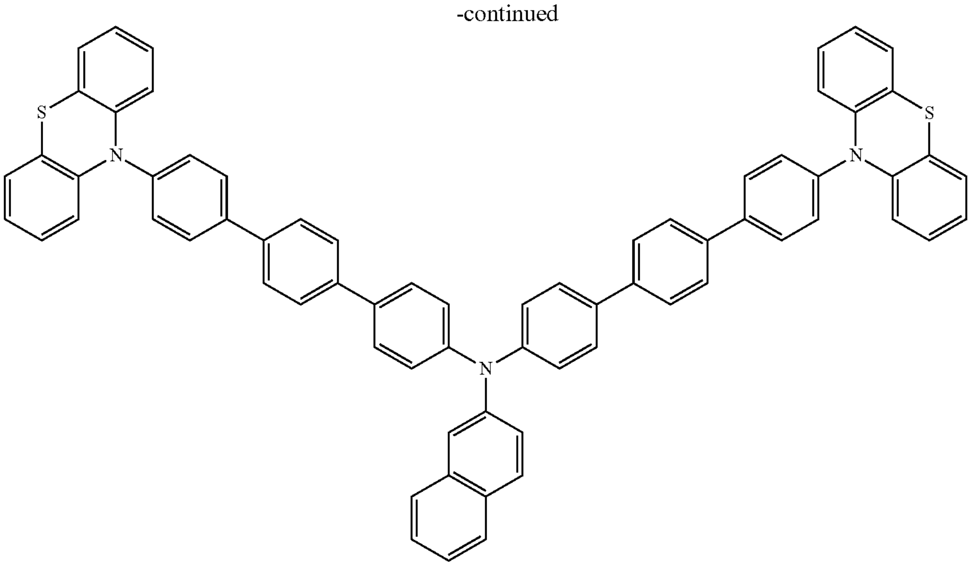

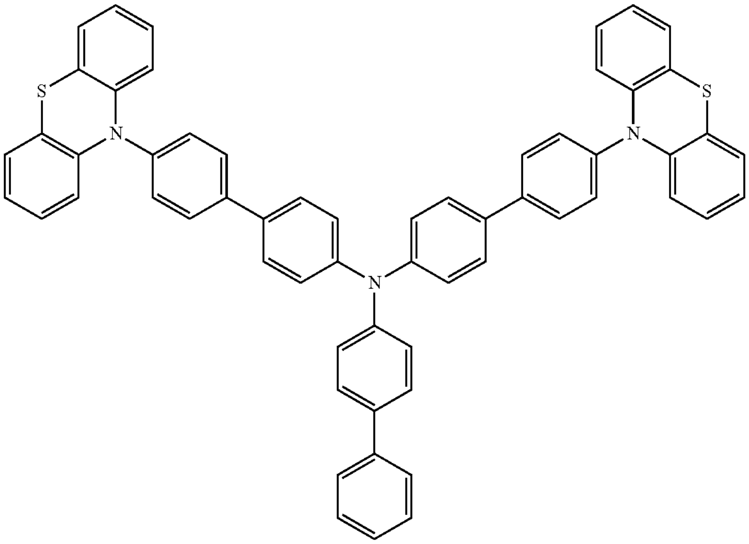

According to one embodiment of the present application, the compound of Chemical Formula 2 may be represented by the following Chemical Formula 11.

[Chemical Formula 11]

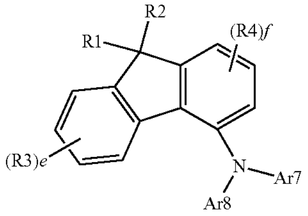

Substituents of Chemical Formula 11 have the same definitions as in Chemical Formula 2.

According to one embodiment of the present application, the compound of Chemical Formula 2 may be represented by the following Chemical Formula 12.

[Chemical Formula 12]

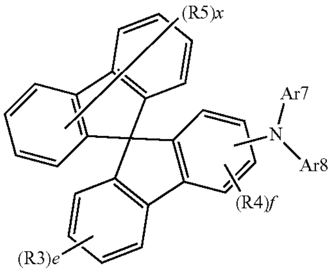

In Chemical Formula 12, R3, R4, Ar7, Ar8, e and f have the same definitions as in Chemical Formula 2, R5 is hydrogen; deuterium; a nitrile group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted silyl group; a substituted or unsubstituted amine group; a substituted or unsubstituted aryl group; or a substituted or unsubstituted heteroaryl group, x is an integer of 0 to 8, and when x is 2 or greater, R5s are the same as or different from each other.

According to one embodiment of the present application, the compound of Chemical Formula 2 may be represented by the following Chemical Formula 13.

[Chemical Formula 13]

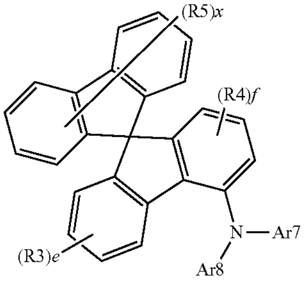

Substituents of Chemical Formula 13 have the same definitions as in Chemical Formula 12.

According to one embodiment of the present application, R1 and R2 are the same as or different from each other, and each independently an alkyl group or an aryl group, or bond to each other to form a fluorene group.

According to one embodiment of the present application, R1 and R2 are the same as or different from each other, and each independently a methyl group or a phenyl group, or bond to each other to form a fluorene group.

According to one embodiment of the present application, R1 and R2 are a methyl group.

According to one embodiment of the present application, R1 and R2 are a phenyl group.

According to one embodiment of the present application, R1 is a methyl group and R2 is a phenyl group.

According to one embodiment of the present application, R1 and R2 bond to each other to form a fluorene group.

According to one embodiment of the present application, Ar7 and Ar8 are the same as or different from each other, and each independently a substituted or unsubstituted aryl group.

According to one embodiment of the present application, Ar7 and Ar8 are the same as or different from each other, and each independently an aryl group unsubstituted or substituted with an alkyl group.

According to one embodiment of the present application, Ar7 and Ar8 are the same as or different from each other, and each independently a phenyl group, a biphenylyl group, a fluorenyl group unsubstituted or substituted with an alkyl group, or a triphenylenyl group.

According to one embodiment of the present application, Chemical Formula 2 may be selected from among the following specific examples.

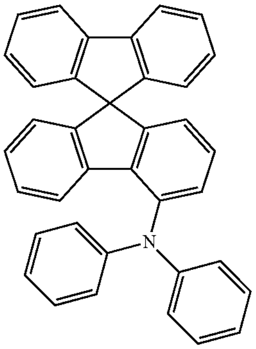

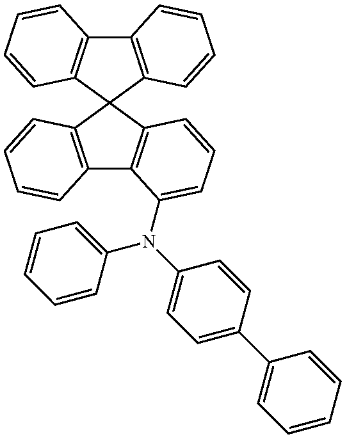

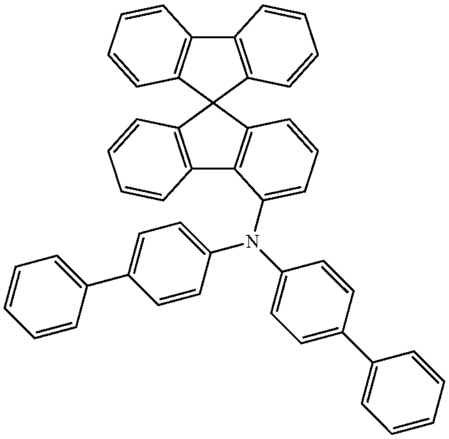

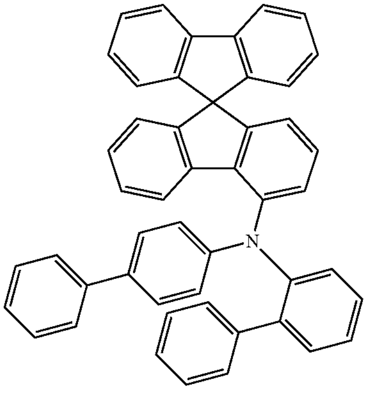

-continued
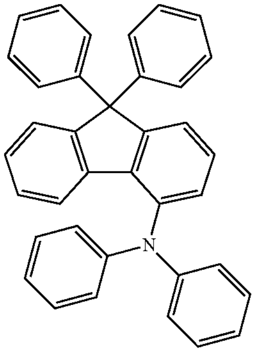
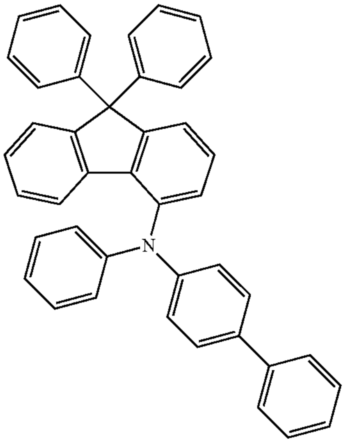
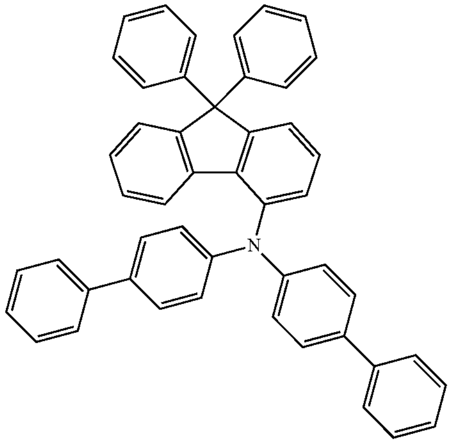
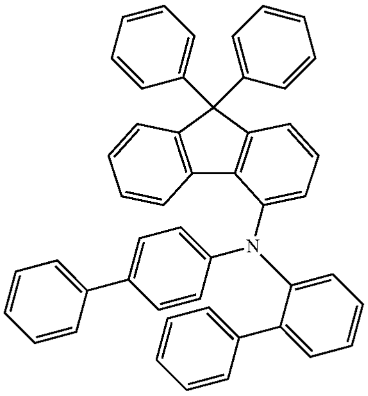
-continued
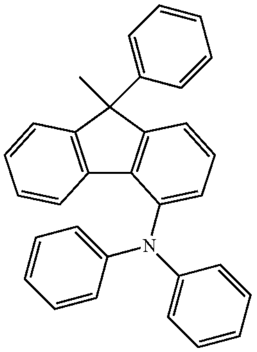
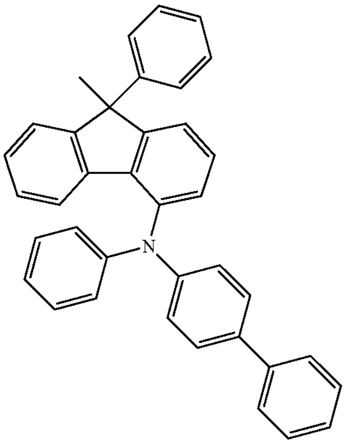
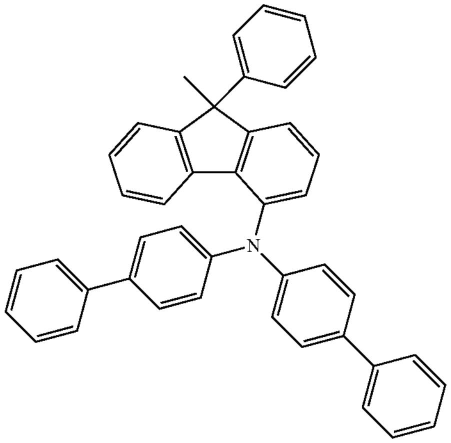
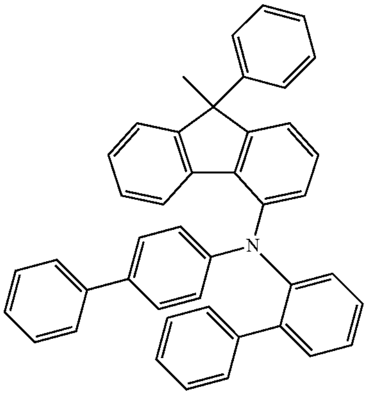

-continued
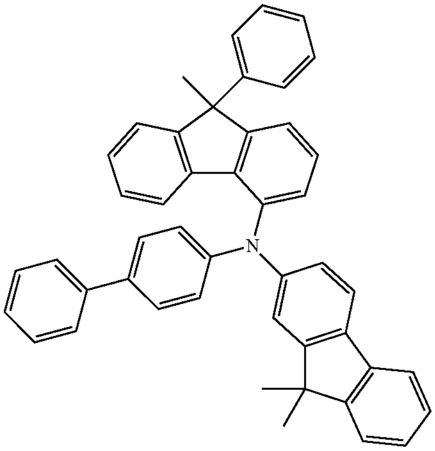
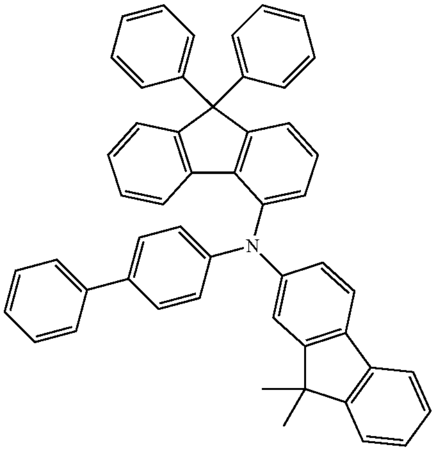
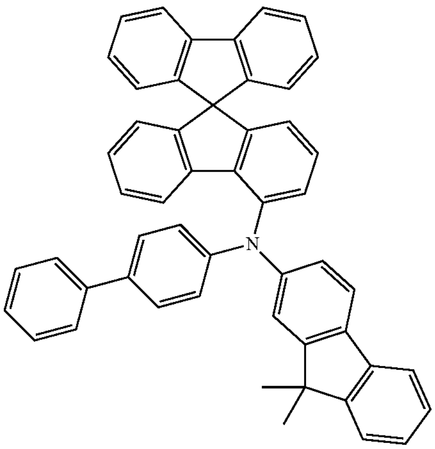
-continued
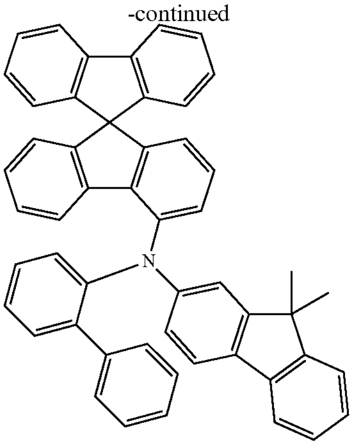
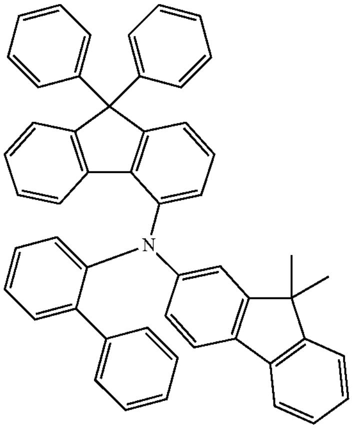
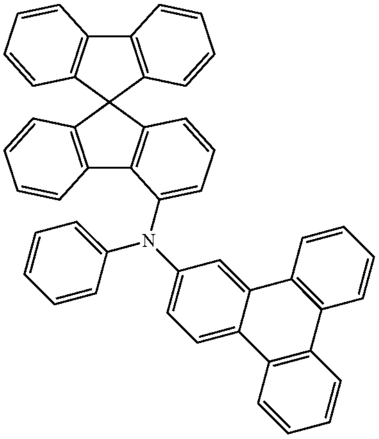
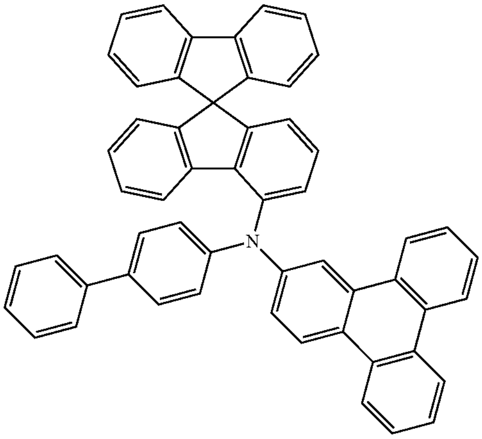

-continued
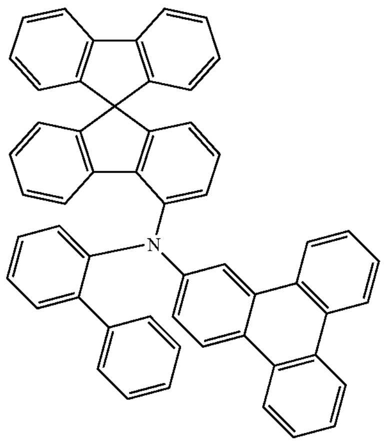
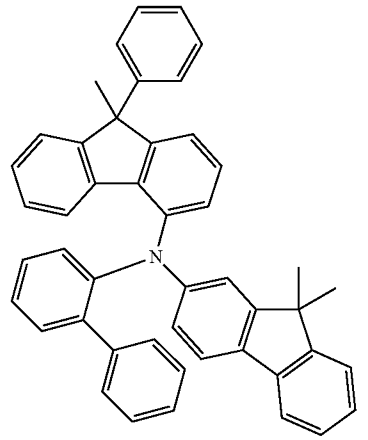
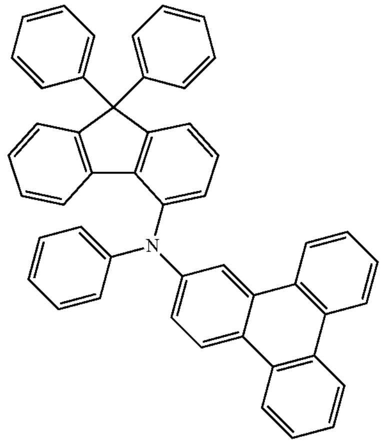
-continued
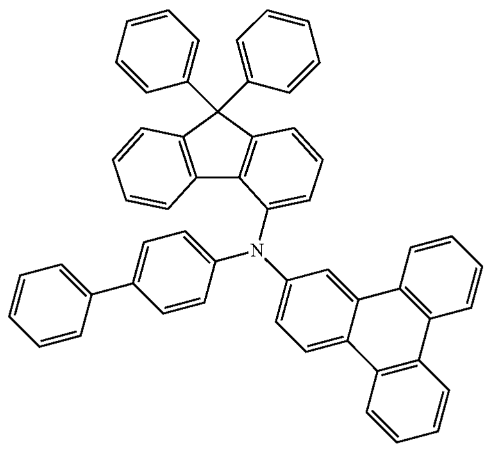
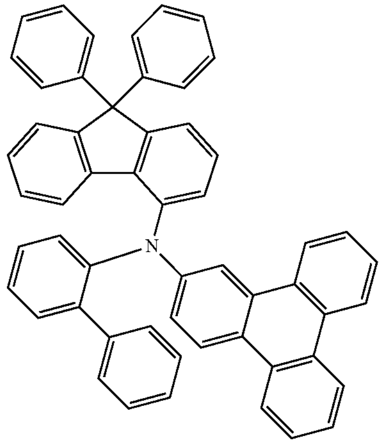
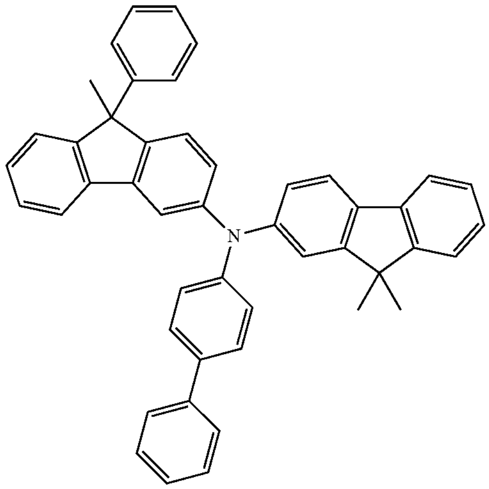

-continued
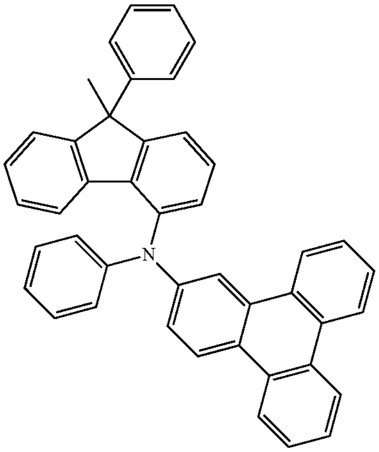
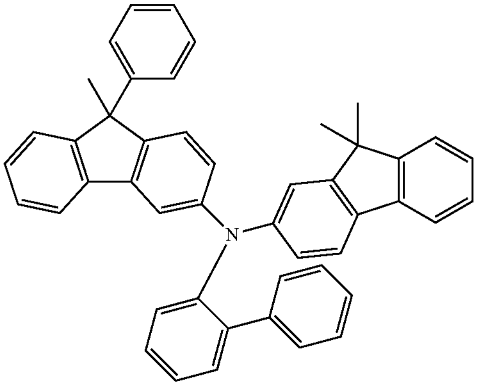
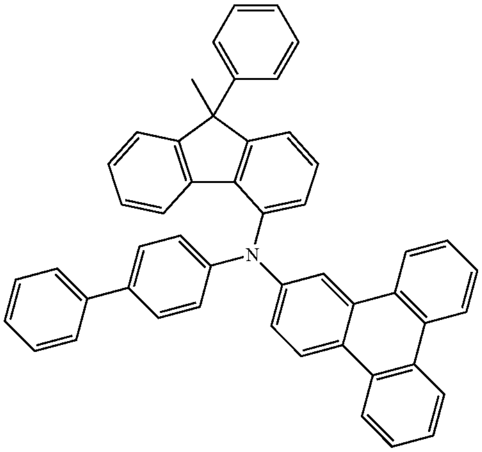
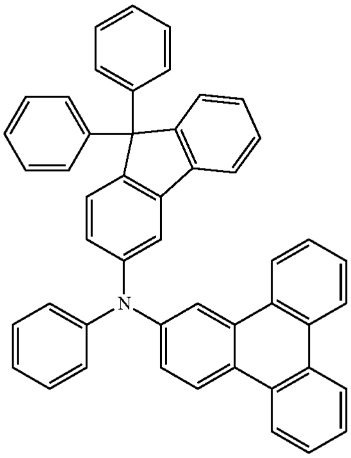
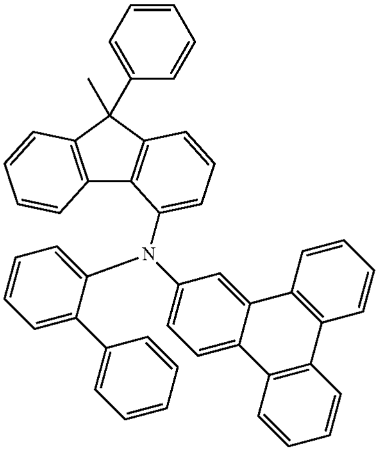
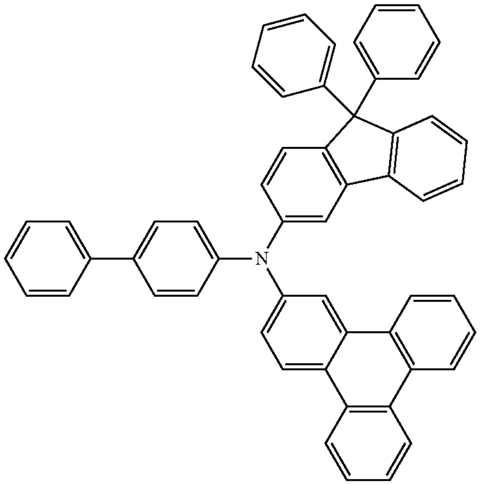
-continued

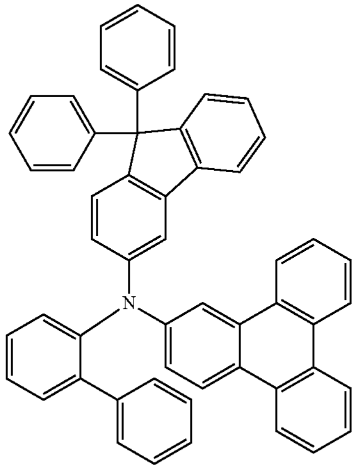
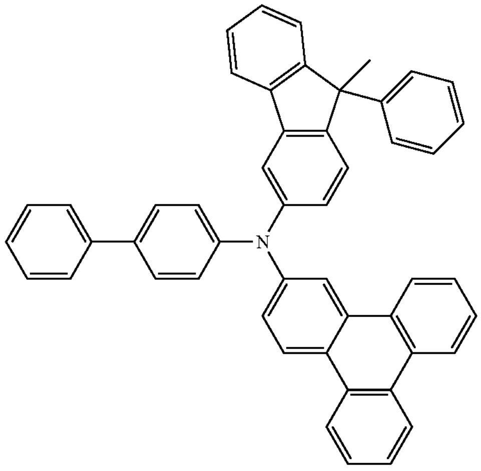
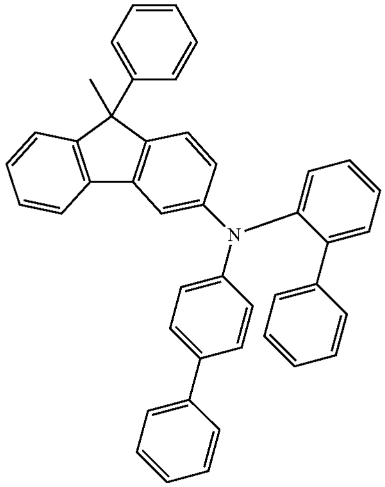
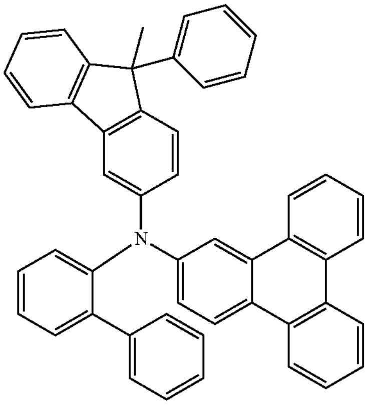
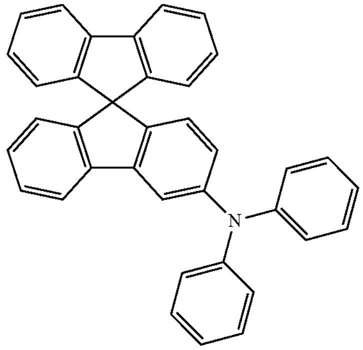
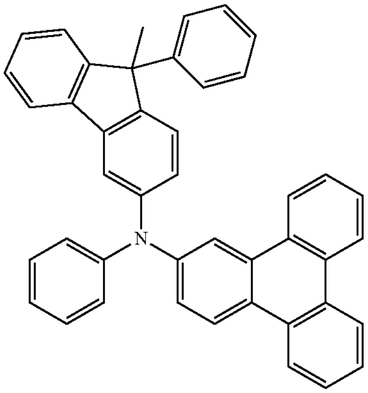
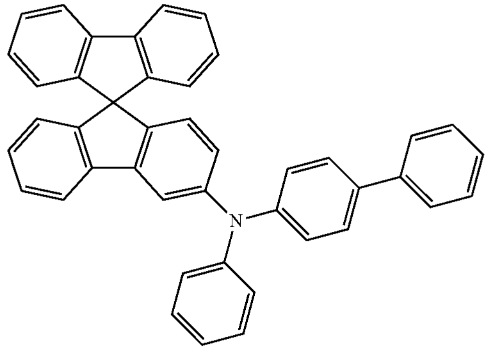

-continued
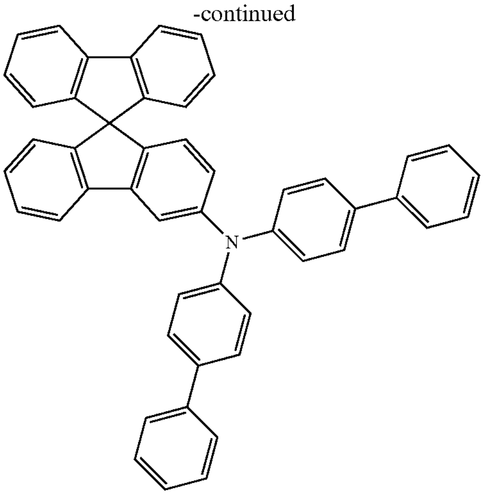
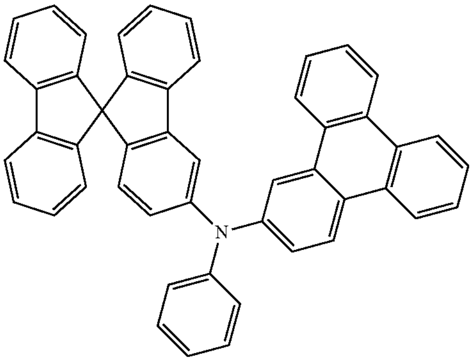
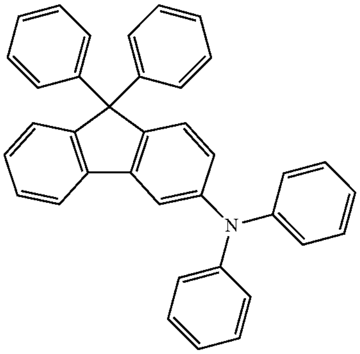
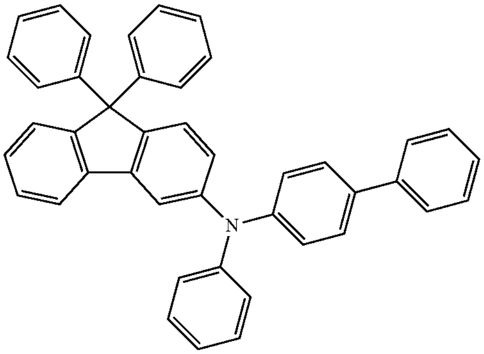
-continued
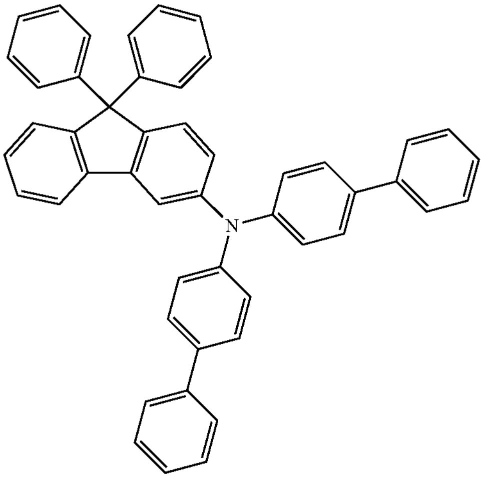
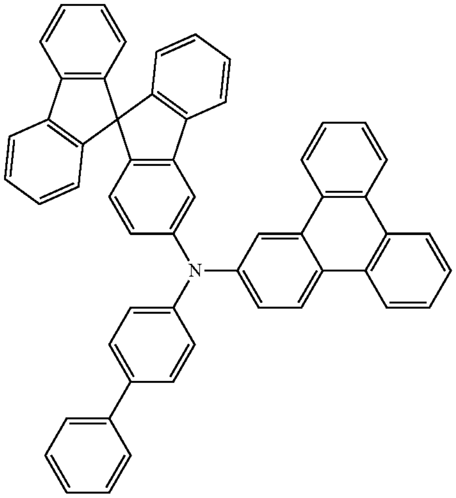
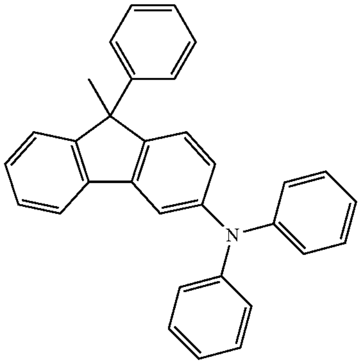
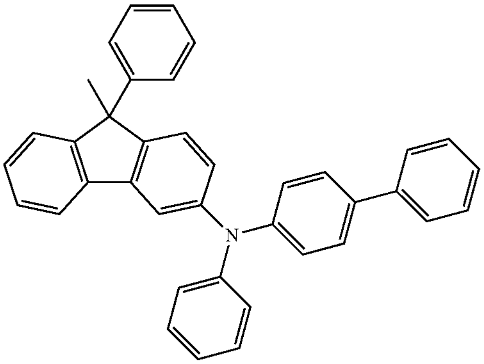

-continued
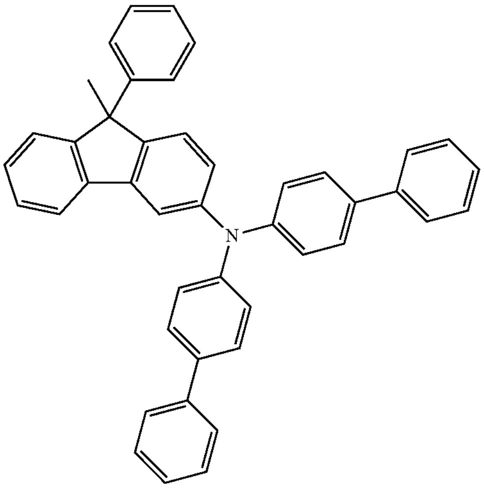
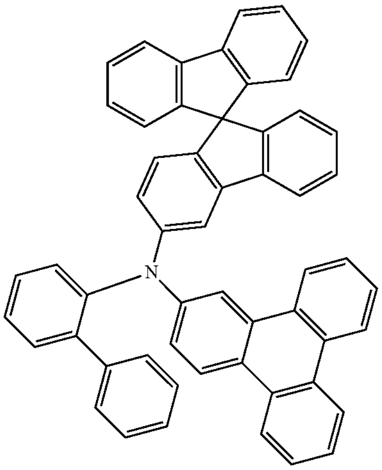
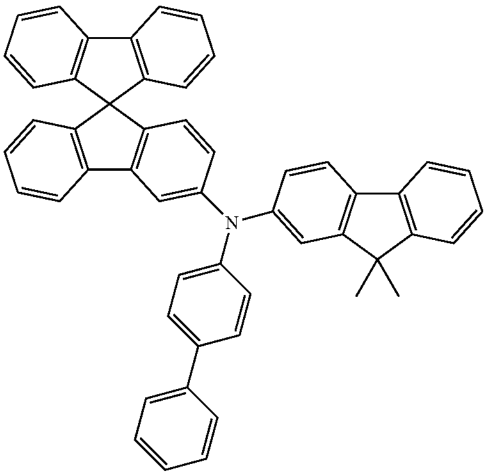
-continued
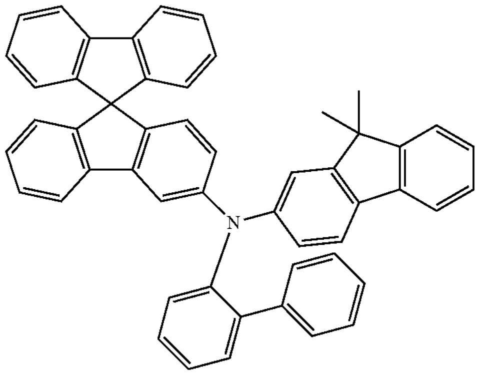
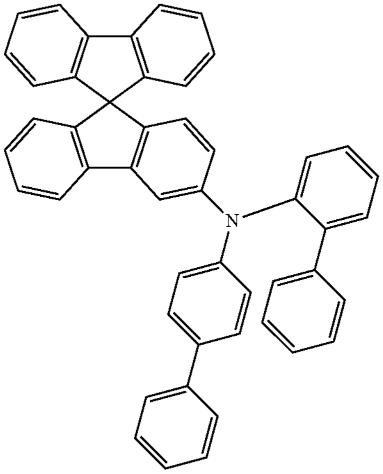
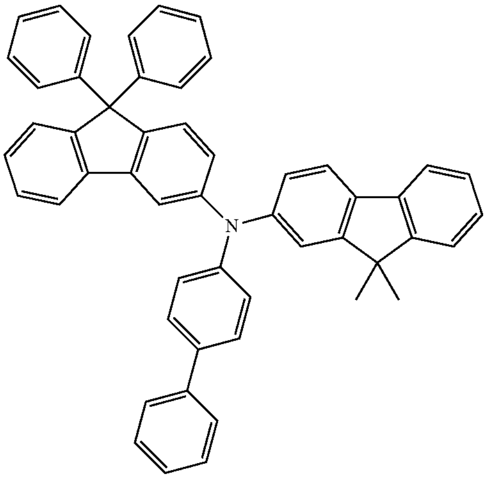
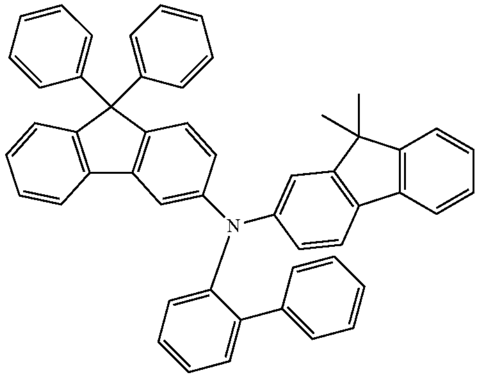

-continued
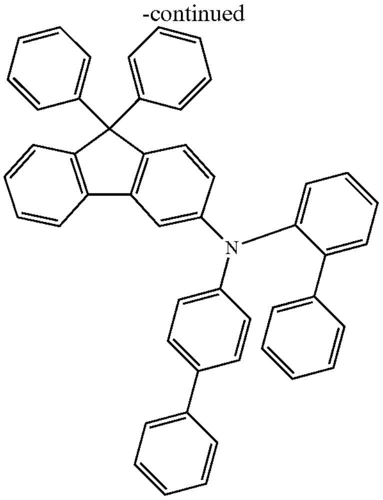
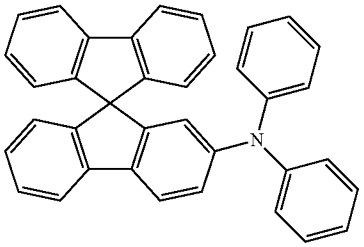
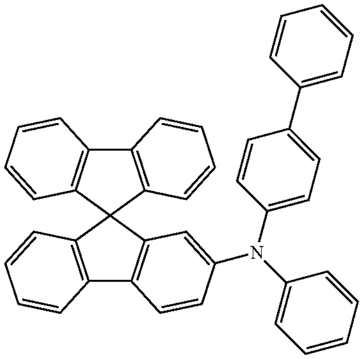
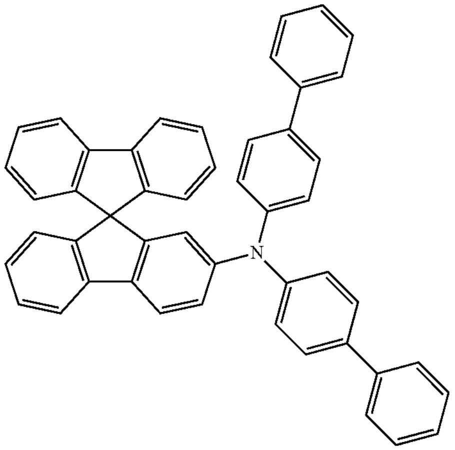
-continued
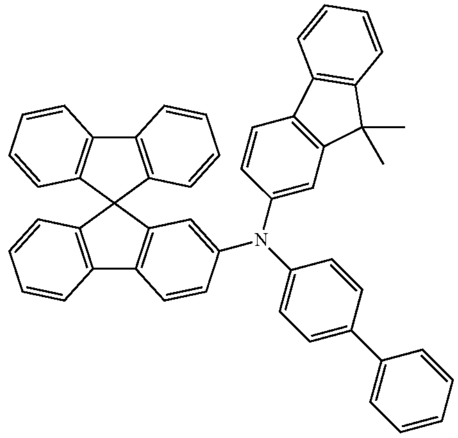
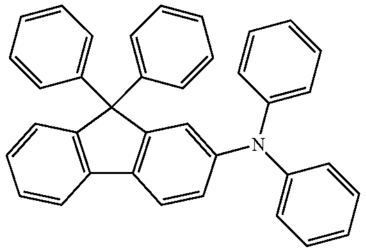
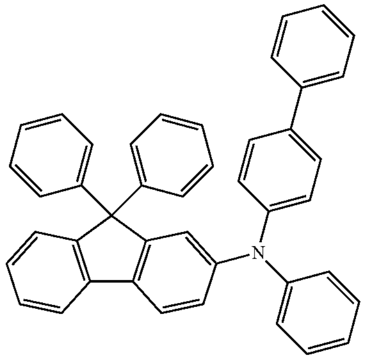
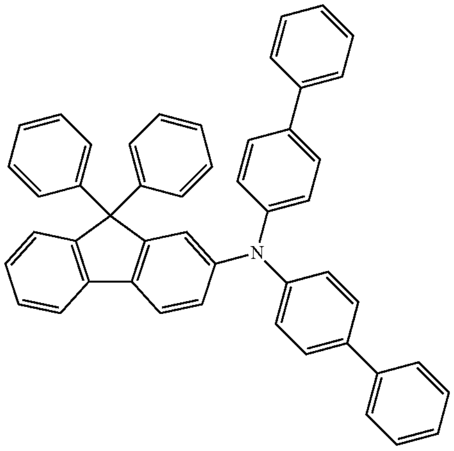

-continued
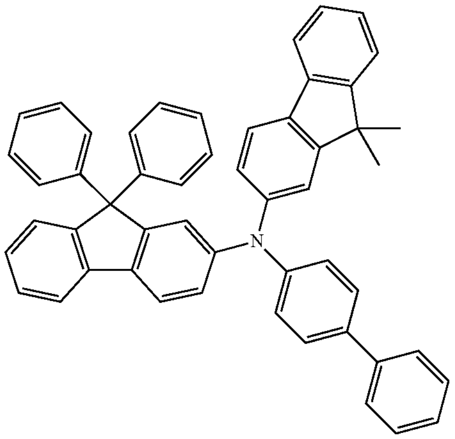
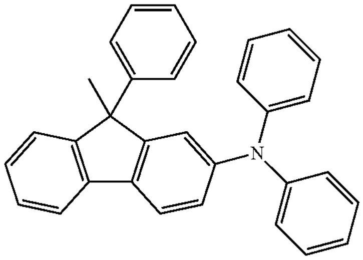
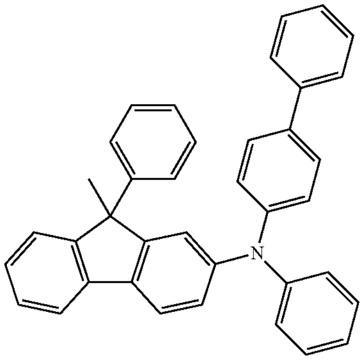
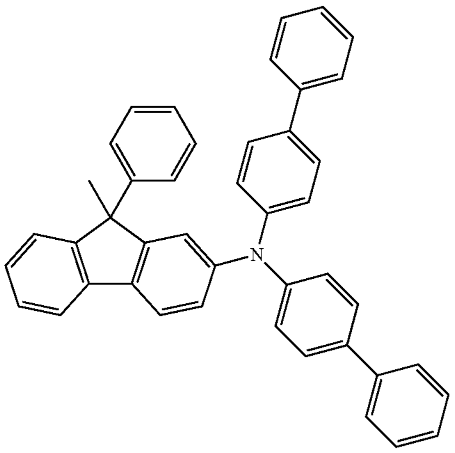
-continued
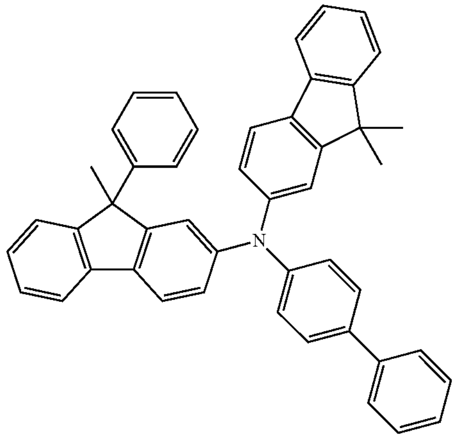
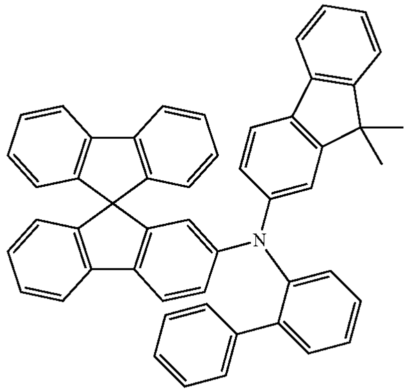
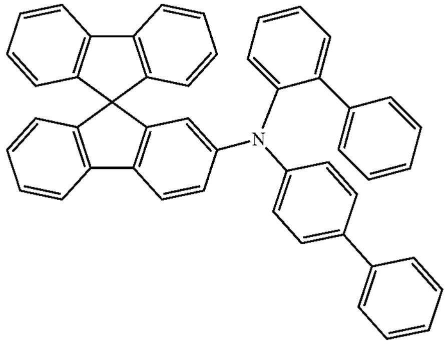
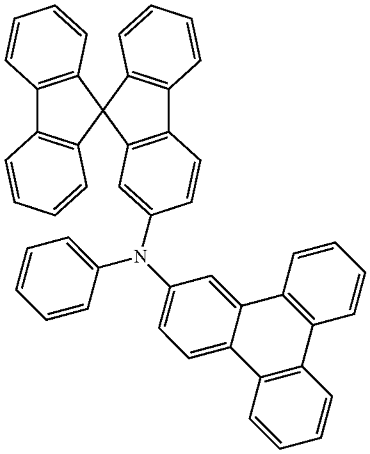

-continued
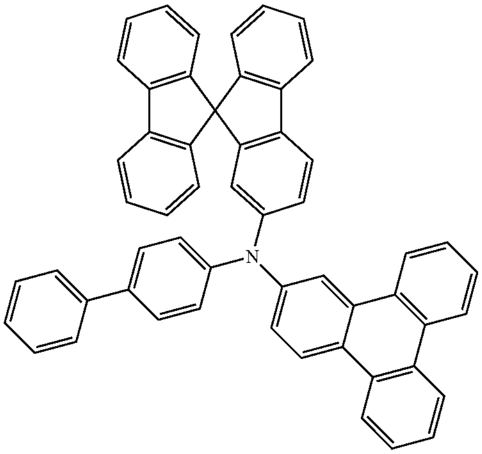
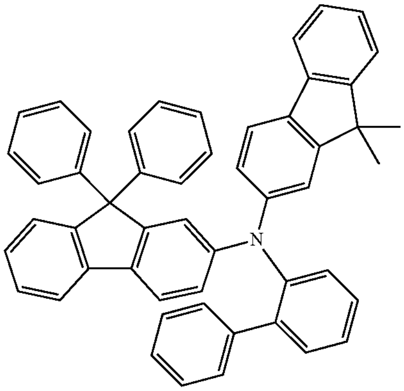
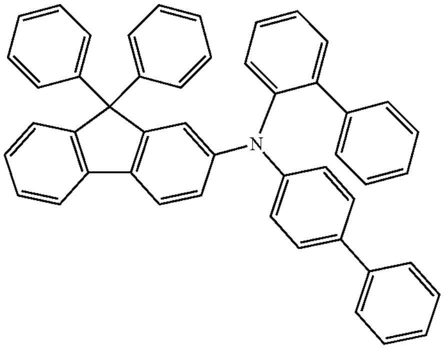
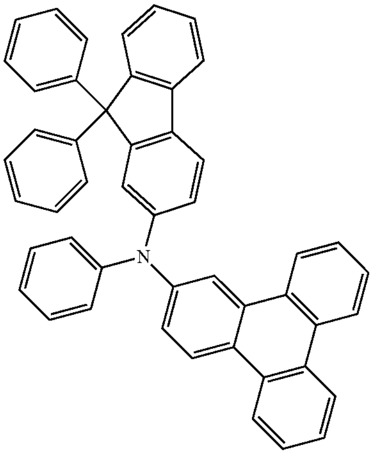
-continued
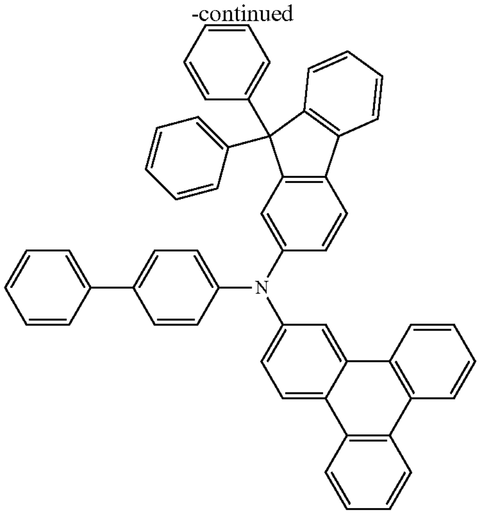
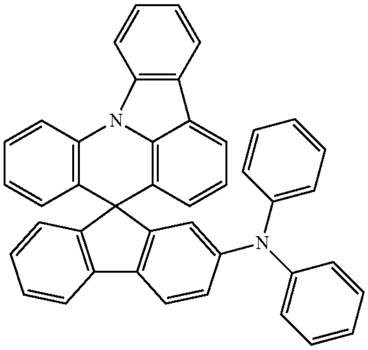
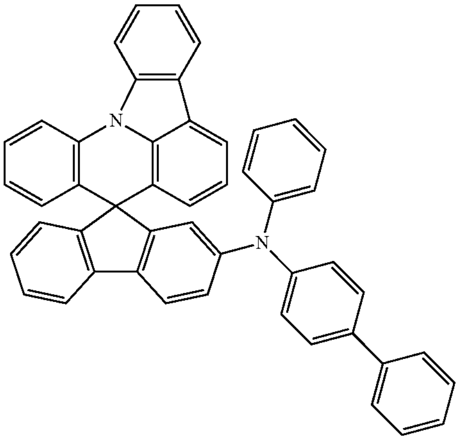
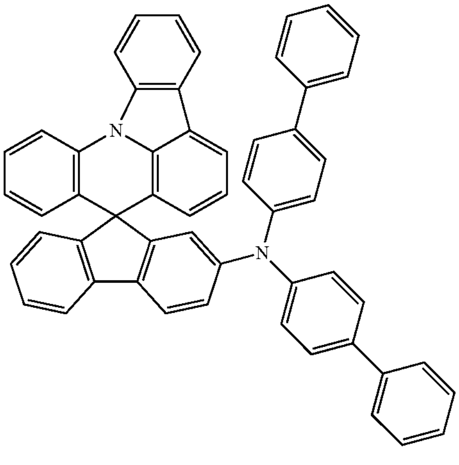

-continued
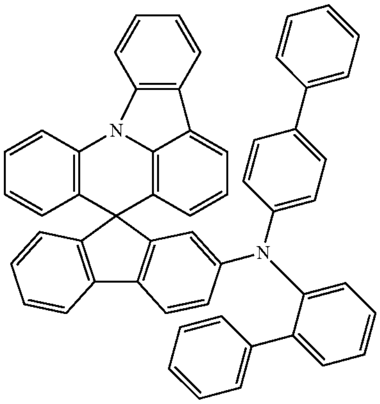
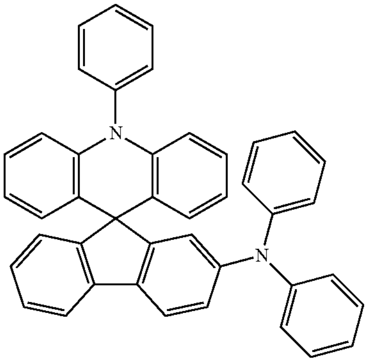
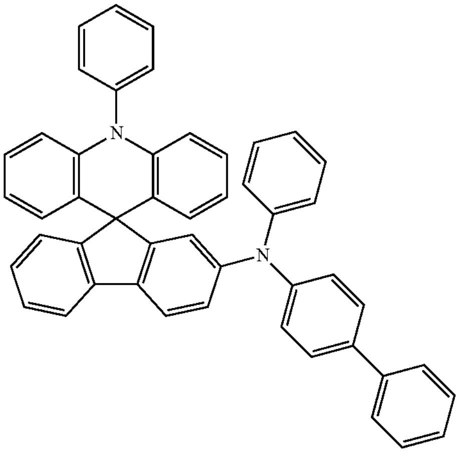
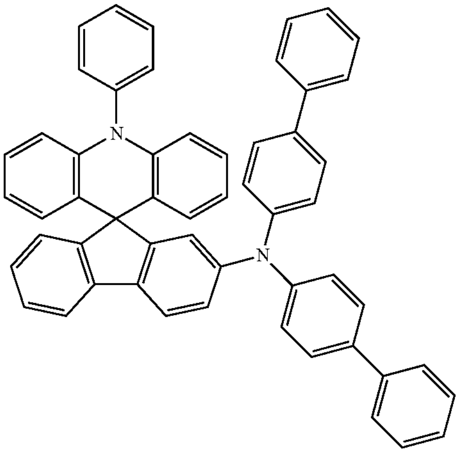
-continued
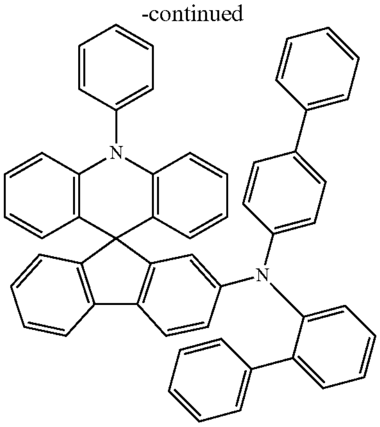
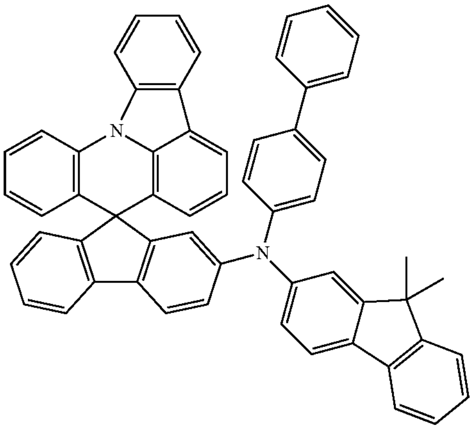
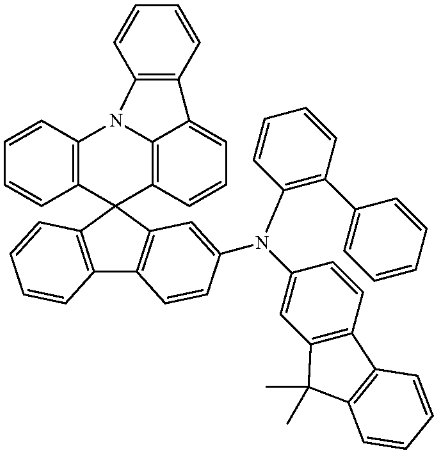
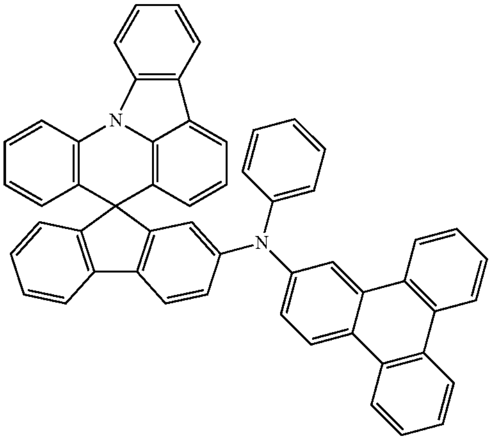

-continued
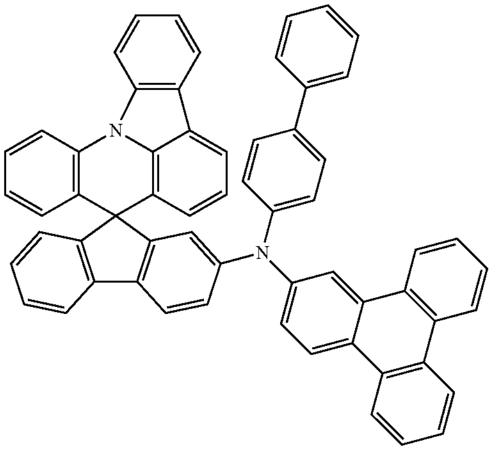
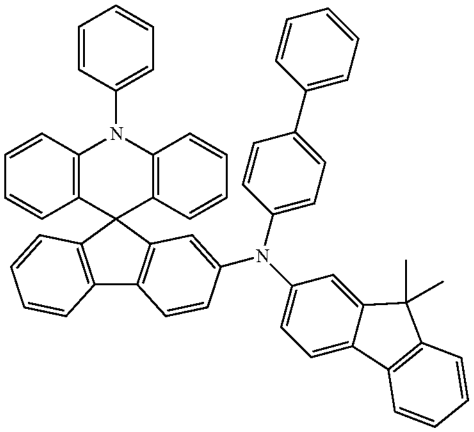
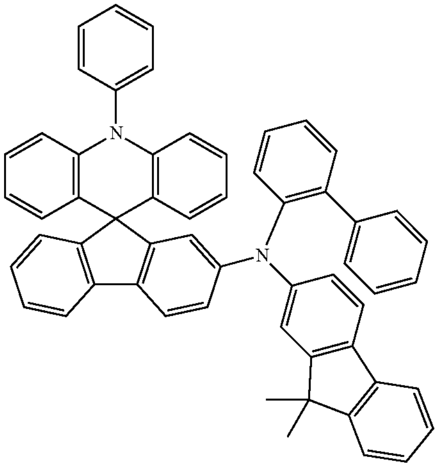
-continued
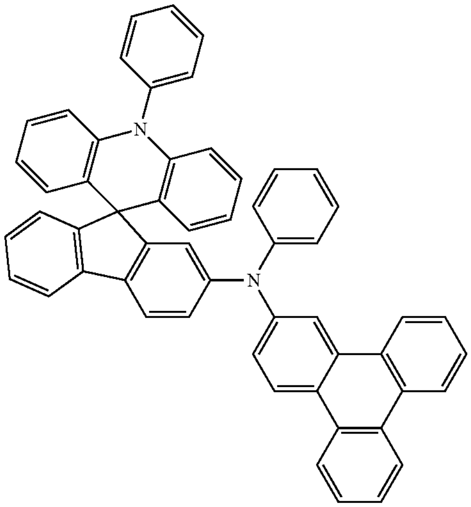
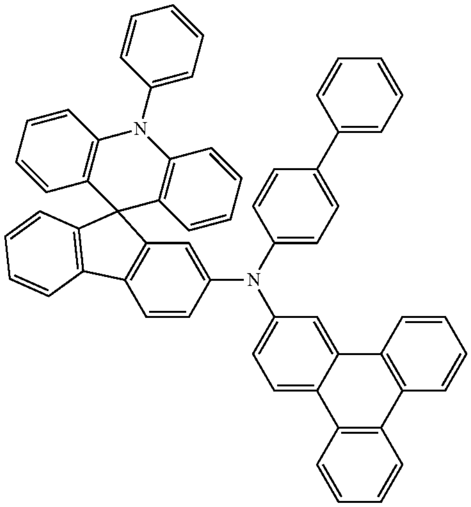
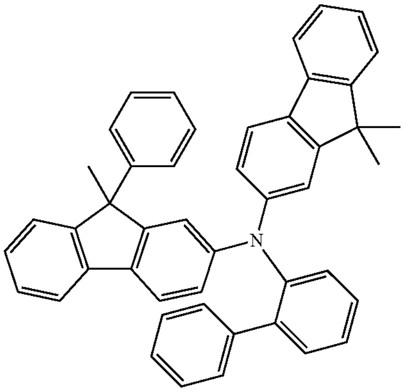

-continued
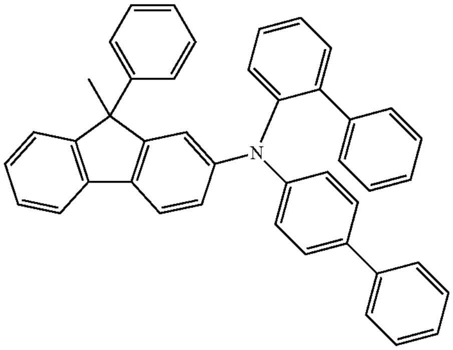
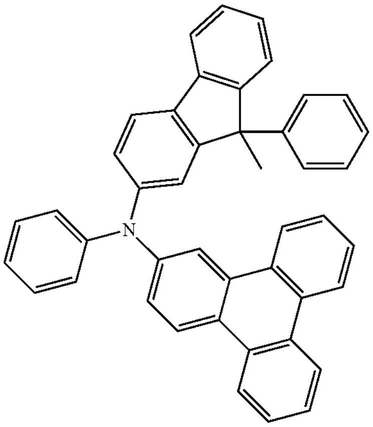
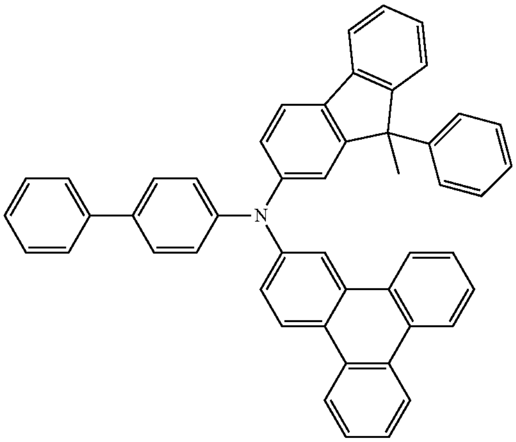
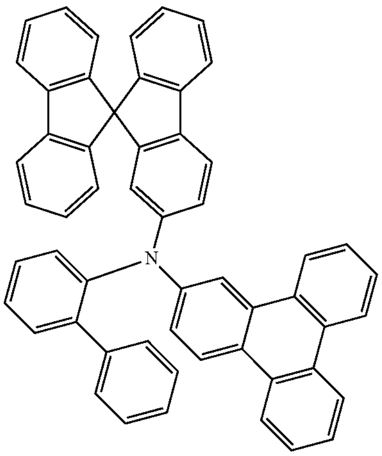
-continued
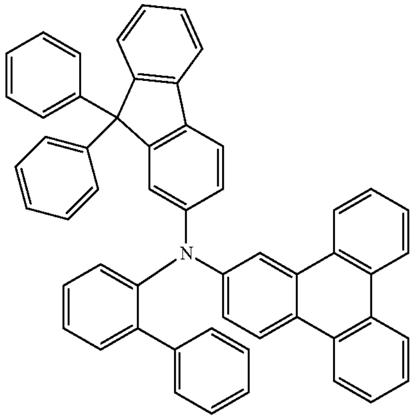
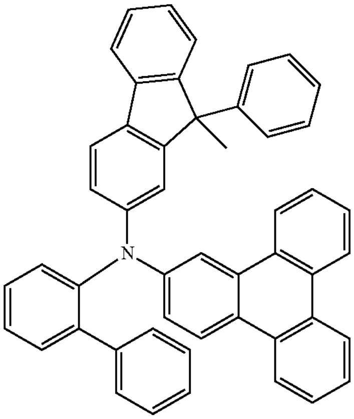
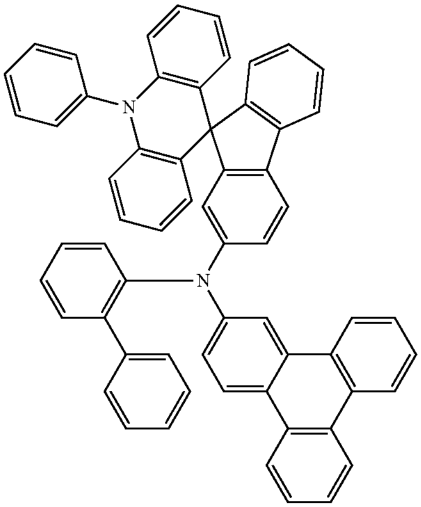

-continued

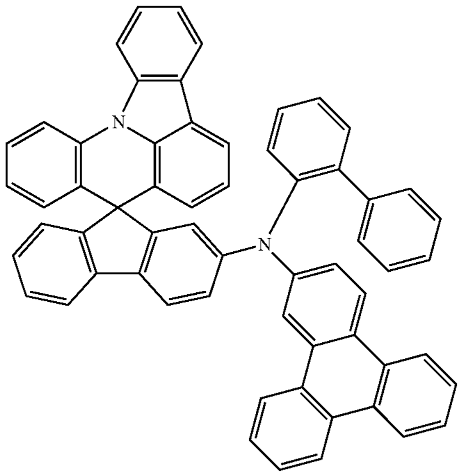

According to one embodiment of the present specification, the compound of Chemical Formula 1 or 2 may be prepared using starting materials and reaction conditions known in the art. The types and the number of substituents may be determined by those skilled in the art properly selecting known starting materials. In addition, the compound of Chemical Formula 1 or 2 may be obtained by purchasing commercially-available compounds.

According to one embodiment of the present specification, the organic light emitting device of the present specification may include only a first organic material layer, a second organic material layer and a light emitting layer as the organic material layer, but may further include additional organic material layers. For example, additional hole injection layer, hole transfer layer, electron blocking layer, light emitting layer, hole blocking layer, electron transfer layer, electron injection layer and the like may be further included.

According to one embodiment of the present specification, the first organic material layer performs a role of a hole transfer layer, and the second organic material layer may perform a role of an electron blocking layer.

According to one embodiment of the present specification, the first organic material layer and the second organic material layer are provided while being adjoined.

According to one embodiment of the present specification, the second organic material layer and the light emitting layer are provided while being adjoined.

For example, the organic light emitting device of the present specification may have structures as illustrated in FIG. 1 and FIG. 2, however, the structure is not limited thereto.

FIG. 1 illustrates a structure of an organic light emitting device in which an anode (101), a first organic material layer (201), a second organic material layer (202), a light emitting layer (301) and a cathode (401) are consecutively laminated on a substrate (100). FIG. 1 is a structure illustrating an organic light emitting device according to one embodiment of the present specification, and the organic light emitting device may further include other organic material layers. In addition, the cathode, the light emitting layer, the second organic material layer, the first organic material layer and the anode may be consecutively laminated on the substrate.

In FIG. 2, an electron transfer layer (501) and an electron injection layer (502) are additionally provided between the light emitting layer (301) and the cathode (401) compared to FIG. 1. FIG. 2 is an illustrative structure according to an embodiment of the present specification, and other organic material layers may be further included, and the electron transfer layer or the electron injection layer may not be included. In addition, the cathode, the electron injection layer, the electron transfer layer, the light emitting layer, the second organic material layer, the first organic material layer and the anode may be consecutively laminated on the substrate.

When the organic light emitting device includes a plurality of organic material layers, the organic material layers may be formed with materials the same as or different from each other.

For example, the organic light emitting device of the present specification may be manufactured using materials and methods known in the art. For example, the organic light emitting device may be manufactured by forming an anode on a substrate by depositing a metal, a metal oxide having conductivity, or an alloy thereof using a physical vapor deposition (PVD) method such as sputtering or e-beam evaporation, forming an organic material layer thereon, and then depositing a material capable of being used as a cathode thereon. In addition to such a method, the organic light emitting device may be manufactured by consecutively depositing a cathode material, an organic material layer and an anode material on a substrate. In addition, the compound represented by Chemical Formula 1 or 2 may be formed to an organic material layer using a solution coating method as well as a vacuum deposition method when manufacturing the organic light emitting device. Herein, the solution coating method means spin coating, dip coating, doctor blading, inkjet printing, screen printing, a spray method, roll coating and the like, but is not limited thereto.

As the anode material, materials having large work function are normally preferred so that hole injection to an organic material layer is smooth. Specific examples of the anode material capable of being used in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, but are not limited thereto.

As the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al, $LiO_2$/Al or Mg/Ag, and the like, but are not limited thereto.

The hole injection layer is a layer that injects holes from an electrode, and the hole injection material is preferably a compound that has an ability to transfer holes, therefore, has a hole injection effect in an anode, has an excellent hole injection effect for a light emitting layer or a light emitting material, prevents excitons generated in the light emitting layer from moving to an electron injection layer or an electron injection material, and in addition thereto, has an excellent thin film forming ability. The highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer that receives holes from a hole injection layer and transfers the holes to a light emitting layer, and as the hole transfer material, materials capable of receiving holes from an anode or a hole injection layer, moving the holes to a light emitting layer, and having high mobility for the holes are suitable. Specific examples thereof include arylamine-based organic materials, conductive polymers, block copolymers having conjugated parts and non-conjugated parts together, and the like, but are not limited thereto.

The light emitting material of the light emitting layer is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxyquinoline aluminum complexes ($Alq_3$); carbazole series compounds; dimerized styryl compounds; BAlq; 10-hydroxybenzo quinoline-metal compounds; benzoxazole, benzothiazole and benzimidazole series compounds; poly(p-phenylenevinylene) (PPV) series polymers; spiro compounds; polyfluorene, rubrene, and the like, but are not limited thereto.

The light emitting layer may include a host material and a dopant material. The host material includes fused aromatic ring derivatives, heteroring-containing compounds or the like. Specifically, the fused aromatic ring derivative includes anthracene derivatives, pyrene derivatives, naphthalene derivatives, pentacene derivatives, phenanthrene compounds, fluoranthene compounds and the like, and the heteroring-containing compound includes carbazole derivatives, dibenzofuran derivatives, ladder-type furan compounds, pyrimidine derivatives and the like, but the material is not limited thereto.

The dopant material includes aromatic amine derivatives, styrylamine compounds, boron complexes, fluoranthene compounds, metal complexes and the like. Specifically, the aromatic amine derivative is a fused aromatic ring derivative having a substituted or unsubstituted arylamino group and includes arylamino group-including pyrene, anthracene, chrysene, peryflanthene and the like, and the styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group are substituted or unsubstituted. Specifically, styrylamine, styryldiamine, styryltriamine, styryltetramine or the like is included, but the styrylamine compound is not limited thereto. In addition, the metal complex includes iridium complexes, platinum complexes or the like, but is not limited thereto.

The electron transfer layer is a layer that receives electrons from an electron injection layer and transfers the electrons to a light emitting layer, and as the electron transfer material, materials capable of favorably receiving electrons from a cathode, moving the electrons to a light emitting layer, and having high mobility for the electrons are suitable. Specific examples thereof include Al complexes of 8-hydroxyquinoline; complexes including $Alq_3$; organic radical compounds; hydroxyflavon-metal complexes, and the like, but are not limited thereto. The electron transfer layer may be used together with any desired cathode material as used in the art. Particularly, examples of the suitable cathode material include common materials that have small work function, and in which an aluminum layer or a silver layer follows. Specifically, the cathode material includes cesium, barium, calcium, ytterbium and samarium, and in each case, an aluminum layer or a silver layer follows.

The electron injection layer is a layer that injects electrons from an electrode, and the electron injection material is preferably a compound that has an ability to transfer electrons, has an electron injection effect from a cathode, has an excellent electron injection effect for a light emitting layer or a light emitting material, prevents excitons generated in the light emitting layer from moving to a hole injection layer, and in addition, has an excellent thin film forming ability. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)berylium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium and the like, but is not limited thereto.

The organic light emitting device according to the present specification may be a top-emission type, a bottom-emission type or a dual-emission type depending on the materials used.

Hereinafter, the present specification will be described in detail with reference to examples. However, the examples according to the present specification may be modified to various other forms and the scope of the present specification is not to be construed as being limited to the examples described below. The examples of the present specification are provided in order to more fully describe the present specification to those having average knowledge in the art.

Synthesis Example

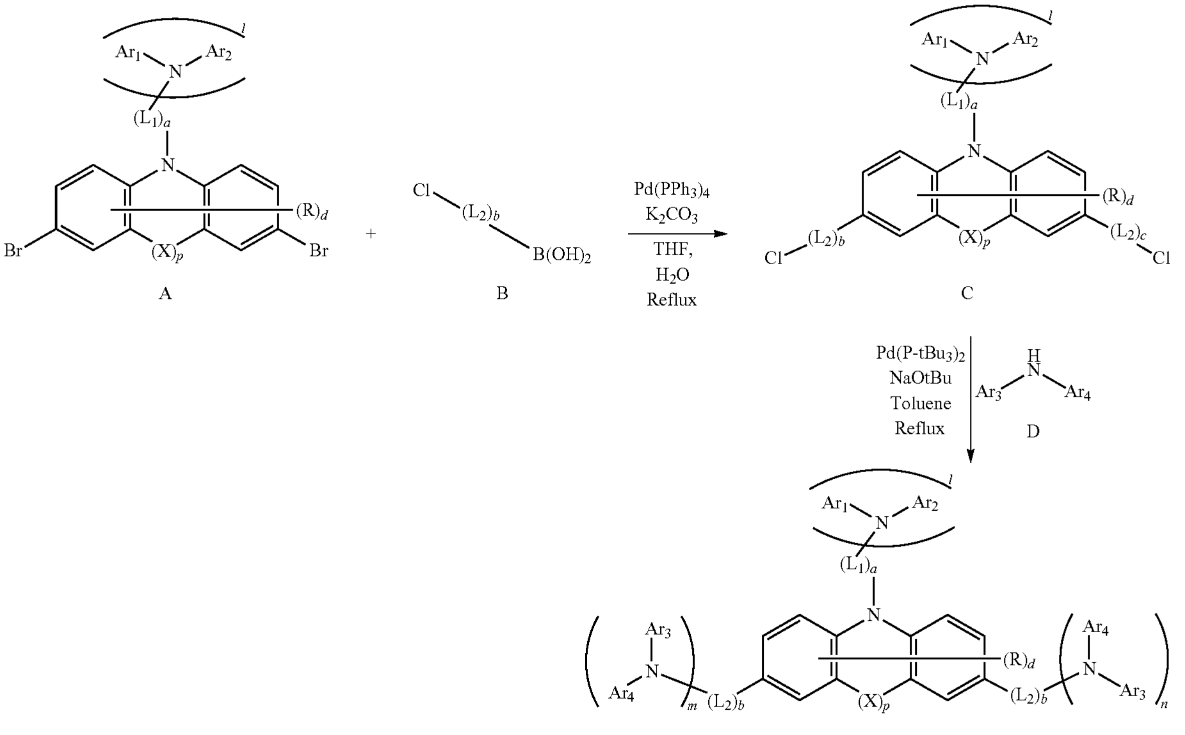

A B C D E

1) Preparation of Compound C

To a round bottom flask under nitrogen, 1 eq. of Compound A, 2 eq. of Compound B, 0.002 eq. of $Pd(PPh_3)_4$, 2 eq. of $K_2CO_3$ (aq) and THF were introduced at once, and the result was stirred under reflux at 110° C. The reaction solution was cooled to room temperature, and then the organic layer was separated, vacuum dried and purified using column chromatography.

2) Preparation of Compound E

To a round bottom flask under nitrogen, 1 eq. of Compound C, 2 eq. of Compound D, 0.001 eq. of $Pd(P\text{-}tBu_3)_2$, 2 eq. of NaOtBu and toluene were introduced at once, and the result was stirred under reflux at 110° C. The reaction solution was cooled to room temperature, and then the organic layer was separated, vacuum dried and purified using column chromatography.

3) Preparation of Compound A-1

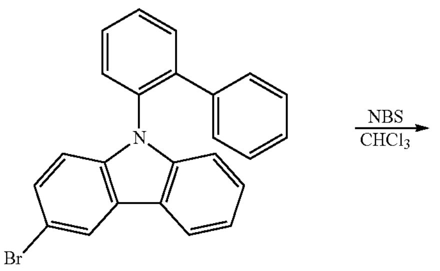

CAS# 1609267-04-0

-continued

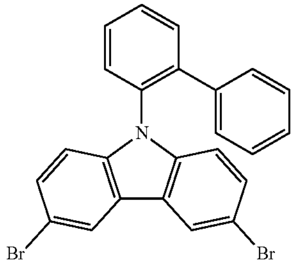

A-1

In a round bottom flask under nitrogen, 1 eq. of 9-[1,1'-biphenyl]-2-yl-3-bromo-9H-carbazole (CAS #1609267-04-0) was stirred at room temperature. After cooling the result to 0°, 1 eq. of NBS dissolved in $CHCl_3$ was added dropwise thereto, and after the dropwise addition of NBS was completed, the temperature was raised to room temperature, and the result was kept stirring for 1 hour. After the reaction was completed, the reaction solution was vacuum dried and purified using column chromatography.

A, B, D and E are as shown in the following Table 1.
TABLE 1
| A (1 eq.) | B (2 eq.) | D (2 eq.) | E | m/z |
|---|---|---|---|---|
| 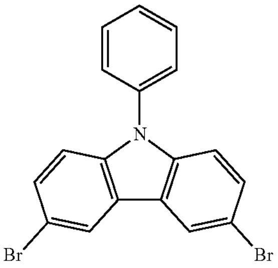 CAS# 57103-20-5 | 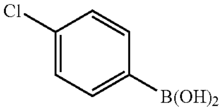 CAS# 1679-18-1 | 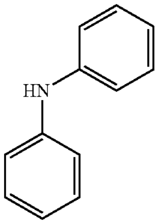 CAS# 122-39-4 | HT-1-1 | 729 |
| 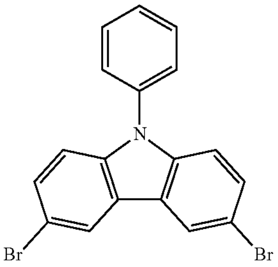 CAS# 57103-20-5 | 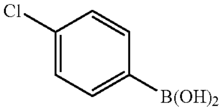 CAS# 1679-18-1 | 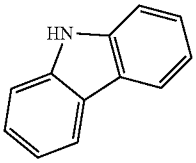 CAS# 86-74-8 | HT-1-2 | 725 |
| 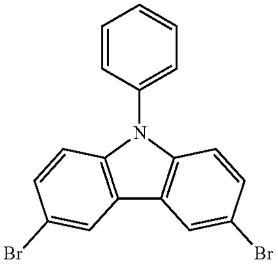 CAS# 57103-20-5 | 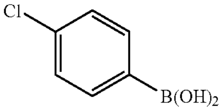 CAS# 1679-18-1 | 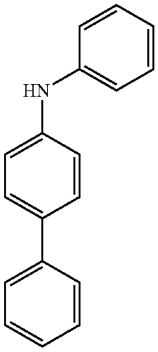 CAS# 32228-99-2 | HT-1-3 | 881 |
| 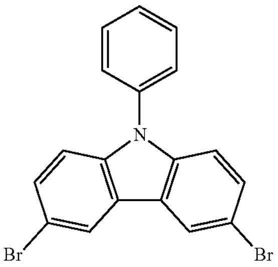 CAS# 57103-20-5 | 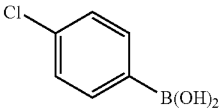 CAS# 1679-18-1 | 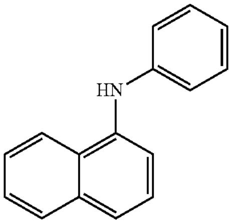 CAS# 90-30-2 | HT-1-4 | 829 |

TABLE 1-continued
| A (1 eq.) | B (2 eq.) | D (2 eq.) | E | m/z |
|---|---|---|---|---|
| 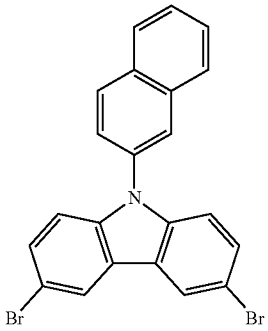 CAS# 1221237-83-7 | 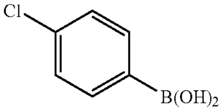 CAS# 1679-18-1 | 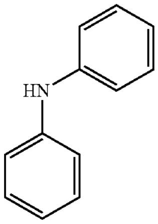 CAS# 122-39-4 | HT-1-5 | 779 |
| 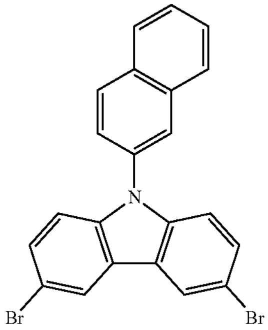 CAS# 1221237-83-7 | 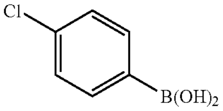 CAS# 1679-18-1 | 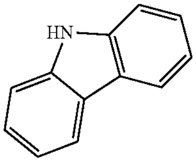 CAS# 86-74-8 | HT-1-6 | 775 |
| 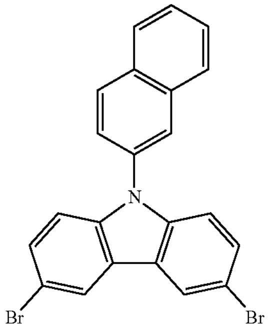 CAS# 1221237-83-7 | 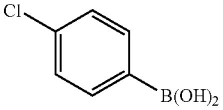 CAS# 1679-18-1 | 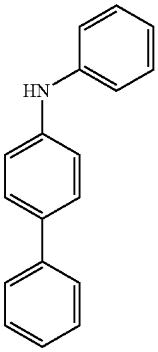 CAS# 32228-99-2 | HT-1-7 | 931 |
| 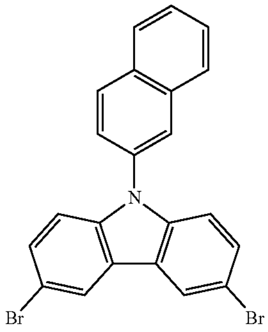 CAS# 1221237-83-7 | 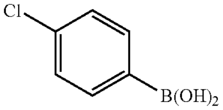 CAS# 1679-18-1 | 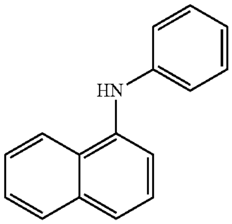 CAS# 90-30-2 | HT-1-8 | 879 |

TABLE 1-continued
| A (1 eq.) | B (2 eq.) | D (2 eq.) | E | m/z |
| --- | --- | --- | --- | --- |
| 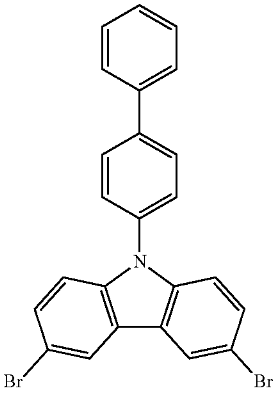 CAS# 894791-50-5 | 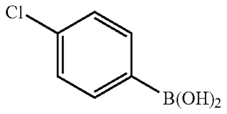 CAS# 1679-18-1 | 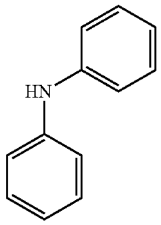 CAS# 122-39-4 | HT-1-9 | 805 |
| 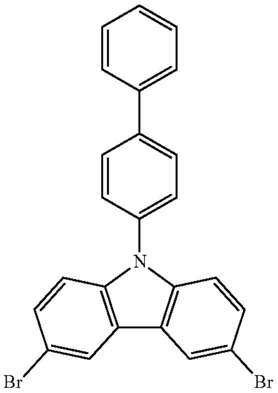 CAS# 894791-50-5 | 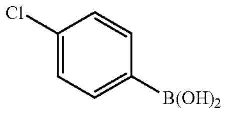 CAS# 1679-18-1 | 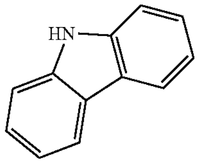 CAS# 86-74-8 | HT-1-10 | 801 |
| 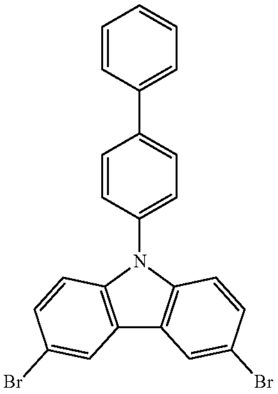 CAS# 894791-50-5 | 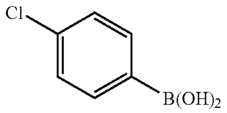 CAS# 1679-18-1 | 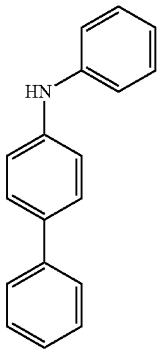 CAS# 32228-99-2 | HT-1-11 | 957 |

TABLE 1-continued
| A (1 eq.) | B (2 eq.) | D (2 eq.) | E | m/z |
|---|---|---|---|---|
| 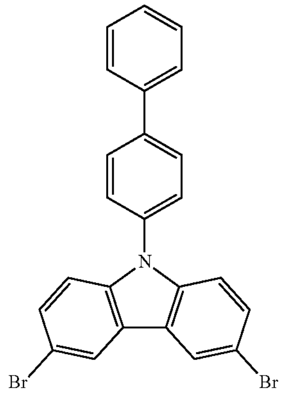<br>CAS# 894791-50-5 | 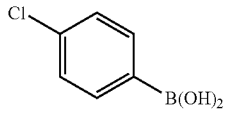<br>CAS# 1679-18-1 | 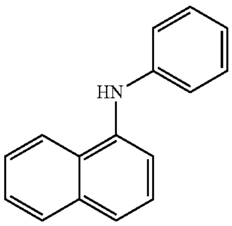<br>CAS# 90-30-2 | HT-1-12 | 905 |
| 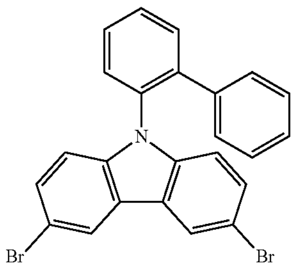<br>A-1 | 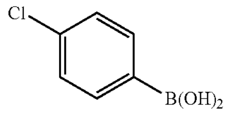<br>CAS# 1679-18-1 | 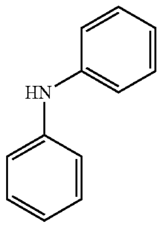<br>CAS# 122-39-4 | HT-1-13 | 805 |
| 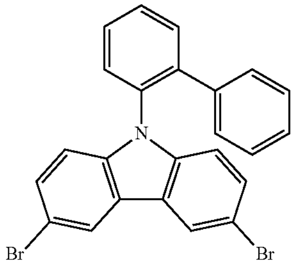<br>A-1 | 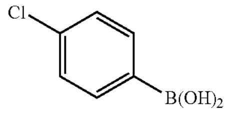<br>CAS# 1679-18-1 | 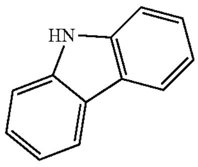<br>CAS#  86-74-8 | HT-1-14 | 801 |
| 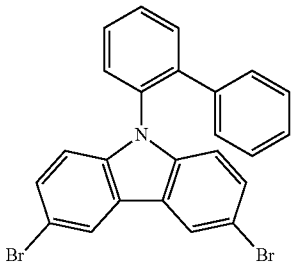<br>A-1 | 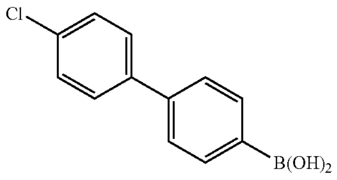<br>CAS# 364044-44-0 | 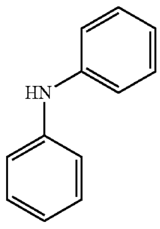<br>CAS# 122-39-4 | HT-1-15 | 957 |

TABLE 1-continued
| A (1 eq.) | B (2 eq.) | D (2 eq.) | E | m/z |
|---|---|---|---|---|
| 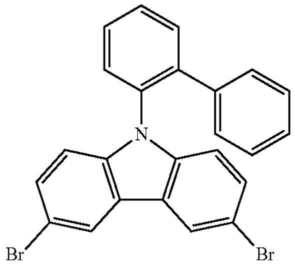 A-1 | 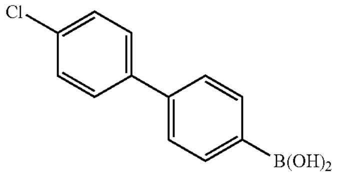 CAS# 364044-44-0 | 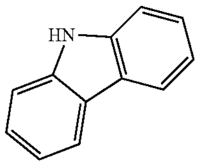 CAS# 86-74-8 | HT-1-16 | 953 |
| 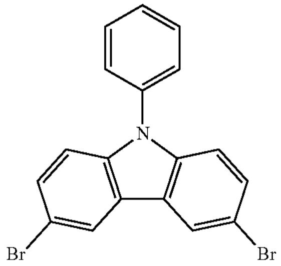 CAS# 57103-20-5 | 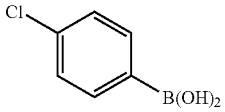 CAS# 1679-18-1 | 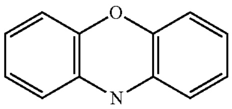 CAS# 135-67-1 | HT-1-17 | 757 |
| 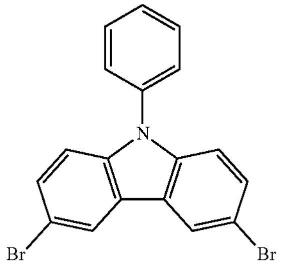 CAS# 57103-20-5 | 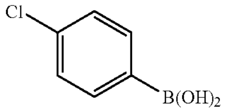 CAS# 1679-18-1 | 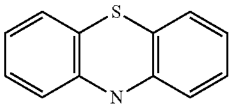 CAS# 92-84-2 | HT-1-18 | 789 |
| 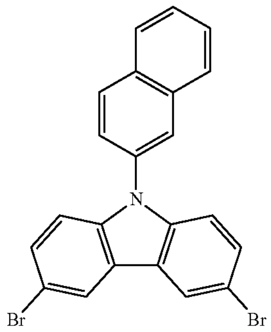 CAS# 1221237-83-7 | 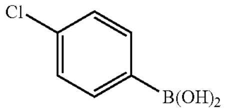 CAS# 1679-18-1 | 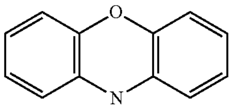 CAS# 135-67-1 | HT-1-19 | 807 |

TABLE 1-continued

| A (1 eq.) | B (2 eq.) | D (2 eq.) | E | m/z |
|---|---|---|---|---|
| 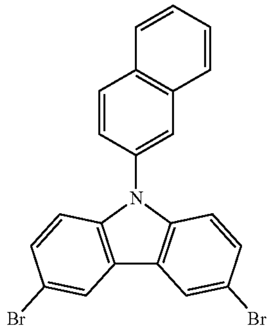 CAS# 1221237-83-7 | 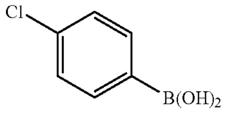 CAS# 1679-18-1 | 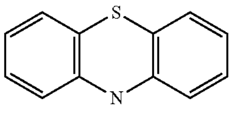 CAS# 92-84-2 | HT-1-20 | 839 |
| 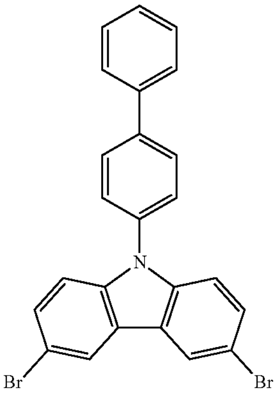 CAS# 894791-50-5 | 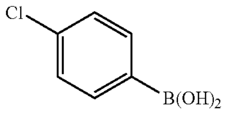 CAS# 1679-18-1 | 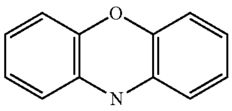 CAS# 135-67-1 | HT-1-21 | 833 |
| 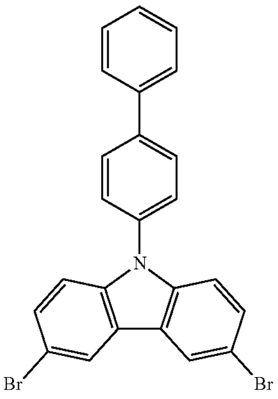 CAS# 894791-50-5 | 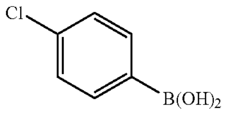 CAS# 1679-18-1 | 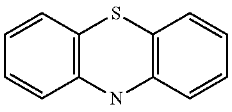 CAS# 92-84-2 | HT-1-22 | 865 |

Comparative Example 1

A glass substrate on which indium tin oxide (ITO) was coated as a thin film to a thickness of 1,000 Å was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol, then dried, and then transferred to a plasma cleaner. In addition, the substrate was cleaned for 5 minutes using oxygen plasma, and then transferred to a vacuum depositor.

On the transparent ITO electrode prepared as above, a hole injection layer was formed by thermal vacuum depositing hexanitrile hexaazatriphenylene (HAT) of the following chemical formula to a thickness of 500 Å.

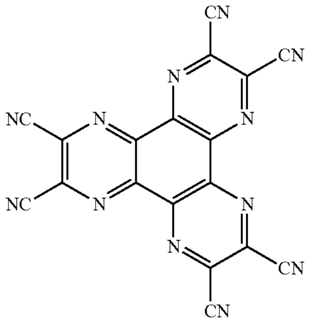

[HAT]

A hole transfer layer was formed on the hole injection layer by vacuum depositing the following compound N,N-bis([1, 1'-biphenyl]-4-yl)-4'-(9H-carbazol-9-yl)-[1,1'-Biphenyl]-4-amine (HT1) (300 Å), a material transferring holes.

[HT1]

N,N-bis([1,1'-biphenyl]-4-yl)-4'-(9H-carbazol-9-yl)-[1, 1'-Biphenyl]-4-amine

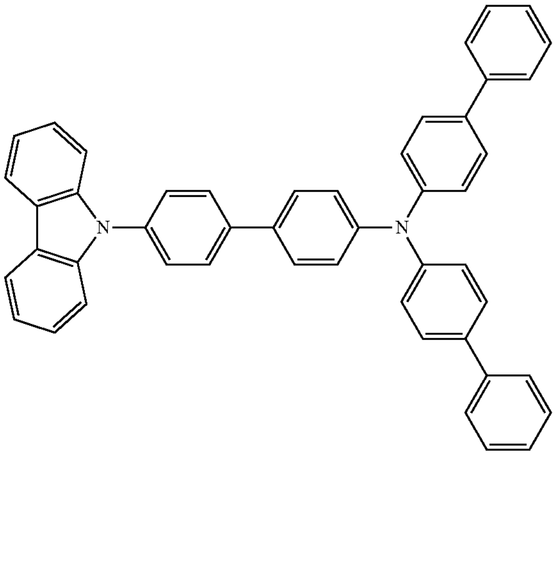 [SMILES: c1ccc(-c2ccc(N(c3ccc(-c4ccccc4)cc3)c3ccc(-c4ccc(-n5c6ccccc6c6ccccc65)cc4)cc3)cc2)cc1]

Subsequently, an electron blocking layer was formed on the hole transfer layer by vacuum depositing the following compound tris(4-(9H-carbazol-9-yl)phenyl)amine (TCTA) to a film thickness of 100 Å.

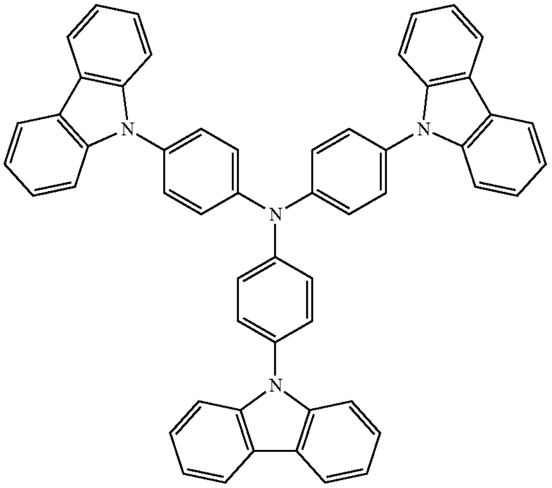

[TCTA]

Subsequently, a light emitting layer was formed on the electron blocking layer to a film thickness of 300 Å by vacuum depositing BH and BD as follows in a weight ratio of 25:1.

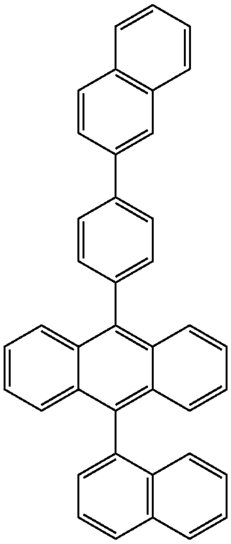

[BH]

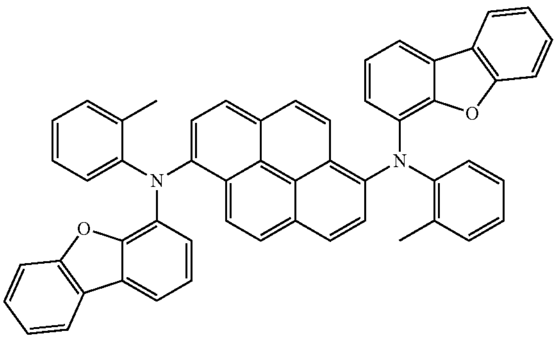

[BD]

-continued

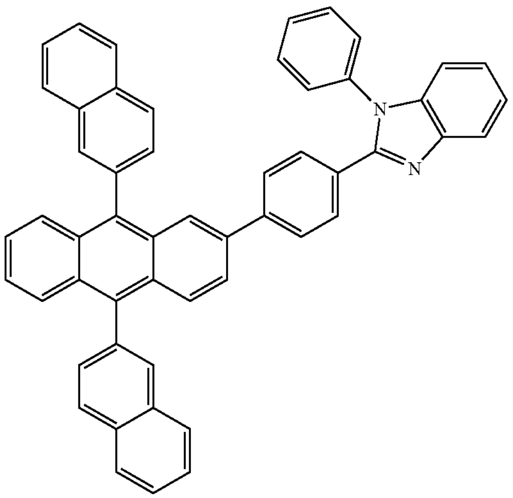

[ET1]

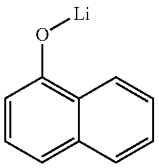

[LiQ]

On the light emitting layer, an electron injection and transfer layer was formed to a thickness of 300 Å by vacuum depositing Compound ET1 and the lithium quinolate (LiQ) compound in a weight ratio of 1:1. A cathode was formed on the electron injection and transfer layer by depositing lithium fluoride (LiF) to a thickness of 12 Å and aluminum to a thickness of 2,000 Å in consecutive order.

An organic light emitting device was manufactured by maintaining, in the above-mentioned processes, the deposition rates of the organic materials at 0.4 Å/sec to 0.7 Å/sec, the deposition rates of the lithium fluoride and the aluminum of the cathode at 0.3 Å/sec and 2 Å/sec, respectively, and the degree of vacuum during the deposition at $2\times10^{-7}$ torr to $5\times10^{4}$ torr.

Comparative Example 1-2

An organic light emitting device was manufactured in the same manner as in Comparative Example 1-1 except that H 2-2 was used instead of Compound TCTA.

Comparative Example 1-3

An organic light emitting device was manufactured in the same manner as in Comparative Example 1-1 except that Compound TCTA was not used.

Comparative Example 1-4

An organic light emitting device was manufactured in the same manner as in Comparative Example 1-1 except that Compound HT1 was not used, and H 2-2 was used instead of TCTA.

Comparative Example 1-5

An organic light emitting device was manufactured in the same manner as in Comparative Example 1-1 except that Compound H-1-1 was used instead of Compound HT1, and Compound TCTA was not used.

Comparative Example 1-6

An organic light emitting device was manufactured in the same manner as in Comparative Example 1-1 except that Compound HT1 was not used, and H 2-4 was used instead of Compound TCTA.

Comparative Example 1-7

An organic light emitting device was manufactured in the same manner as in Comparative Example 1-1 except that Compound HT1 was not used, and H 2-6 was used instead of Compound TCTA.

Example 1-1

An organic light emitting device was manufactured in the same manner as in Comparative Example 1-1 except that the compound of Chemical Formula HT-1-1 was used instead of Compound HT1.

Example 1-2

An organic light emitting device was manufactured in the same manner as in Comparative Example 1-1 except that the compound of Chemical Formula HT-1-2 was used instead of Compound HT1.

Example 1-3

An organic light emitting device was manufactured in the same manner as in Comparative Example 1-1 except that the compound of Chemical Formula HT-1-3 was used instead of Compound HT1.

Example 1-4

An organic light emitting device was manufactured in the same manner as in Comparative Example 1-1 except that the compound of Chemical Formula HT-1-4 was used instead of Compound HT1.

Example 1-5

An organic light emitting device was manufactured in the same manner as in Comparative Example 1-1 except that the compound of Chemical Formula HT-1-5 was used instead of Compound HT1.

Example 1-6

An organic light emitting device was manufactured in the same manner as in Comparative Example 1-1 except that the compound of Chemical Formula HT-1-6 was used instead of Compound HT1.

Example 1-7

An organic light emitting device was manufactured in the same manner as in Comparative Example 1-1 except that the compound of Chemical Formula HT-1-7 was used instead of Compound HT1.

Example 1-8

An organic light emitting device was manufactured in the same manner as in Comparative Example 1-1 except that the compound of Chemical Formula HT-1-8 was used instead of Compound HT1.

Example 1-9

An organic light emitting device was manufactured in the same manner as in Comparative Example 1-1 except that the compound of Chemical Formula HT-1-9 was used instead of Compound HT1.

Example 1-10

An organic light emitting device was manufactured in the same manner as in Comparative Example 1-1 except that the compound of Chemical Formula HT-1-10 was used instead of Compound HT1.

Example 1-11

An organic light emitting device was manufactured in the same manner as in Comparative Example 1-1 except that the compound of Chemical Formula HT-1-11 was used instead of Compound HT1.

Example 1-12

An organic light emitting device was manufactured in the same manner as in Comparative Example 1-1 except that the compound of Chemical Formula HT-1-12 was used instead of Compound HT1.

Example 1-13

An organic light emitting device was manufactured in the same manner as in Comparative Example 1-1 except that the compound of Chemical Formula HT-1-13 was used instead of Compound HT1.

Example 1-14

An organic light emitting device was manufactured in the same manner as in Comparative Example 1-1 except that the compound of Chemical Formula HT-1-14 was used instead of Compound HT1.

Example 1-15

An organic light emitting device was manufactured in the same manner as in Comparative Example 1-1 except that the compound of Chemical Formula HT-1-15 was used instead of Compound HT1.

Example 1-16

An organic light emitting device was manufactured in the same manner as in Comparative Example 1-1 except that the compound of Chemical Formula HT-1-16 was used instead of Compound HT1.

Example 1-17

An organic light emitting device was manufactured in the same manner as in Comparative Example 1-1 except that the compound of Chemical Formula HT-1-17 was used instead of Compound HT1.

Example 1-18

An organic light emitting device was manufactured in the same manner as in Comparative Example 1-1 except that the compound of Chemical Formula HT-1-18 was used instead of Compound HT1.

Example 1-19

An organic light emitting device was manufactured in the same manner as in Comparative Example 1-1 except that the compound of Chemical Formula HT-1-19 was used instead of Compound HT1.

Example 1-20

An organic light emitting device was manufactured in the same manner as in Comparative Example 1-1 except that the compound of Chemical Formula HT-1-20 was used instead of Compound HT1.

Example 1-21

An organic light emitting device was manufactured in the same manner as in Comparative Example 1-1 except that the compound of Chemical Formula HT-1-21 was used instead of Compound HT1.

Example 1-22

An organic light emitting device was manufactured in the same manner as in Comparative Example 1-1 except that the compound of Chemical Formula HT-1-22 was used instead of Compound HT1.

HT 1-1
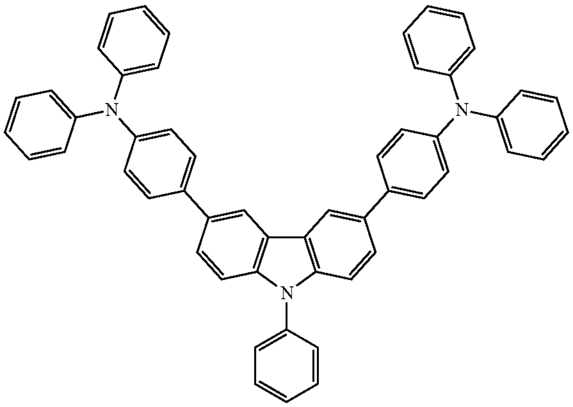
HT 1-2
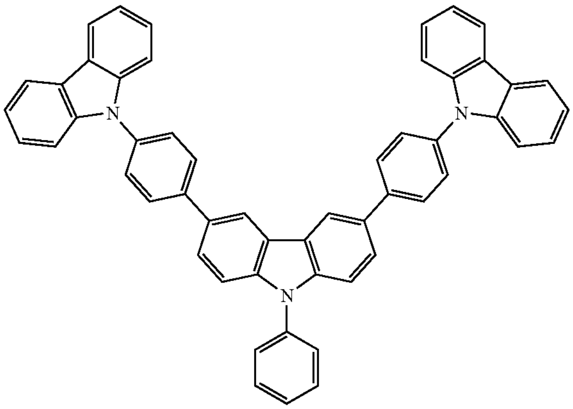
HT 1-3
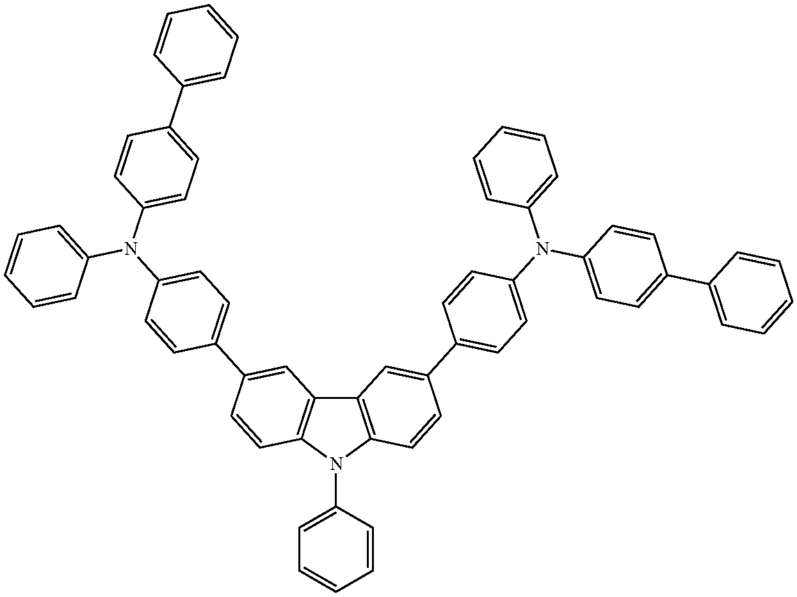
HT 1-4
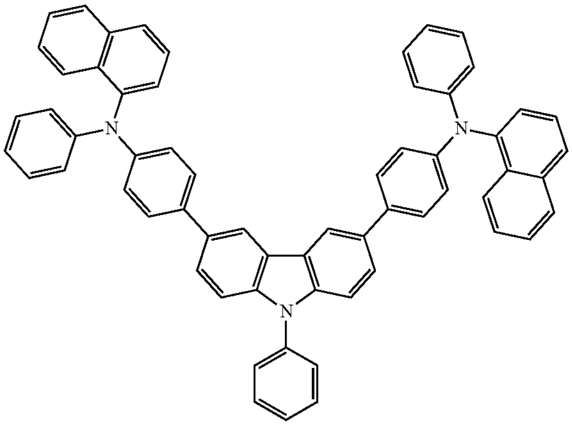
HT 1-5
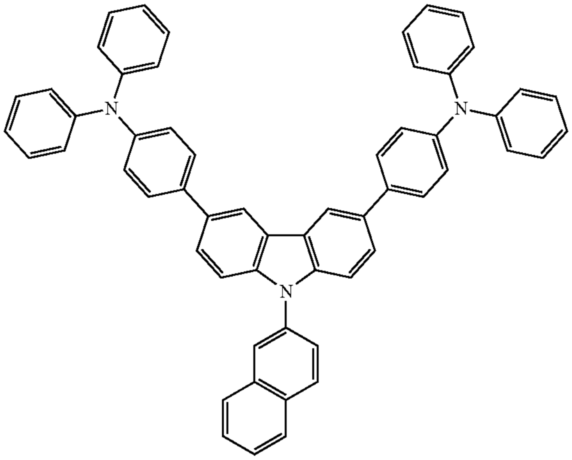

-continued
HT 1-6
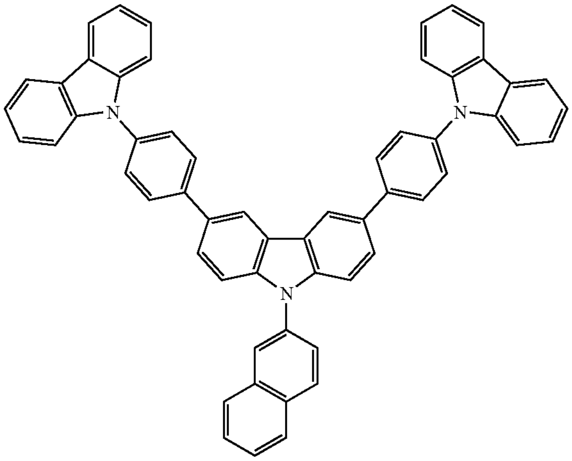
HT 1-7
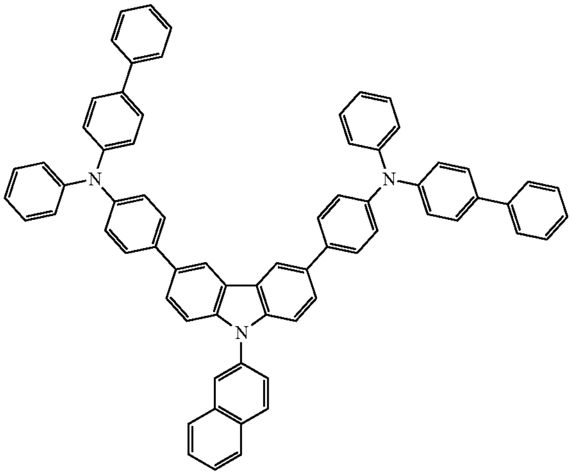
HT 1-8
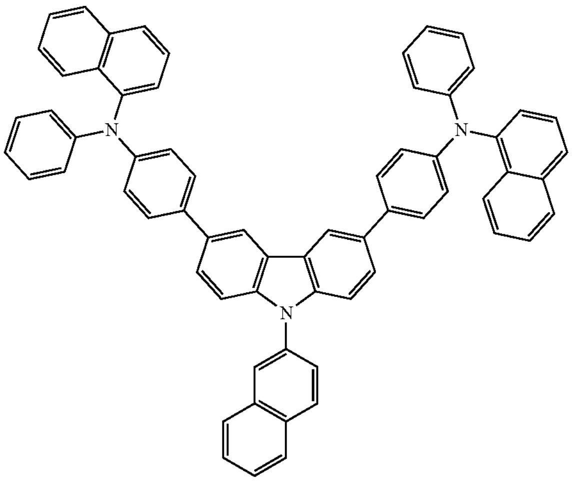
HT 1-9
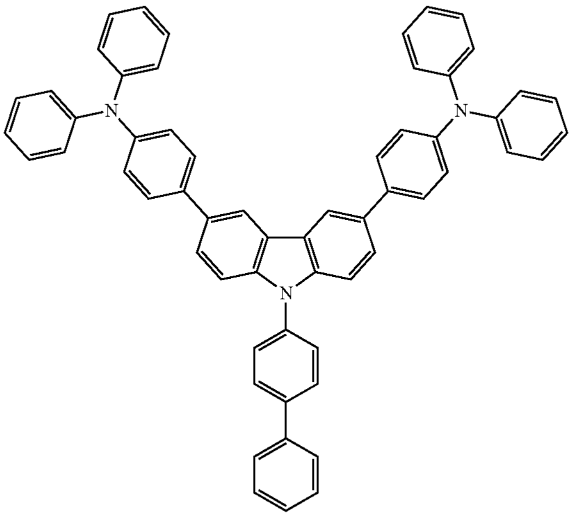
HT 1-10
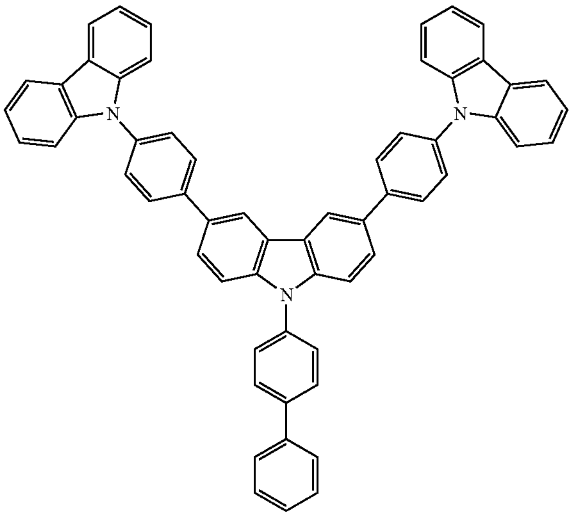
HT 1-11
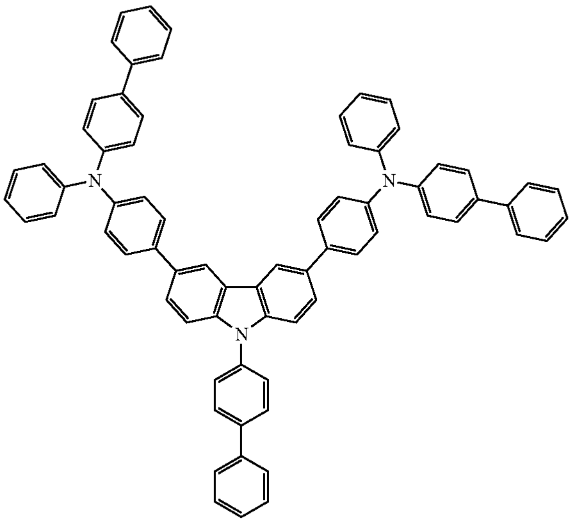

-continued
HT 1-12
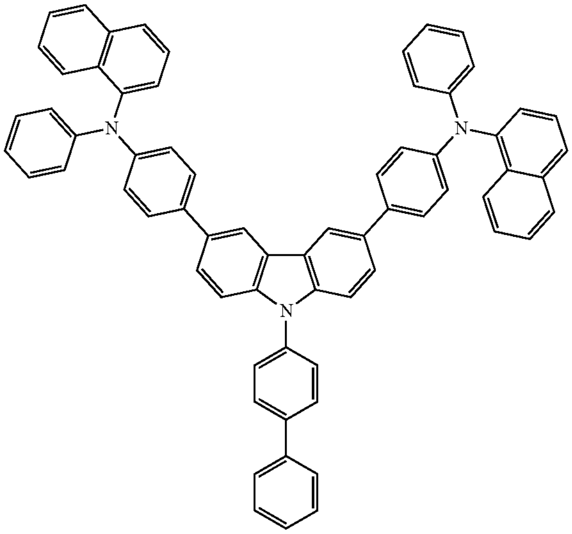
HT 1-13
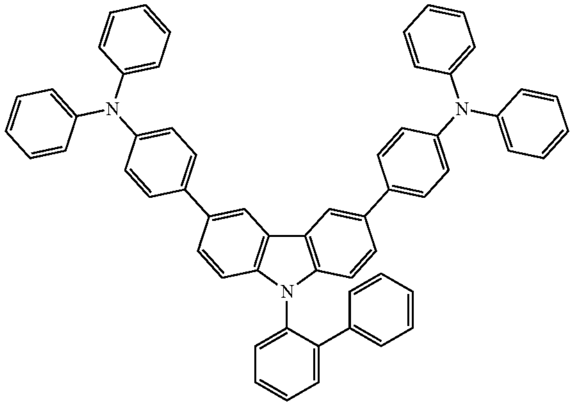
HT 1-14
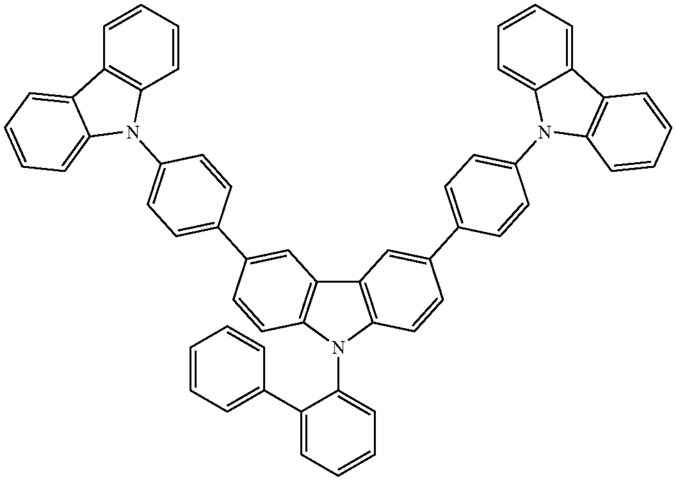
HT 1-15
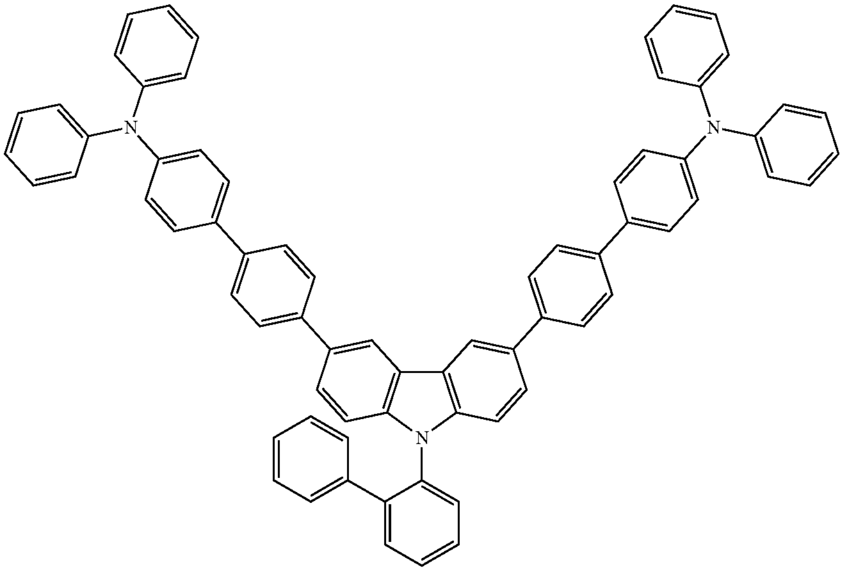

-continued
HT 1-16
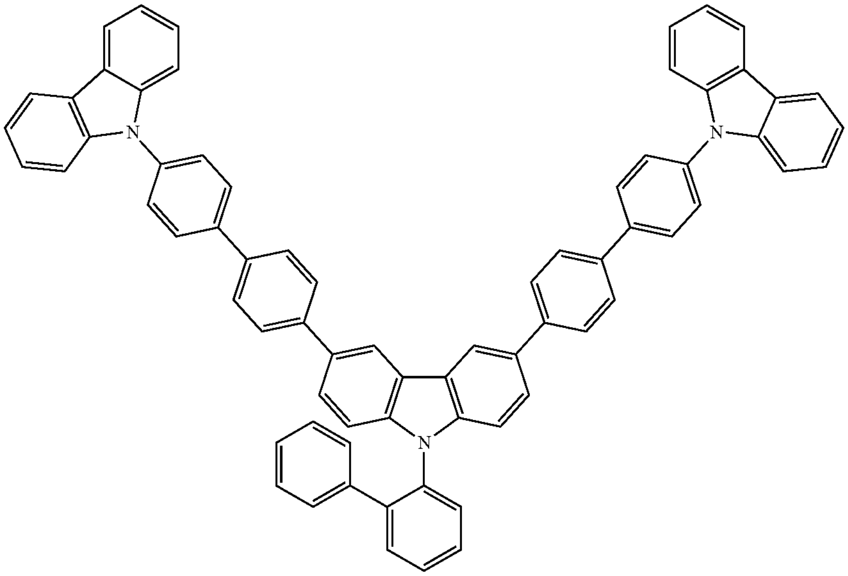
HT 1-17
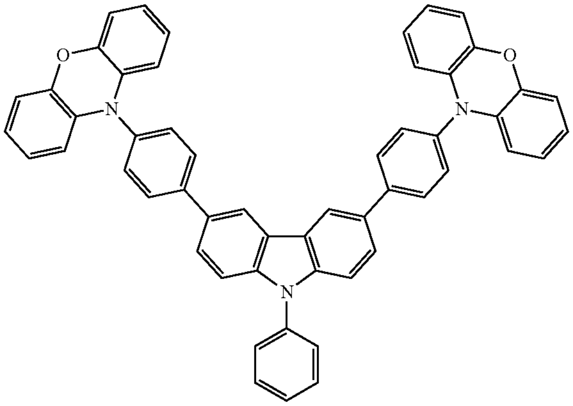
HT 1-18
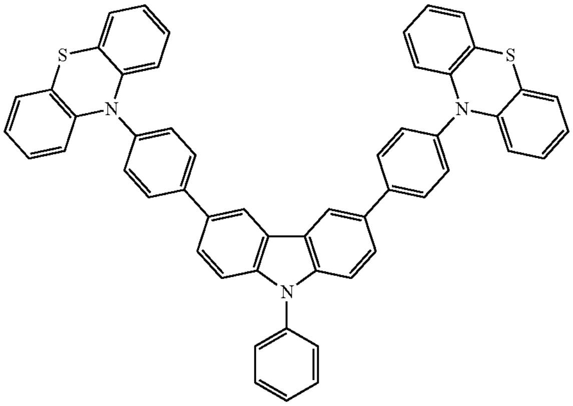
HT 1-19
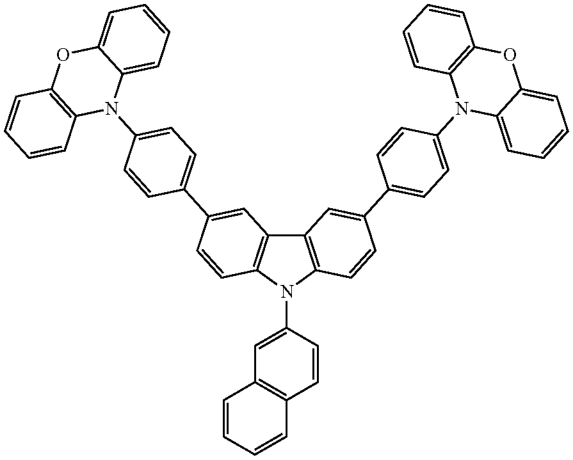
HT 1-20
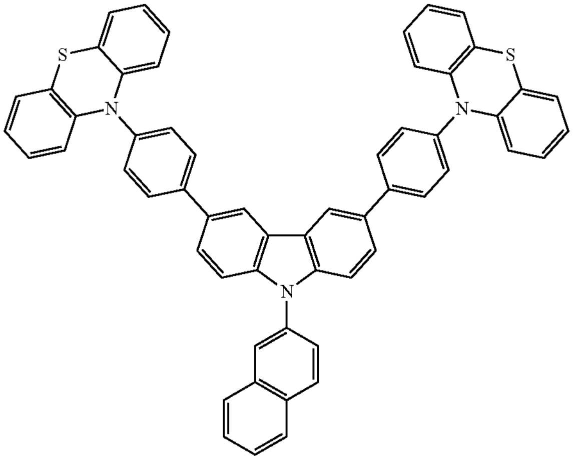

-continued
HT 1-21
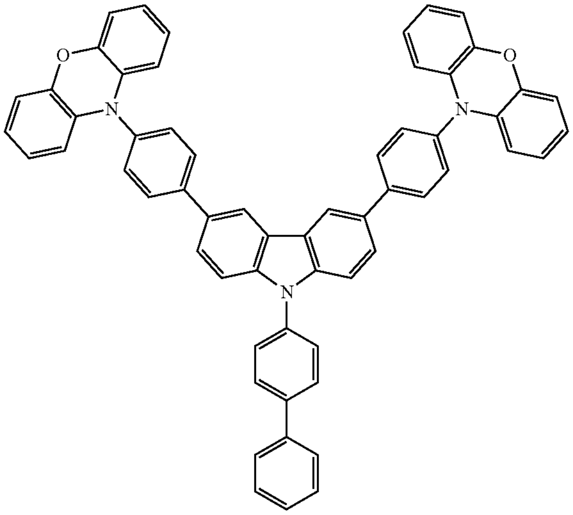
HT 1-22
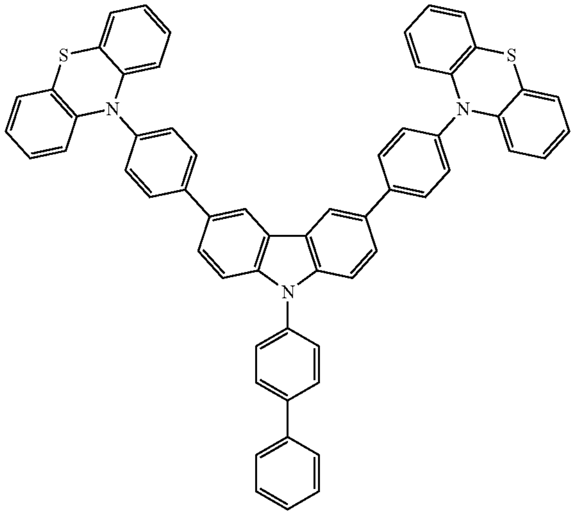
HT 2-1
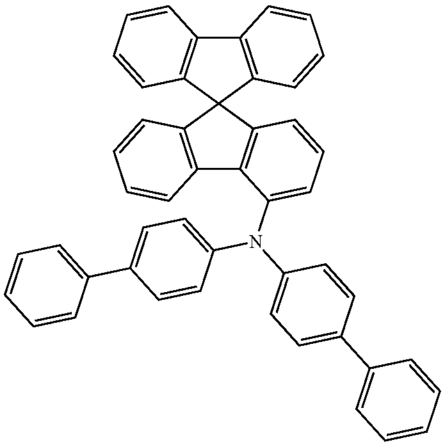
HT 2-2
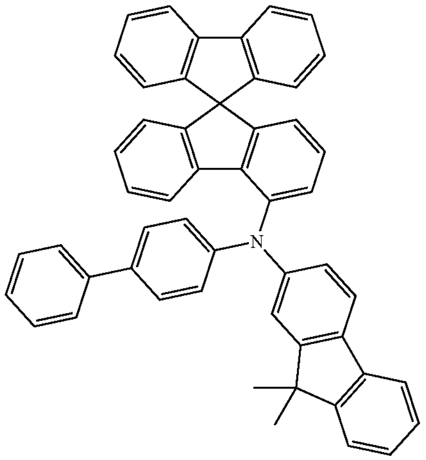
HT 2-3
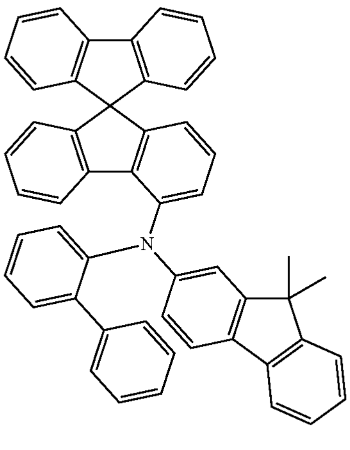
HT 2-4
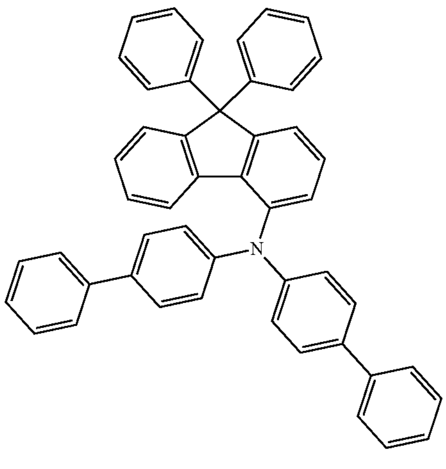

-continued

HT 2-5

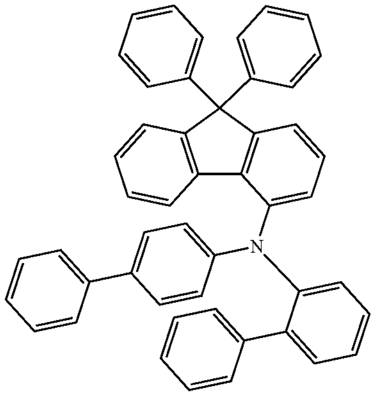

HT 2-6

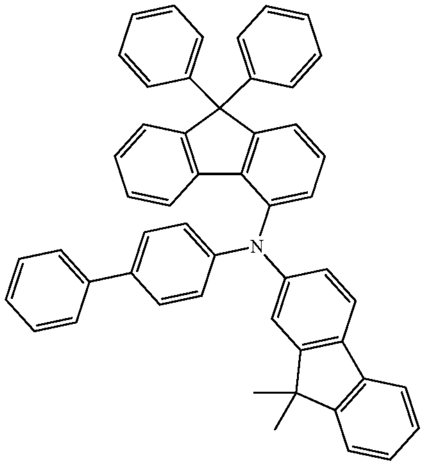

The results are shown in the following Table 2.

TABLE 2

| | Chemical Formula (Hole Transfer Layer) | Chemical Formula (Electron Blocking Layer) | Voltage (V@10 mA/ $cm^2$) | Efficiency (cd/ A@10 $mA/cm^2$) | Color Coordinate (x, y) |
|---|---|---|---|---|---|
| Comparative Example 1-1 | HT 1 | TCTA | 4.38 | 5.25 | (0.138, 0.127) |
| Comparative Example 1-2 | HT 1 | HT 2-2 | 4.35 | 5.26 | (0.138, 0.126) |
| Comparative Example 1-3 | HT 1 | — | 5.8 | 2.8 | (0.139, 0.126) |
| Comparative Example 1-4 | — | HT 2-2 | 5.9 | 3.2 | (0.137, 0.126) |
| Comparative Example 1-5 | HT-1-1 | — | 5.85 | 3.0 | (0.138, 0.125) |
| Comparative Example 1-6 | — | HT 2-4 | 6.2 | 2.98 | (0.137, 0.125) |
| Comparative Example 1-7 | — | HT 2-6 | 6.0 | 3.19 | (0.136, 0.128) |
| Example 1-1 | HT 1-1 | HT 2-2 | 3.85 | 5.45 | (0.139, 0.125) |
| Example 1-2 | HT 1-2 | HT 2-2 | 3.86 | 5.46 | (0.138, 0.125) |
| Example 1-3 | HT 1-3 | HT 2-2 | 3.84 | 5.46 | (0.138, 0.125) |
| Example 1-4 | HT 1-4 | HT 2-2 | 3.84 | 5.45 | (0.137, 0.127) |
| Example 1-5 | HT 1-5 | HT 2-2 | 3.80 | 5.47 | (0.136, 0.127) |
| Example 1-6 | HT 1-6 | HT 2-2 | 3.83 | 5.47 | (0.135, 0.127) |
| Example 1-7 | HT 1-7 | HT 2-2 | 3.82 | 5.46 | (0.136, 0.126) |
| Example 1-8 | HT 1-8 | HT 2-2 | 3.81 | 5.47 | (0.137, 0.126) |
| Example 1-9 | HT 1-9 | HT 2-2 | 3.86 | 5.49 | (0.138, 0.127) |
| Example 1-10 | HT 1-10 | HT 2-2 | 3.87 | 5.48 | (0.136, 0.126) |
| Example 1-11 | HT 1-11 | HT 2-2 | 3.85 | 5.48 | (0.137, 0.126) |
| Example 1-12 | HT 1-12 | HT 2-2 | 3.85 | 5.50 | (0.136, 0.127) |
| Example 1-13 | HT 1-13 | HT 2-2 | 3.83 | 5.47 | (0.138, 0.127) |
| Example 1-14 | HT 1-14 | HT 2-2 | 3.84 | 5.46 | (0.137, 0.126) |
| Example 1-15 | HT 1-15 | HT 2-2 | 3.84 | 5.47 | (0.136, 0.127) |
| Example 1-16 | HT 1-16 | HT 2-2 | 3.90 | 5.44 | (0.136, 0.126) |
| Example 1-17 | HT 1-17 | HT 2-2 | 3.91 | 5.43 | (0.138, 0.126) |
| Example 1-18 | HT 1-18 | HT 2-2 | 3.90 | 5.45 | (0.137, 0.126) |
| Example 1-19 | HT 1-19 | HT 2-2 | 3.89 | 5.44 | (0.137, 0.127) |
| Example 1-20 | HT 1-20 | HT 2-2 | 3.91 | 5.44 | (0.136, 0.126) |
| Example 1-21 | HT 1-21 | HT 2-2 | 3.92 | 5.46 | (0.136, 0.127) |
| Example 1-22 | HT 1-22 | HT 2-2 | 3.90 | 5.45 | (0.138, 0.127) |

When examining Table 2, it was seen that the organic light emitting device according to one embodiment of the present specification promoted low driving voltage and lifespan property enhancement by including the compounds represented by Chemical Formulae 1 and 2 in the first and the second organic material layers, respectively.

Comparative Example 1-8

A glass substrate on which indium tin oxide (ITO) was coated as a thin film to a thickness of 1,000 Å was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol, then dried, and then transferred to a plasma cleaner. In addition, the substrate was cleaned for 5 minutes using oxygen plasma, and then transferred to a vacuum depositor.

On the transparent ITO electrode prepared as above, a hole injection layer was formed by thermal vacuum depositing hexanitrile hexaazatriphenylene (HAT) of the above-mentioned chemical formula to a thickness of 500 Å.

A hole transfer layer was formed on the hole injection layer by vacuum depositing the above-mentioned compound N,N-bis([1,1'-biphenyl]-4-yl)-4'-(9H-carbazol-9-yl)-[1,1'-Biphenyl]-4-amine (HT1) (300 Å), a material transferring holes.

Subsequently, an electron blocking layer was formed on the hole transfer layer by vacuum depositing the above-mentioned compound tris(4-(9H-carbazol-9-yl)phenyl) amine (TCTA) to a film thickness of 100 Å.

Subsequently, a green light emitting layer was formed the hole transfer layer to a thickness of 300 Å by doping $Ir(ppy)_3$ of the following chemical formula as a dopant on CBP of the following chemical formula, a host, in a doping concentration of 10% by weight.

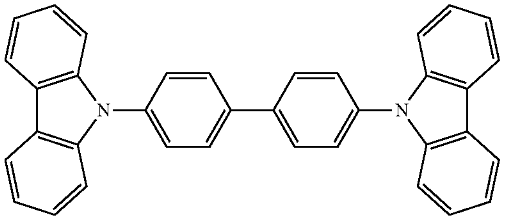

[CBP]

-continued

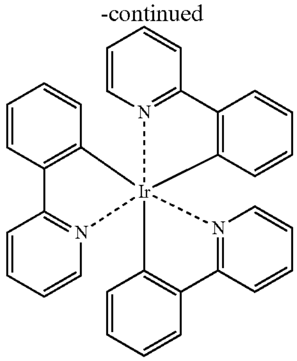

[Ir(ppy)3]

On the light emitting layer, an electron injection and transfer layer was formed to a thickness of 300 Å by vacuum depositing Compound ET1 and the lithium quinolate (LiQ) compound in a weight ratio of 1:1. A cathode was formed on the electron injection and transfer layer by depositing lithium fluoride (LiF) to a thickness of 12 Å and aluminum to a thickness of 2,000 Å in consecutive order.

An organic light emitting device was manufactured by maintaining, in the above-mentioned processes, the deposition rates of the organic materials at 0.4 Å/sec to 0.7 Å/sec, the deposition rates of the lithium fluoride and the aluminum of the cathode at 0.3 Å/sec and 2 Å/sec, respectively, and the degree of vacuum during the deposition at $2\times10^{-7}$ torr to $5\times10^{4}$ torr.

As for Comparative Examples 1-9 to 1-14, organic light emitting devices were manufactured in the same manner as in Comparative Example 1-8 with constituents as in the following Table 3.

Example 1-23

An organic light emitting device was manufactured in the same manner as in Comparative Example 1-9 except that the compound of Chemical Formula HT-1-1 was used instead of Compound HT1.

Example 1-24

An organic light emitting device was manufactured in the same manner as in Comparative Example 1-9 except that the compound of Chemical Formula HT-1-2 was used instead of Compound HT1.

Example 1-25

An organic light emitting device was manufactured in the same manner as in Comparative Example 1-9 except that the compound of Chemical Formula HT-1-3 was used instead of Compound HT1.

Example 1-26

An organic light emitting device was manufactured in the same manner as in Comparative Example 1-9 except that the compound of Chemical Formula HT-1-4 was used instead of Compound HT1.

Example 1-27

An organic light emitting device was manufactured in the same manner as in Comparative Example 1-9 except that the compound of Chemical Formula HT-1-5 was used instead of Compound HT1.

Example 1-28

An organic light emitting device was manufactured in the same manner as in Comparative Example 1-9 except that the compound of Chemical Formula HT-1-6 was used instead of Compound HT1.

Example 1-29

An organic light emitting device was manufactured in the same manner as in Comparative Example 1-9 except that the compound of Chemical Formula HT-1-7 was used instead of Compound HT1.

Example 1-30

An organic light emitting device was manufactured in the same manner as in Comparative Example 1-9 except that the compound of Chemical Formula HT-1-8 was used instead of Compound HT1.

Example 1-31

An organic light emitting device was manufactured in the same manner as in Comparative Example 1-9 except that the compound of Chemical Formula HT-1-9 was used instead of Compound HT1.

Example 1-32

An organic light emitting device was manufactured in the same manner as in Comparative Example 1-9 except that the compound of Chemical Formula HT-1-10 was used instead of Compound HT1.

Example 1-33

An organic light emitting device was manufactured in the same manner as in Comparative Example 1-9 except that the compound of Chemical Formula HT-1-11 was used instead of Compound HT1.

Example 1-34

An organic light emitting device was manufactured in the same manner as in Comparative Example 1-9 except that the compound of Chemical Formula HT-1-12 was used instead of Compound HT1.

Example 1-35

An organic light emitting device was manufactured in the same manner as in Comparative Example 1-9 except that the compound of Chemical Formula HT-1-13 was used instead of Compound HT1.

Example 1-36

An organic light emitting device was manufactured in the same manner as in Comparative Example 1-9 except that the compound of Chemical Formula HT-1-14 was used instead of Compound HT1.

Example 1-37

An organic light emitting device was manufactured in the same manner as in Comparative Example 1-9 except that the compound of Chemical Formula HT-1-15 was used instead of Compound HT1.

Example 1-38

An organic light emitting device was manufactured in the same manner as in Comparative Example 1-9 except that the compound of Chemical Formula HT-1-16 was used instead of Compound HT1.

Example 1-39

An organic light emitting device was manufactured in the same manner as in Comparative Example 1-9 except that the compound of Chemical Formula HT-1-17 was used instead of Compound HT1.

Example 1-40

An organic light emitting device was manufactured in the same manner as in Comparative Example 1-9 except that the compound of Chemical Formula HT-1-18 was used instead of Compound HT1.

Example 1-41

An organic light emitting device was manufactured in the same manner as in Comparative Example 1-9 except that the compound of Chemical Formula HT-1-19 was used instead of Compound HT1.

Example 1-42

An organic light emitting device was manufactured in the same manner as in Comparative Example 1-9 except that the compound of Chemical Formula HT-1-20 was used instead of Compound HT1.

Example 1-43

An organic light emitting device was manufactured in the same manner as in Comparative Example 1-9 except that the compound of Chemical Formula HT-1-21 was used instead of Compound HT1.

Example 1-44

An organic light emitting device was manufactured in the same manner as in Comparative Example 1-9 except that the compound of Chemical Formula HT-1-22 was used instead of Compound HT1.

The results are shown in the following Table 3.

TABLE 3

| | Chemical Formula (Hole Transfer Layer) | Chemical Formula (Electron Blocking Layer) | Voltage (V@10 mA/cm$^2$) | Efficiency (cd/A@10 mA/cm$^2$) | Color Coordinate (x, y) |
|---|---|---|---|---|---|
| Comparative Example 1-8 | HT 1 | TCTA | 4.25 | 5.10 | (0.320, 0.611) |
| Comparative Example 1-9 | HT 1 | HT 2-2 | 4.35 | 5.12 | (0.321, 0.611) |
| Comparative Example 1-10 | | HT 2-2 | 5.80 | 3.24 | (0.318, 0.613) |
| Comparative Example 1-11 | HT 1 | — | 6.0 | 3.00 | (0.317, 0.612) |
| Comparative Example 1-12 | HT 1-1 | — | 5.93 | 3.05 | (0.319, 0.610) |
| Comparative Example 1-13 | — | HT 2-4 | 6.02 | 3.01 | (0.320, 0.615) |
| Comparative Example 1-14 | — | HT 2-6 | 6.0 | 3.10 | (0.321, 0.616) |
| Example 1-23 | HT 1-1 | HT 2-2 | 3.78 | 5.30 | (0.320, 0.612) |
| Example 1-24 | HT 1-2 | HT 2-2 | 3.77 | 5.31 | (0.320, 0.611) |
| Example 1-25 | HT 1-3 | HT 2-2 | 3.75 | 5.28 | (0.322, 0.610) |
| Example 1-26 | HT 1-4 | HT 2-2 | 3.74 | 5.29 | (0.319, 0.611) |
| Example 1-27 | HT 1-5 | HT 2-2 | 3.65 | 5.35 | (0.321, 0.610) |
| Example 1-28 | HT 1-6 | HT 2-2 | 3.68 | 5.47 | (0.320, 0.611) |
| Example 1-29 | HT 1-7 | HT 2-2 | 3.69 | 5.46 | (0.318, 0.613) |
| Example 1-30 | HT 1-8 | HT 2-2 | 3.70 | 5.47 | (0.320, 0.611) |
| Example 1-31 | HT 1-9 | HT 2-2 | 3.80 | 5.35 | (0.319, 0.612) |
| Example 1-32 | HT 1-10 | HT 2-2 | 3.82 | 5.37 | (0.320, 0.611) |
| Example 1-33 | HT 1-11 | HT 2-2 | 3.81 | 5.36 | (0.320, 0.613) |
| Example 1-34 | HT 1-12 | HT 2-2 | 3.83 | 5.39 | (0.321, 0.610) |
| Example 1-35 | HT 1-13 | HT 2-2 | 3.75 | 5.30 | (0.319, 0.613) |
| Example 1-36 | HT 1-14 | HT 2-2 | 3.76 | 5.31 | (0.321, 0.611) |
| Example 1-37 | HT 1-15 | HT 2-2 | 3.78 | 5.29 | (0.320, 0.612) |
| Example 1-38 | HT 1-16 | HT 2-2 | 3.76 | 5.30 | (0.318, 0.613) |
| Example 1-39 | HT 1-17 | HT 2-2 | 3.85 | 5.30 | (0.322, 0.610) |
| Example 1-40 | HT 1-18 | HT 2-2 | 3.84 | 5.28 | (0.321, 0.611) |
| Example 1-41 | HT 1-19 | HT 2-2 | 3.86 | 5.29 | (0.320, 0.610) |
| Example 1-42 | HT 1-20 | HT 2-2 | 3.84 | 5.30 | (0.319, 0.611) |
| Example 1-43 | HT 1-21 | HT 2-2 | 3.87 | 5.31 | (0.318, 0.612) |
| Example 1-44 | HT 1-22 | HT 2-2 | 3.87 | 5.30 | (0.319, 0.610) |

When examining Table 3, it was seen that the organic light emitting device according to one embodiment of the present specification promoted low driving voltage and lifespan property enhancement by including the compounds represented by Chemical Formulae 1 and 2 in the first and the second organic material layers, respectively.

The invention claimed is:

1. An organic light emitting device comprising:

a cathode;

an anode;

a light emitting layer provided between the cathode and the anode, and comprising an aromatic amine derivative as a dopant;

a first organic material layer provided between the anode and the light emitting layer and including a compound of Chemical Formula 1; and a second organic material layer provided between the first organic material layer and the light emitting layer and including a compound of Chemical Formula 13:

[Chemical Formula 1]

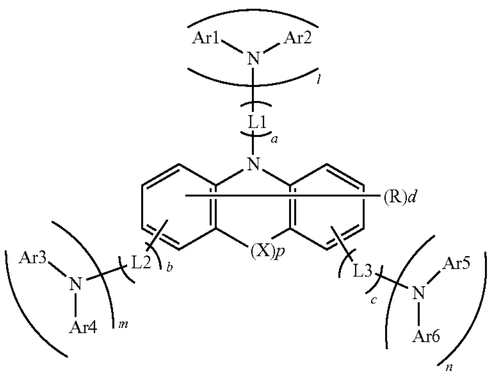

wherein, in Chemical Formula 1,

L1 is a phenyl group, a biphenylyl group, a naphthyl group, or a fluorenylenyl group unsubstituted or substituted with an alkyl group, L2 and L3 are the same as or different from each other, and each independently a substituted or unsubstituted arylene group, a is an integer of 1 to 3, b and c are each an integer of 0 to 3, at least one of b or c is not an integer of 0, and when a to c are each 2 or greater, L1 to L3 in each occurrence are the same as or different from each other;

Ar1 to Ar6 are the same as or different from each other, and each independently a substituted or unsubstituted aryl group; or a substituted or unsubstituted heteroaryl group, or Ar1 and Ar2; Ar3 and Ar4; Ar5 and Ar6; Ar3 and L2; or Ar5 and L3 bond to each other and together with the N atom to which they are attached, respectively, to form a monocyclic or multicyclic aromatic or aliphatic hydrocarbon ring or heteroring, 1 is 0, m and n are each independently an integer of 0 to 2, m+n is 1 or greater, and when m or n is 2, each occurrence of —NAr3Ar4 or —NAr5Ar6, respectively, is the same as or different from each other, hydrogen bonds to L1 instead of —NAr1Ar2, when m or n is 0, hydrogen bonds to L2 or L3 instead of —NAr3 Ar4 or —NAr5Ar6, respectively;

X is NR'; O; or S, p is 0 or 1, and when p is 0, the 2 carbons attached to X directly bond to each other;

R is deuterium;

d is an integer of 0 to 3,

R' is hydrogen or deuterium;

at least one of —NAr3Ar4 or —NAr5Ar6 is represented by the following structural formula:

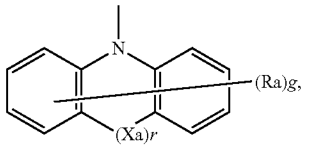

which is attached to L2 or L3, respectively, on the para-position, when b or c, respectively, is not 0, and L2 or L3 is each a phenylene, wherein, Xa is NRc, O, or S; and r is 0 such that the two carbons attached to Xa directly bond to each other, Ra is deuterium, g is an integer of 0 to 8, and Rc is hydrogen or deuterium,

[Chemical Formula 13]

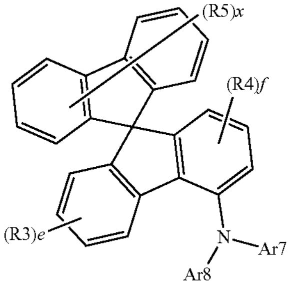

in Chemical Formula 13,

Ar7 and Ar8 are the same as or different from each other, and each independently a substituted or unsubstituted aryl group;

R3 to R5 are deuterium; and e is an integer of 0-4, f is an integer of 0-3, and x is an integer of 0 to 8, wherein the first organic material layer is a hole transfer layer, and does not function as a light emitting layer.

2. The organic light emitting device of claim 1, wherein, in Chemical Formula 1, p is 0.

3. The organic light emitting device of claim 1, wherein, in Chemical Formula 1, a is an integer of 1 to 3.

4. The organic light emitting device of claim 1, wherein Chemical Formula 1 is represented by Chemical Formula 4:

[Chemical Formula 4]

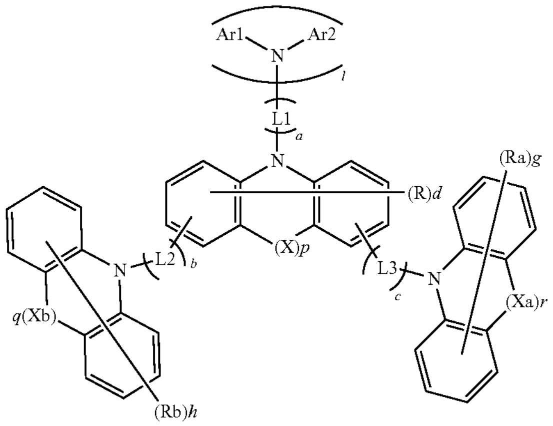

wherein, in Chemical Formula 4, Ar1, Ar2, L1 to L3, R, X, a, b, c, d, 1 and p have the same definitions as in Chemical Formula 1;

Xa and Xb are the same as or different from each other, and each independently NRc, O, or S; and r and q are each 0 so that the two carbons attached to each of Xa and Xb directly bond to each other;

Ra and Rb are deuterium, g and h are each an integer of 0 to 8 and

Rc is hydrogen or deuterium.

5. The organic light emitting device of claim 1, wherein Chemical Formula 1 is selected from among the following compounds:

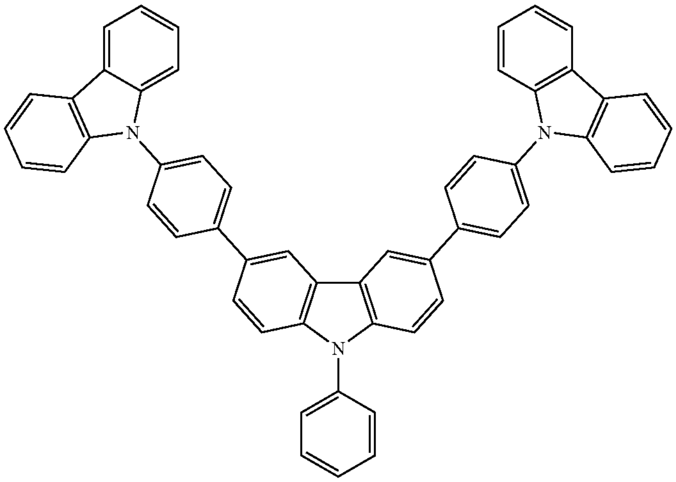
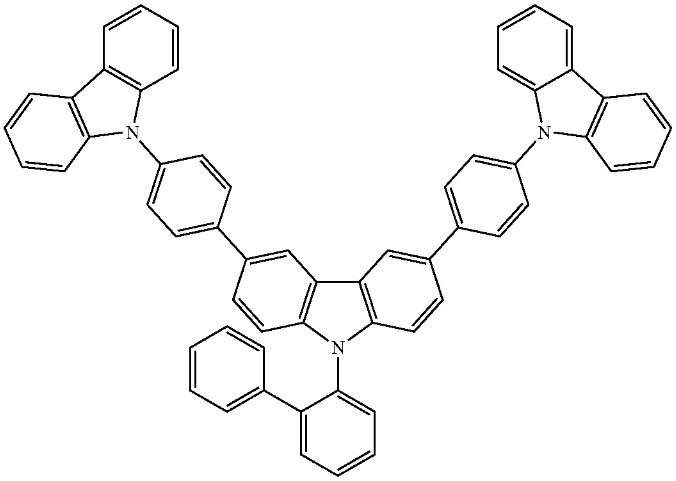
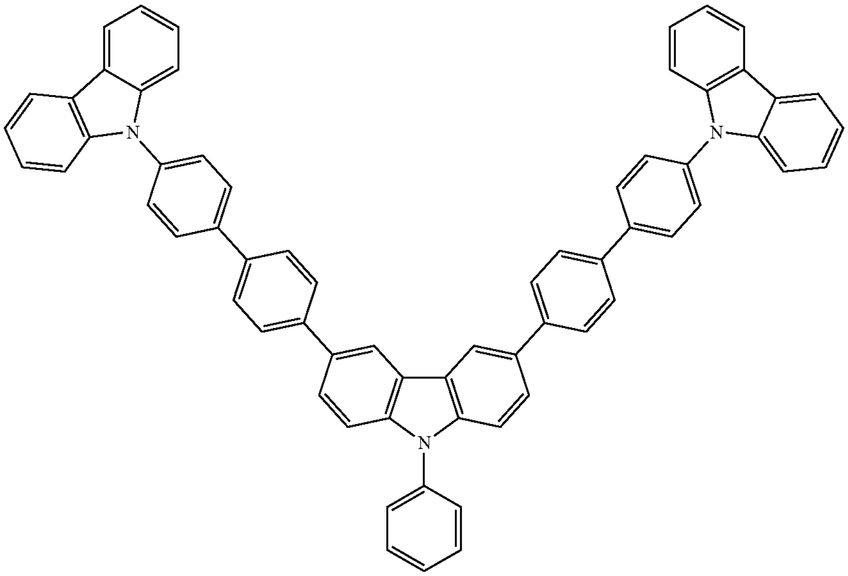

-continued
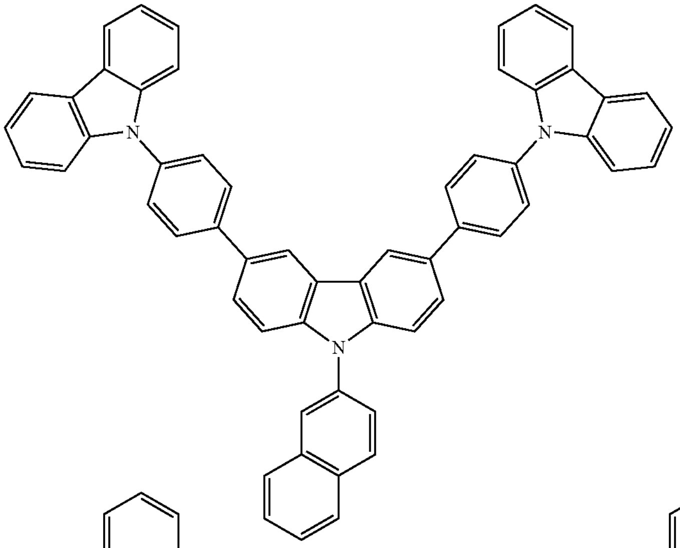
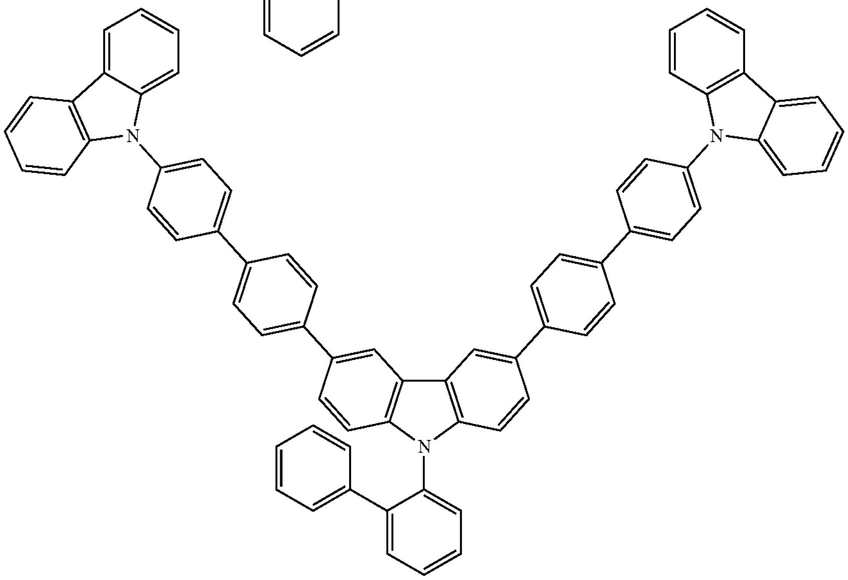
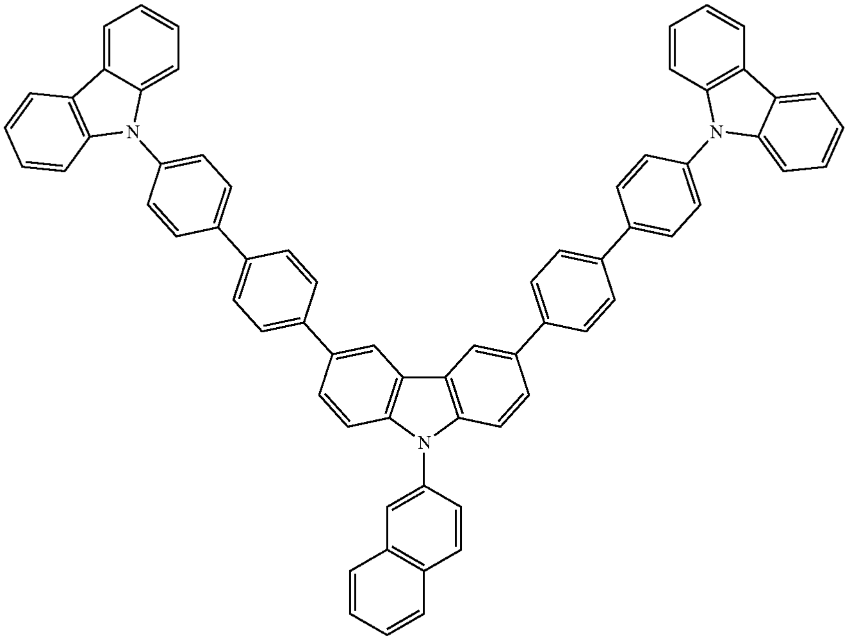

-continued
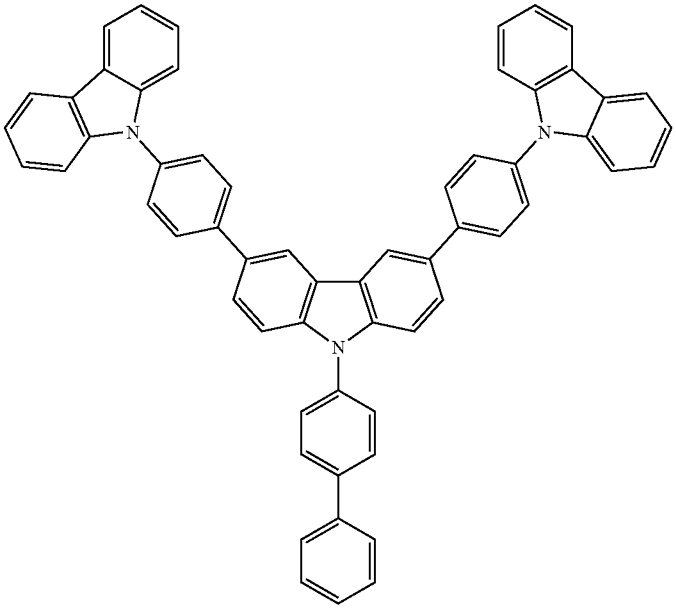
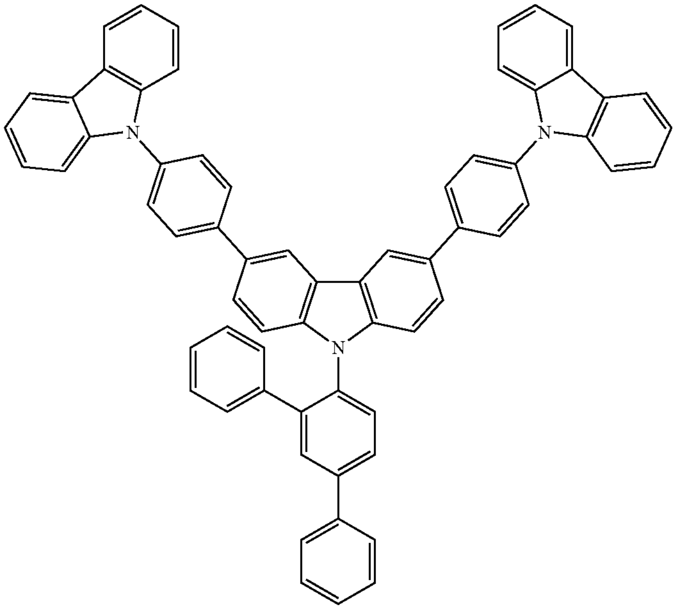

-continued
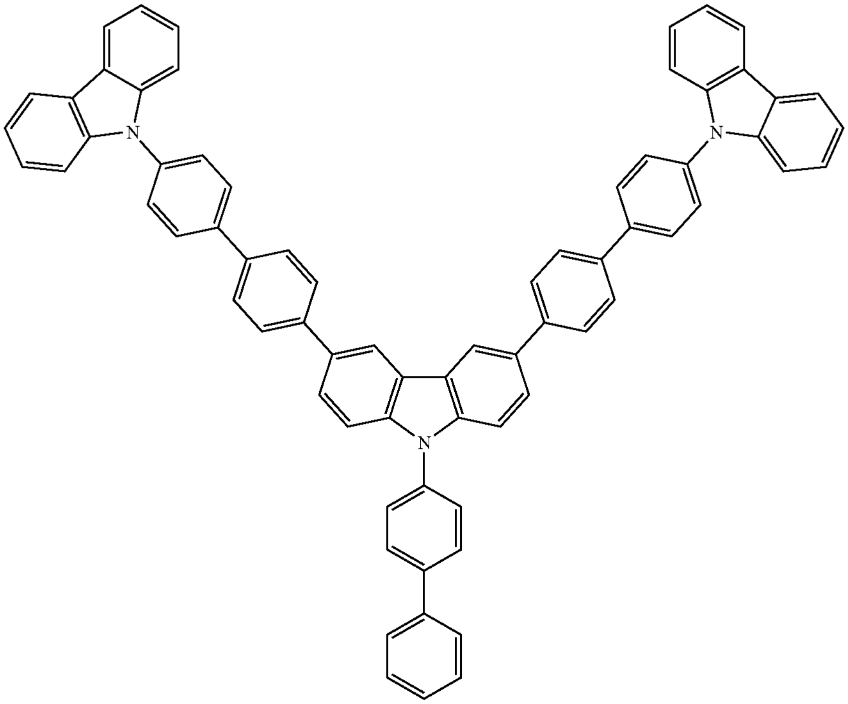
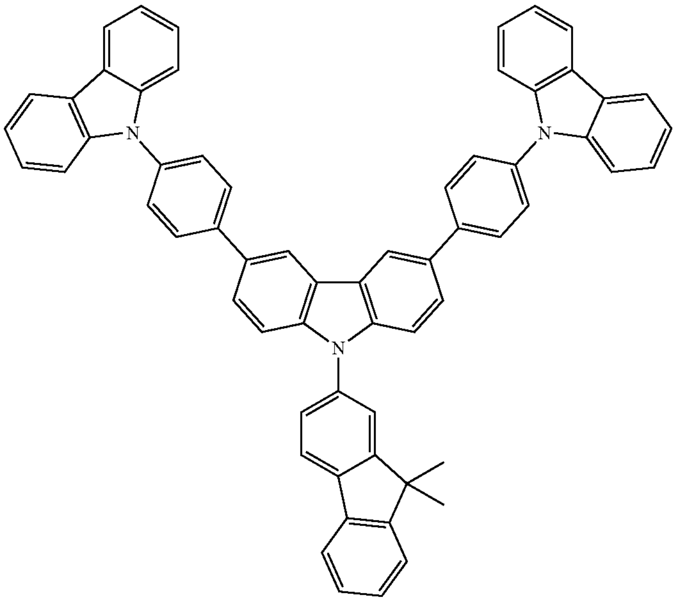

-continued
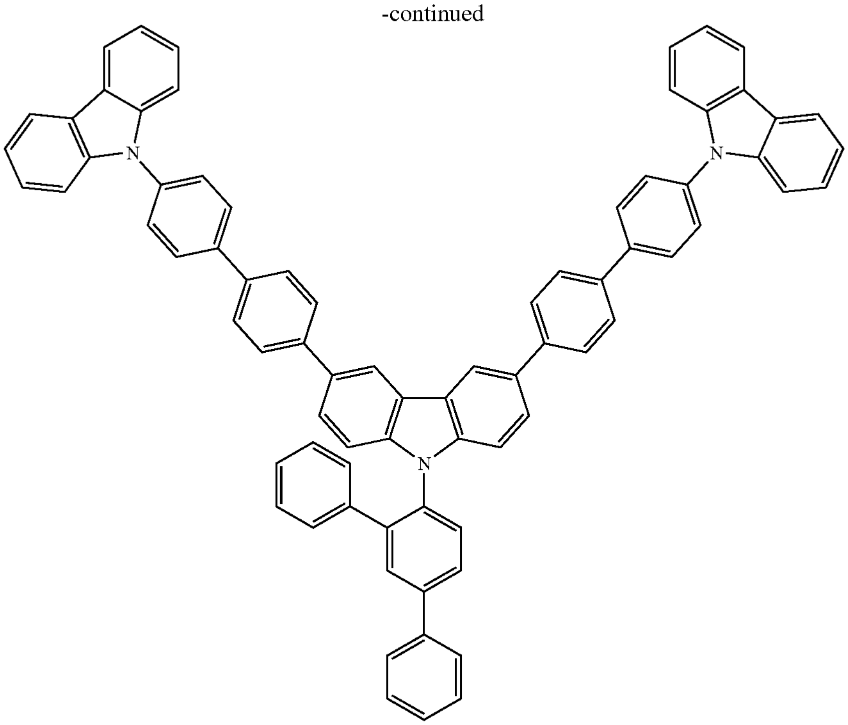
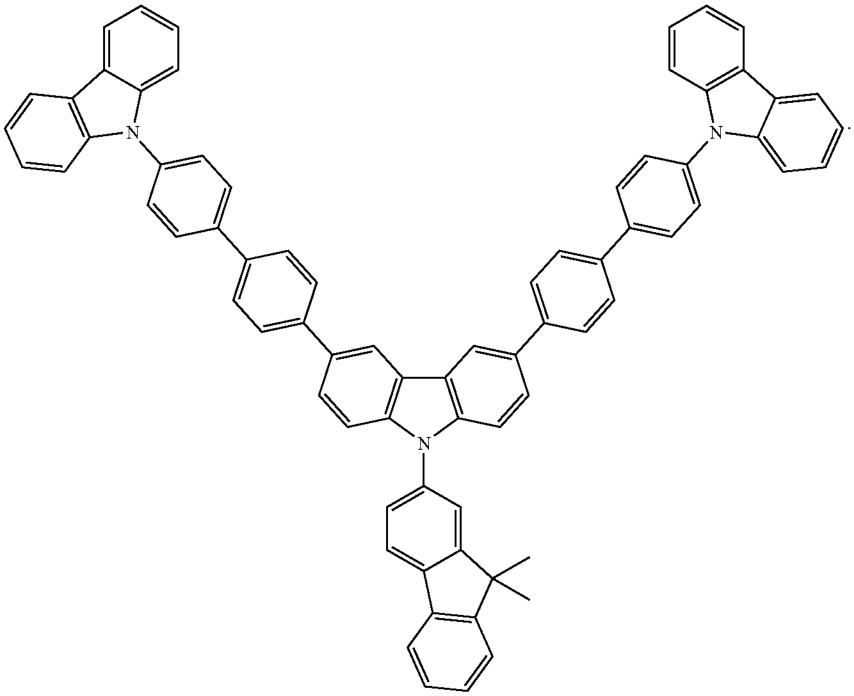
.

6. The organic light emitting device of claim 1, wherein Chemical Formula 13 is selected from among the following compounds:
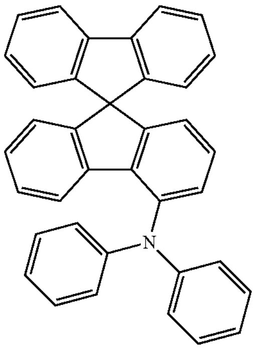
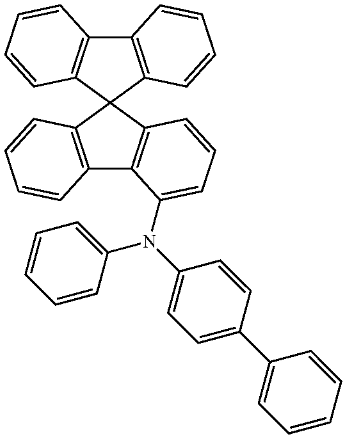
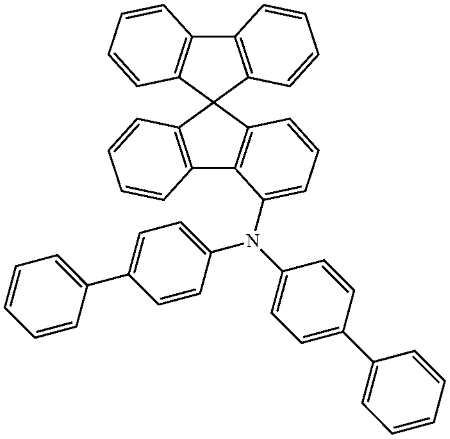
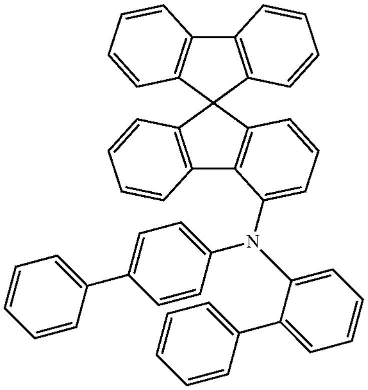
-continued
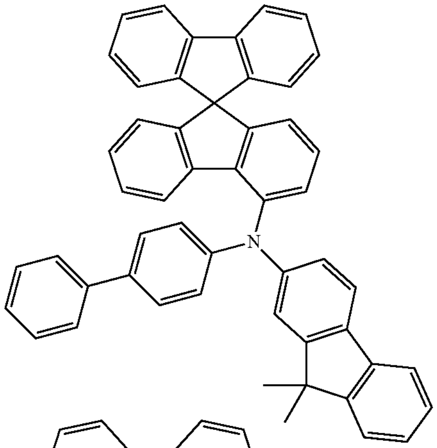
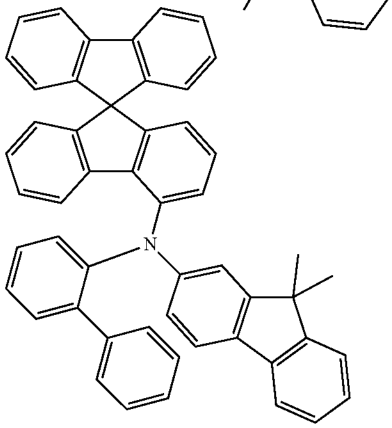
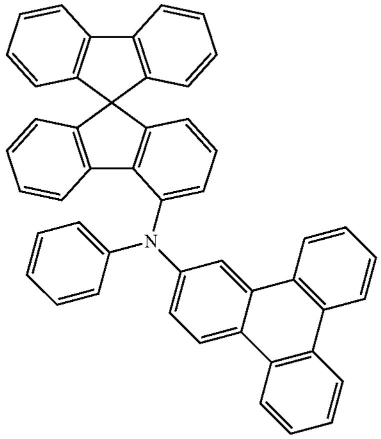
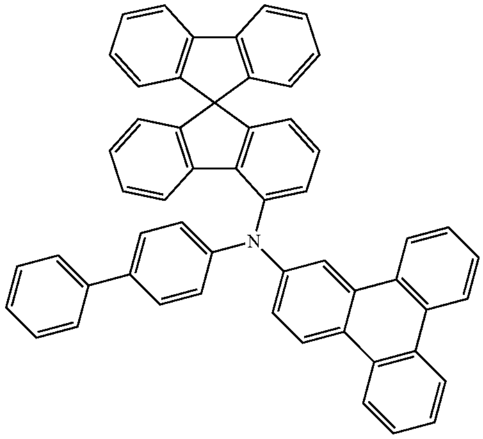

-continued

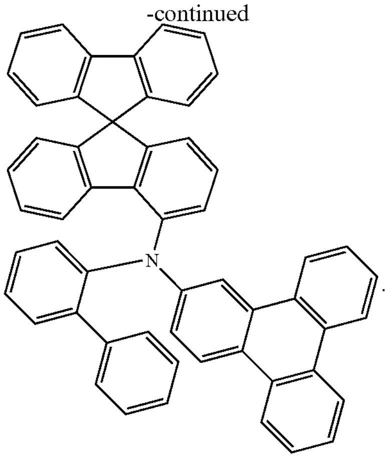

.

7. The organic light emitting device of claim 1, wherein the second organic material layer is an electron blocking layer.

8. The organic light emitting device of claim 4, wherein in Chemical Formula 4, p is 0.

9. The organic light emitting device of claim 1, wherein in Chemical Formula 1, when m is 0, L2 is not an unsubstituted or substituted phenylene; and when n is 0, L3 is not an unsubstituted or substituted phenylene.

10. The organic light emitting device of claim 9, wherein Chemical Formula 1 is selected from among the following compounds:

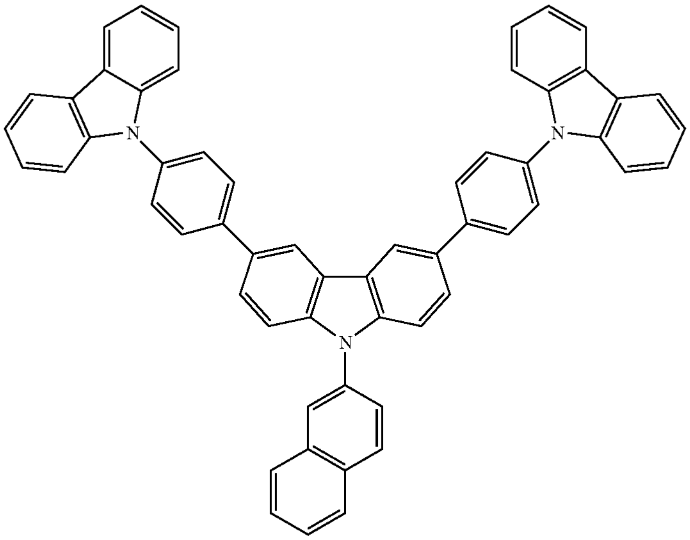

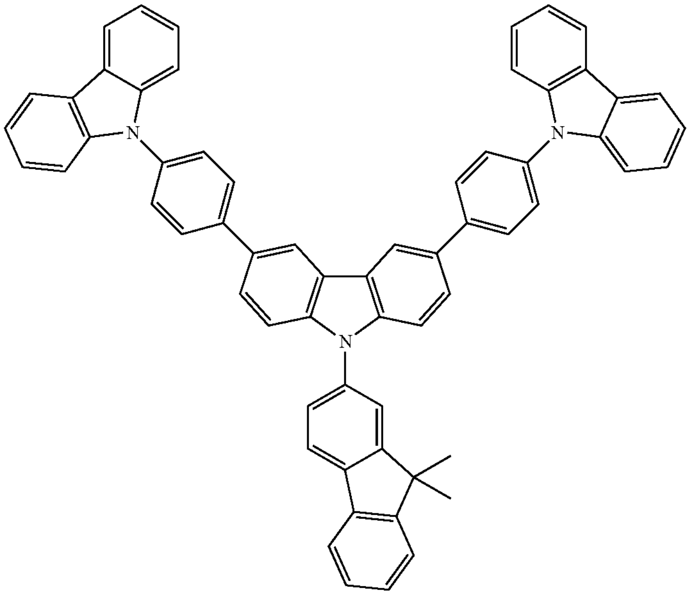

-continued
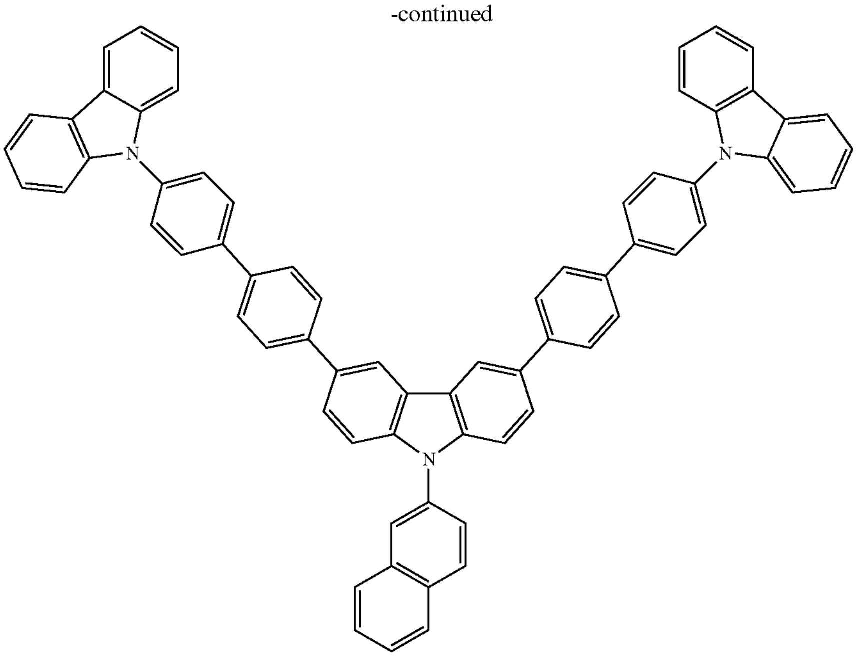
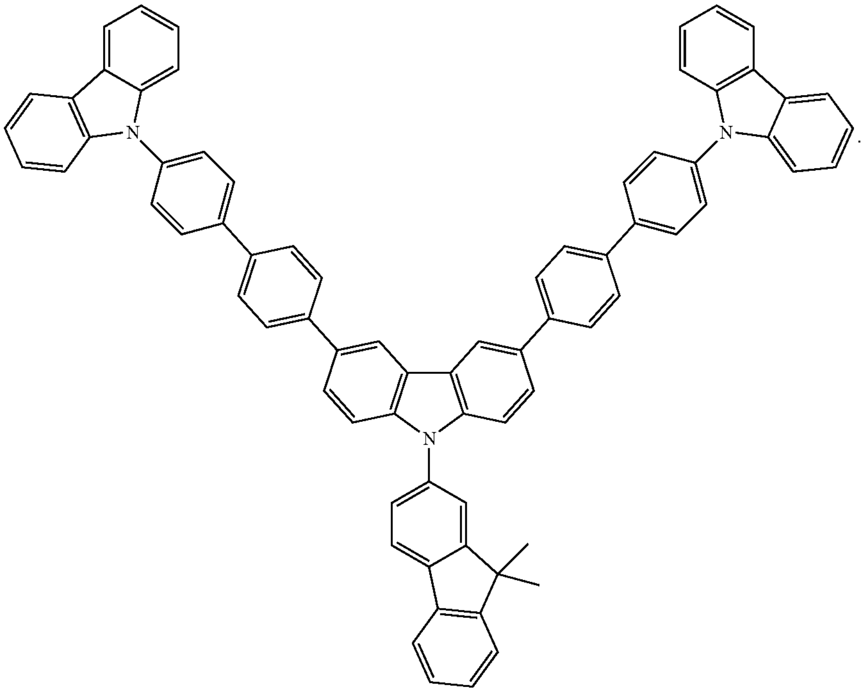
.
* * * * *